United States Patent
Liao et al.

(10) Patent No.: US 11,424,347 B2
(45) Date of Patent: Aug. 23, 2022

(54) SEMICONDUCTOR DEVICE AND METHOD

(71) Applicant: Taiwan Semiconductor Manufacturing Co., Ltd., Hsinchu (TW)

(72) Inventors: Ssu-Yu Liao, Hsinchu (TW); Tsu-Hui Su, Taipei (TW); Chun-Hsiang Fan, Hsinchu (TW); Yu-Wen Wang, New Taipei (TW); Ming-Hsi Yeh, Hsinchu (TW); Kuo-Bin Huang, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/899,119

(22) Filed: Jun. 11, 2020

(65) Prior Publication Data

US 2021/0391449 A1 Dec. 16, 2021

(51) Int. Cl.
*H01L 29/66* (2006.01)
*H01L 29/165* (2006.01)
(Continued)

(52) U.S. Cl.
CPC .. *H01L 29/66818* (2013.01); *H01L 21/02532* (2013.01); *H01L 21/02603* (2013.01); *H01L 21/823807* (2013.01); *H01L 21/823814* (2013.01); *H01L 21/823821* (2013.01); *H01L 21/823828* (2013.01); *H01L 21/823871* (2013.01); *H01L 27/092* (2013.01); *H01L 27/0924* (2013.01); *H01L 29/0673* (2013.01); *H01L 29/0847* (2013.01); *H01L 29/1037* (2013.01); *H01L 29/161* (2013.01); *H01L 29/42392* (2013.01); *H01L 29/66545* (2013.01); *H01L 29/66742* (2013.01);
(Continued)

(58) Field of Classification Search
CPC ......... H01L 21/76224; H01L 29/66818; H01L 29/7851; H01L 29/1037; H01L 29/7853
See application file for complete search history.

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

| KR | 20200002690 A | 1/2020 |
|---|---|---|
| KR | 20200050345 A | 5/2020 |
| WO | 2019005111 A1 | 1/2019 |

*Primary Examiner* — Brian Turner
(74) *Attorney, Agent, or Firm* — Slater Matsil, LLP

(57) ABSTRACT

Methods for improving profiles of channel regions in semiconductor devices and semiconductor devices formed by the same are disclosed. In an embodiment, a method includes forming a semiconductor fin over a semiconductor substrate, the semiconductor fin including germanium, a germanium concentration of a first portion of the semiconductor fin being greater than a germanium concentration of a second portion of the semiconductor fin, a first distance between the first portion and a major surface of the semiconductor substrate being less than a second distance between the second portion and the major surface of the semiconductor substrate; and trimming the semiconductor fin, the first portion of the semiconductor fin being trimmed at a greater rate than the second portion of the semiconductor fin.

20 Claims, 51 Drawing Sheets

(51) Int. Cl.
  *H01L 29/78* (2006.01)
  *H01L 29/161* (2006.01)
  *H01L 21/02* (2006.01)
  *H01L 21/8238* (2006.01)
  *H01L 27/092* (2006.01)
  *H01L 29/06* (2006.01)
  *H01L 29/08* (2006.01)
  *H01L 29/10* (2006.01)
  *H01L 29/423* (2006.01)
  *H01L 29/786* (2006.01)

(52) U.S. Cl.
  CPC .... *H01L 29/7848* (2013.01); *H01L 29/78618* (2013.01); *H01L 29/78684* (2013.01); *H01L 29/78696* (2013.01)

(56) References Cited

U.S. PATENT DOCUMENTS

| | | | |
|---|---|---|---|
| 9,209,247 B2 | 12/2015 | Colinge et al. | |
| 9,214,555 B2 | 12/2015 | Oxland et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 10,475,791 B1* | 11/2019 | Zang | H01L 27/0886 |
| 2008/0102570 A1* | 5/2008 | Fischer | H01L 29/66818 438/157 |
| 2013/0309838 A1* | 11/2013 | Wei | H01L 29/6681 257/E21.546 |
| 2016/0118500 A1* | 4/2016 | Wu | H01L 29/1033 257/401 |
| 2017/0053912 A1* | 2/2017 | Ching | H01L 21/764 |
| 2018/0053824 A1 | 2/2018 | Wang et al. | |
| 2018/0247938 A1 | 8/2018 | Cheng et al. | |
| 2019/0165175 A1* | 5/2019 | More | H01L 29/66545 |
| 2020/0006533 A1 | 1/2020 | Tsai et al. | |
| 2020/0058773 A1 | 2/2020 | Shen et al. | |
| 2020/0135584 A1 | 4/2020 | Wang et al. | |
| 2020/0135913 A1 | 4/2020 | More et al. | |
| 2020/0176591 A1 | 6/2020 | Wong et al. | |
| 2020/0411691 A1* | 12/2020 | Jambunathan | H01L 29/785 |

\* cited by examiner

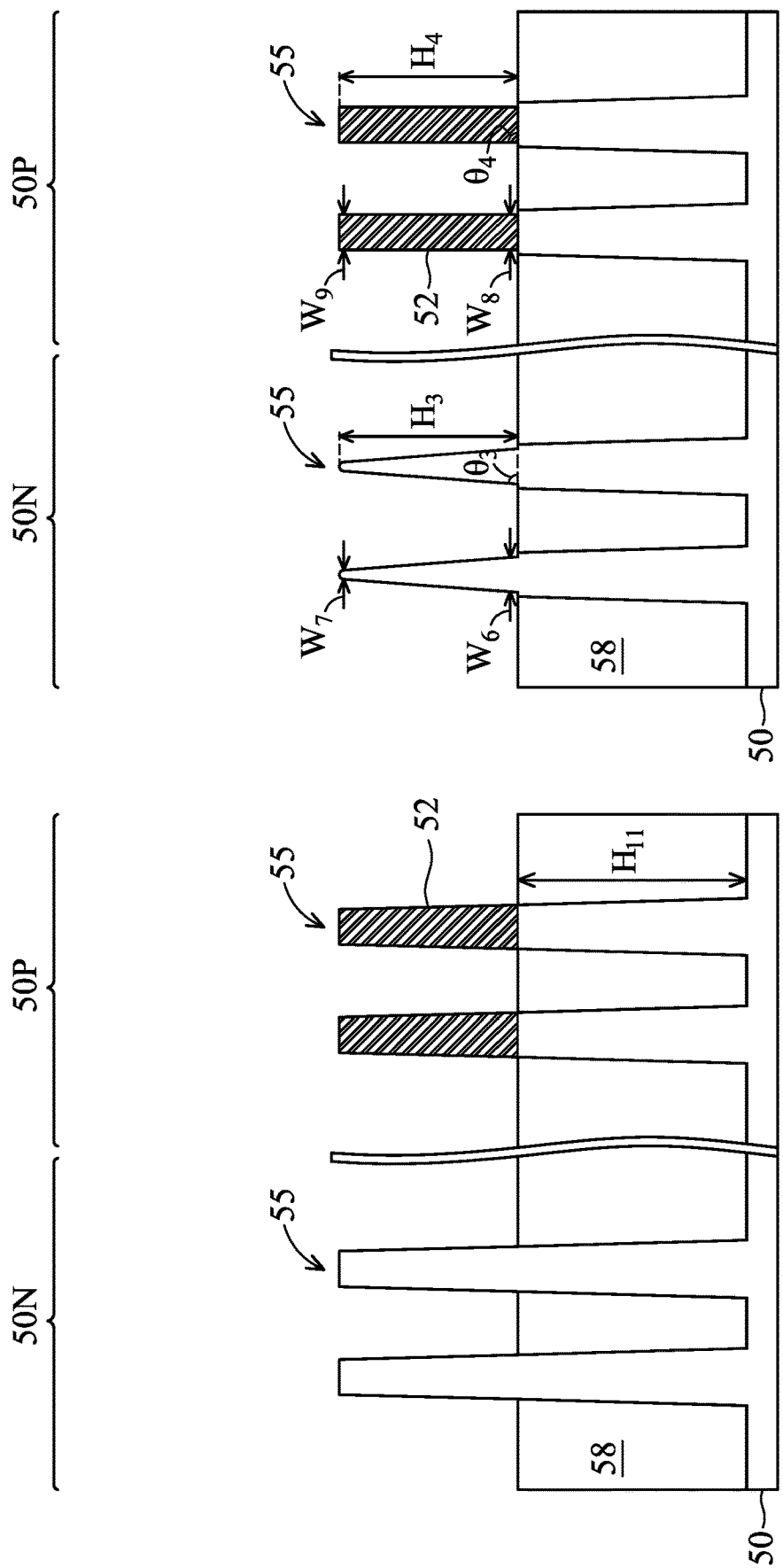

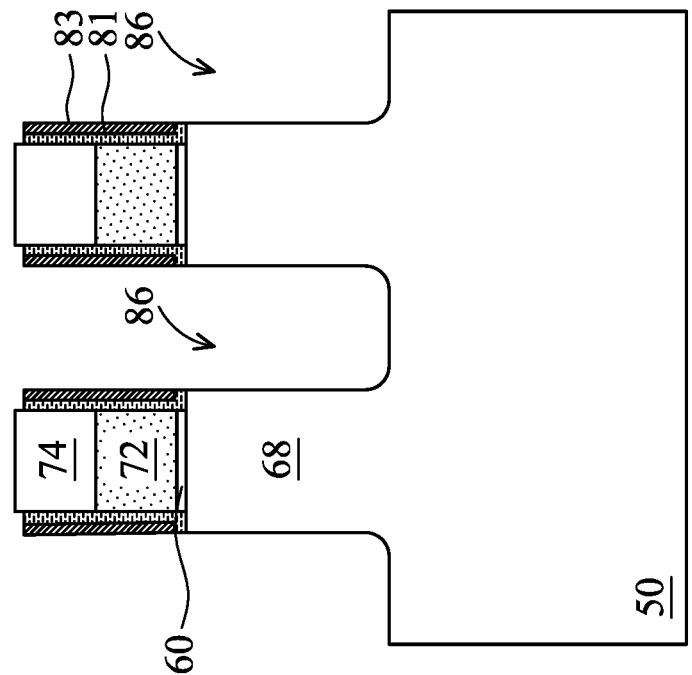
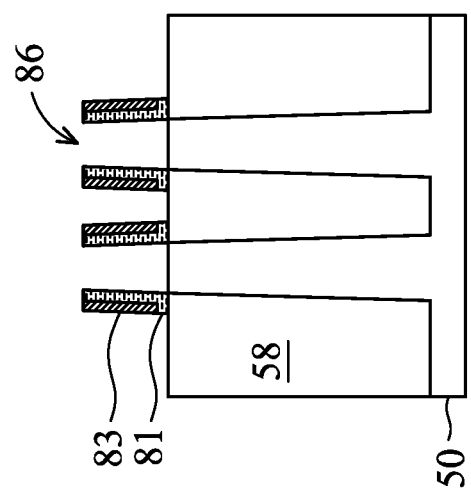
Figure 9B
Figure 9A

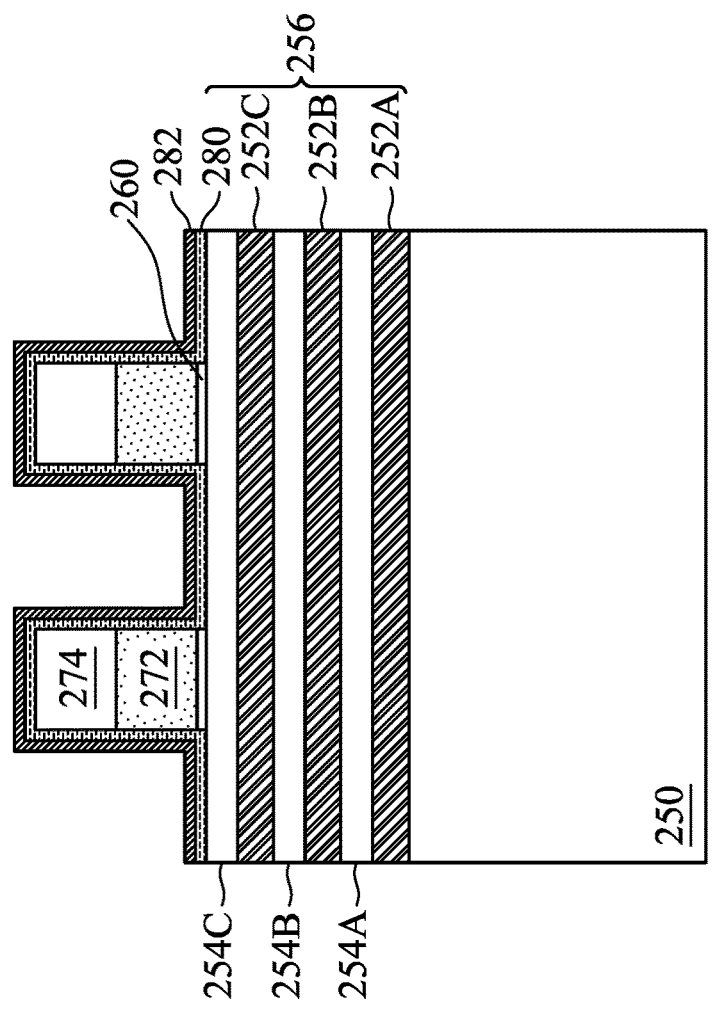
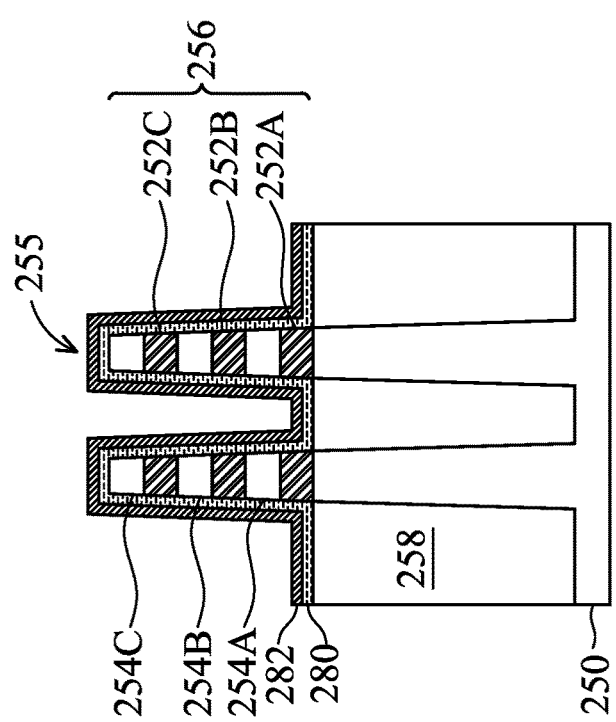
Figure 23B
Figure 23A

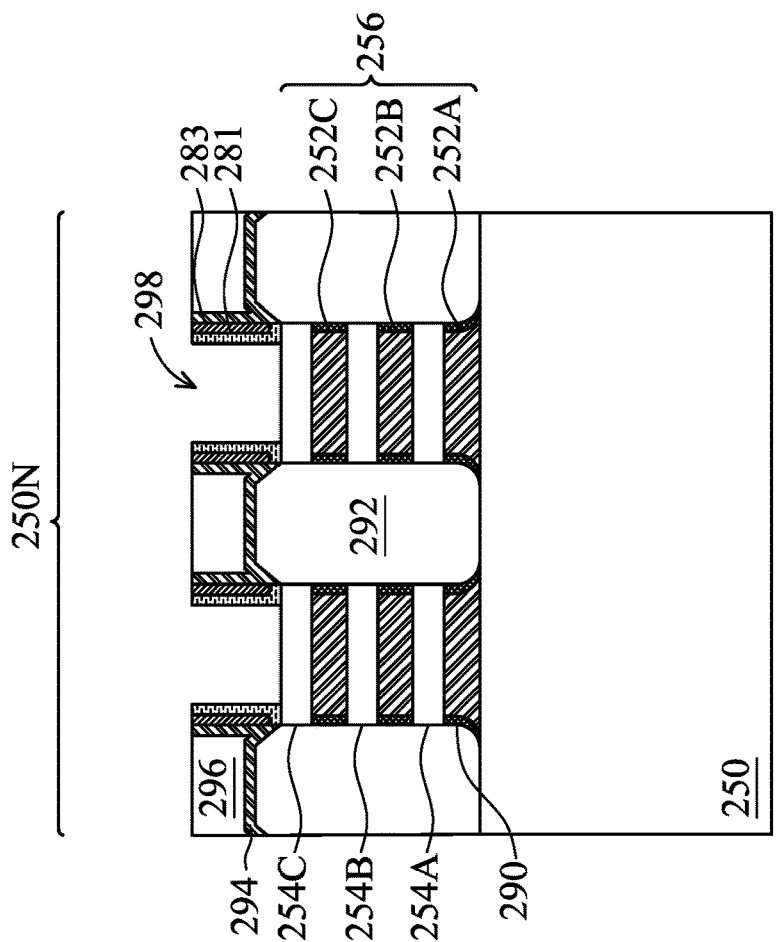
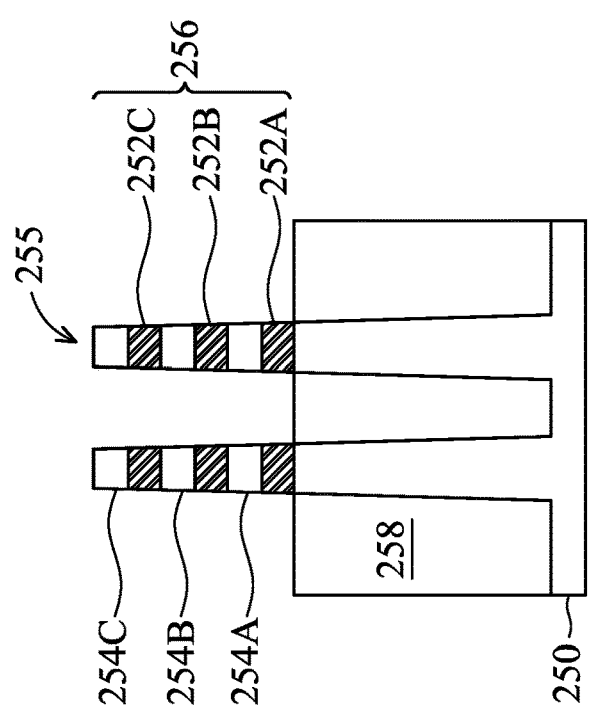
Figure 31B
Figure 31A

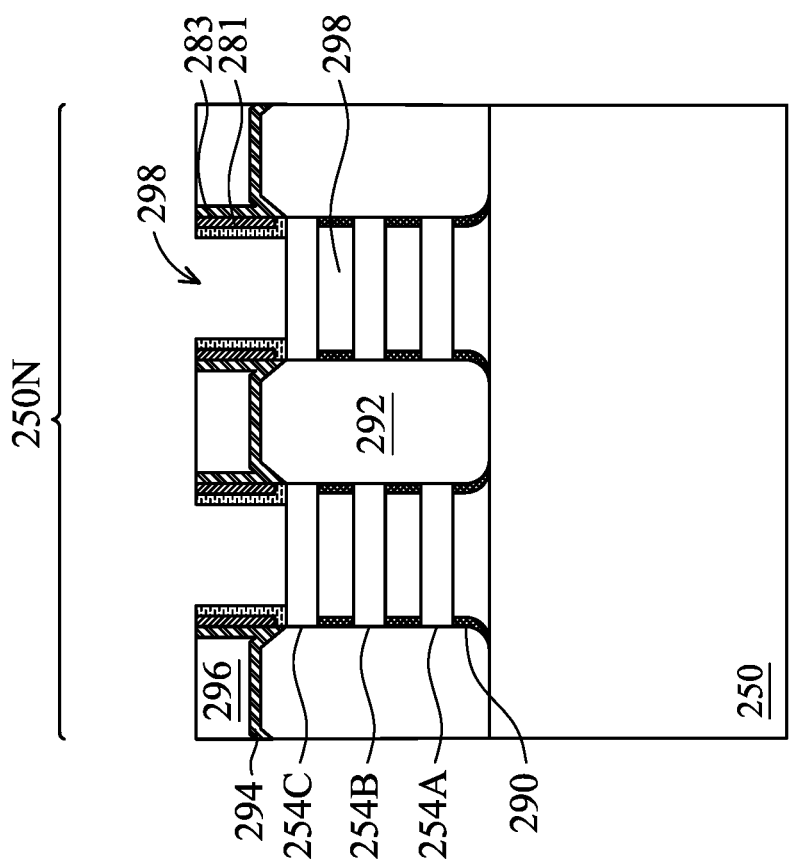
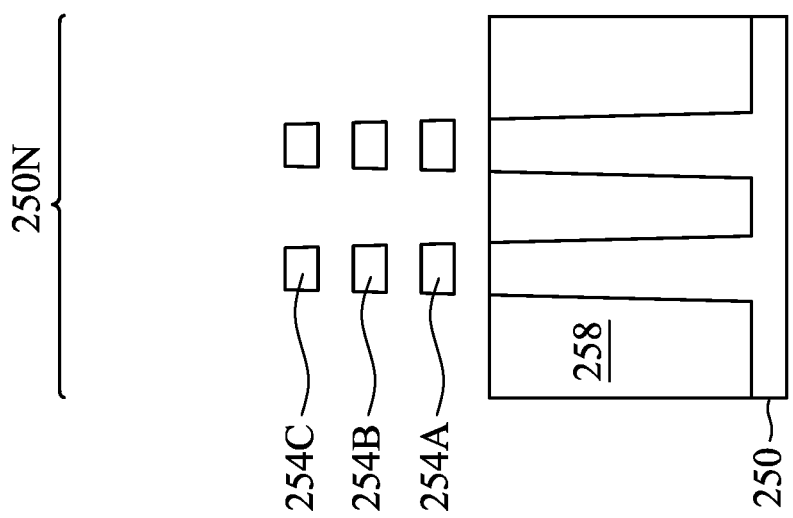
Figure 32B
Figure 32A

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 3C, 4A, 4B, 5, 6A, 6B, 7A, 7B, 8A, 8B, 9A, 9B, 10A, 10B, 10C, 11A, 11B, 12A, 12B, 13A, 13B, 13C, 13D, 13E, 14A, 14B, 14C, 15A, 15B, 16A, 16B, 16C, 16D, and 16E are cross-sectional views of intermediate stages in the manufacturing of semiconductor devices, in accordance with some embodiments.

FIGS. 18, 19A, 19B, 20A, 20B, 21, 22A, 22B, 23A, 23B, 24A, 24B, 25A, 25B, 26A, 26B, 26C, 27A, 27B, 27C, 28A, 28B, 28C, 28D, 29A, 29B, 29C, 30A, 30B, 30C, 31A, 31B, 31C, 31D, 31E, 32A, 32B, 32C, 32D, 33A, 33B, 33C, 33D, 33E, 33F, 34A, 34B, 35A, 35B, 35C, and 35D are cross-sectional views of intermediate stages in the manufacturing of semiconductor devices, in accordance with some embodiments.

DETAILED DESCRIPTION

Figure 1:
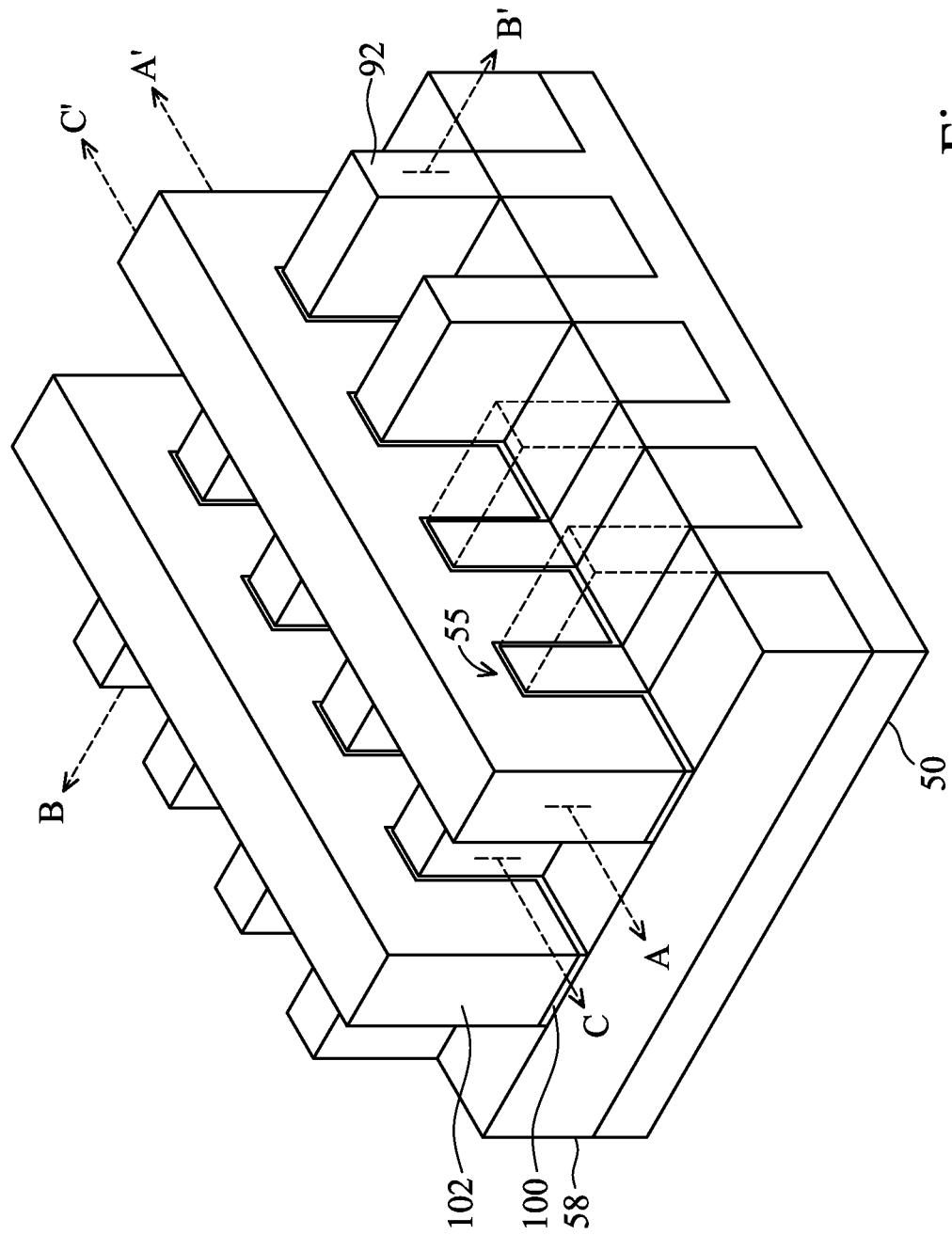
FIG. 1 illustrates an example of a semiconductor device including fin field-effect transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods of forming channel regions in semiconductor devices having improved profiles and semiconductor devices formed by said methods. The methods may include forming channel regions having gradient concentrations of semiconductor materials and thinning the channel regions. In some embodiments, the channel regions may be formed of silicon germanium having higher germanium concentrations at the bottom of the channel regions and lower germanium concentrations at the top of the channel regions. The channel regions may be thinned by exposing the channel regions to alkaline or acid solutions, which may be combined with or cycled with oxidant solutions. Portions of the channel regions having higher germanium concentrations may be thinned at higher rates than portions of the channel regions having lower germanium concentrations, which may be used to provide channel regions having rectangular profiles. Providing channel regions having more rectangular profiles reduces drain-induced barrier lowering (DIBL), increasing performance and reducing device defects of the resulting semiconductor devices.

FIG. 1 illustrates an example of FinFETs, in accordance with some embodiments. The FinFETs comprise fins 55 on a substrate 50 (e.g., a semiconductor substrate). Shallow trench isolation (STI) regions 58 are disposed in the substrate 50, and the fins 55 protrude above and from between neighboring STI regions 58. Although the STI regions 58 are described/illustrated as being separate from the substrate 50, as used herein the term "substrate" may be used to refer to just the semiconductor substrate or a semiconductor substrate inclusive of STI regions. Additionally, although the fins 55 are illustrated as single, continuous materials with the substrate 50, the fins 55 and/or the substrate 50 may comprise a single material or a plurality of materials. In this context, the fins 55 refer to the portions extending between the neighboring STI regions 58.

Gate dielectric layers 100 are along sidewalls and over a top surface of the fins 55, and gate electrodes 102 are over the gate dielectric layers 100. Epitaxial source/drain regions 92 are disposed on opposite sides of the fins 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the FinFETs. Cross-section B-B' is perpendicular to cross-section A-A' and is along a longitudinal axis of a fin 55 and in a direction of, for example, the current flow between the epitaxial source/drain regions 92 of the FinFETs. Cross-section C-C' is parallel to cross-section A-A' and extends through the epitaxial source/drain regions 92 of the FinFETs. Subsequent figures refer to these reference cross-sections for clarity.

Some embodiments discussed herein are discussed in the context of fin field effect transistors (FinFETs) and nanostructure (e.g., nanosheet, nanowire, gate-all-around, or the like) field effect transistors (NSFETs) formed using gate-last processes. In some embodiments, a gate-first process may be used. Also, some embodiments contemplate aspects used in planar devices or the like.

FIGS. 2 through 16B are cross-sectional views of intermediate stages in the manufacturing of FinFETs, in accordance with some embodiments. FIGS. 2, 3A, 3B, 3C, 4A, 4B, 5, 13C, 16C, 16D, and 16E illustrate reference cross-section A-A' illustrated in FIG. 1, including a region 50N and a region 50P. FIGS. 6A, 11A, 12A, 13A, 14A, 15A, and 16A are illustrated along reference cross-section A-A' illustrated in FIG. 1 in the region 50N or the region 50P. FIGS. 6B, 7B, 8B, 9B, 10B, 11B, 12B, 13B, 13D, 13E, 14B, 14C, 15B, and 16B are illustrated along a similar cross-section B-B' illustrated in FIG. 1. FIGS. 7A, 8A, 9A, 10A, and 10C are illustrated along reference cross-section C-C' illustrated in FIG. 1.

Figure 2:
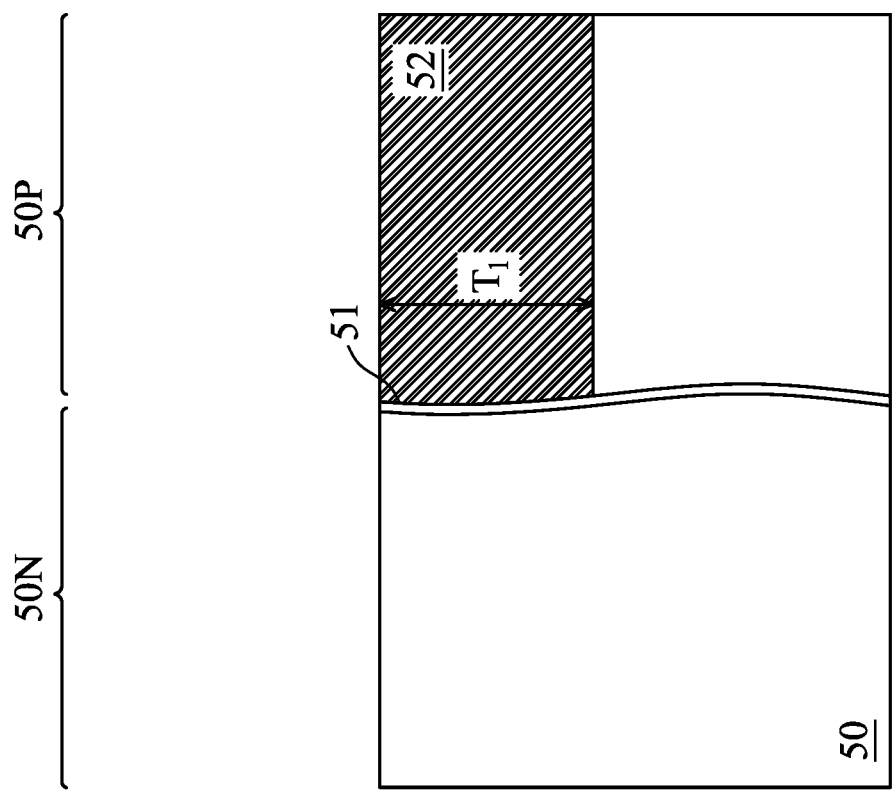

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Further in FIG. 2, a portion of the substrate 50 in the region 50P may be replaced with a first epitaxial semiconductor material 52. A patterned mask (not separately illustrated), such as a patterned photoresist, may be formed over the region 50N. The patterned photoresist may be formed by depositing a photoresist layer over the substrate 50 using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the patterned photoresist. The substrate 50 in the region 50P is then etched to form a first opening using a suitable etch process, such as an anisotropic etch process (e.g., a dry etch process) or the like. The patterned photoresist may then be removed.

The first epitaxial semiconductor material 52 is then formed filling the first opening. The first epitaxial semiconductor material 52 may be deposited by an epitaxial growth process, such as chemical vapor deposition (CVD), atomic layer deposition (ALD), vapor phase epitaxy (VPE), molecular beam epitaxy (MBE), or the like. The first epitaxial semiconductor material 52 may comprise a semiconductor material such silicon germanium or the like.

The first epitaxial semiconductor material 52 may be formed with a gradient germanium concentration. For example, in some embodiments, a germanium concentration of the first epitaxial semiconductor material 52 may be gradually and continuously increased from a top surface of the first epitaxial semiconductor material 52 to a bottom surface of the first epitaxial semiconductor material 52. In some embodiments, an atomic percentage of germanium in the first epitaxial semiconductor material 52 may range from about 0 percent at a top surface of the first epitaxial semiconductor material 52 to about 90 percent at a bottom surface of the first epitaxial semiconductor material 52. In some embodiments, the atomic percentage of germanium in the first epitaxial semiconductor material 52 may range from about 8 percent at the top surface of the first epitaxial semiconductor material 52 to about 32 percent at the bottom surface of the first epitaxial semiconductor material 52. In some embodiments, a ratio of the atomic percentage of germanium at the top surface of the first epitaxial semiconductor material 52 to the atomic percentage of germanium at the bottom surface of the first epitaxial semiconductor material 52 may range from about 1:2 to about 1:8 or from about 1:3 to about 1:5. As will be discussed in greater detail below, including the first epitaxial semiconductor material 52 with the prescribed ratios of atomic percentages of germanium results in fins (such as the fins 55, discussed below with respect to FIGS. 3A through 4B) having improved rectangular profiles, which results in better gate control, reduced fin-width variation, and decreased drain induced barrier loading.

In embodiments in which the first epitaxial semiconductor materials 52 are deposited by CVD, the gradient germanium concentration in the first epitaxial semiconductor material 52 may be achieved by gradually decreasing a flowrate of a germanium-containing precursor (e.g., germane ($GeH_4$) or the like) relative to a flowrate of a silicon-containing precursor (e.g., dichlorosilane ($H_2Cl_2Si$), silane ($SiH_4$), or the like) during the deposition of the first epitaxial semiconductor material 52. For example, a ratio of a flowrate of a germanium precursor to a flowrate of a silicon precursor may be from about 1 to about 9 or from about 1 to about 3 at the beginning of the deposition process used to deposit the first epitaxial semiconductor materials 52 and a ratio of the flowrate of the germanium precursor to the flowrate of the silicon precursor may be from about 0 to about 1 or from about 0 to about 0.5 at the end of the deposition process used to deposit the first epitaxial semiconductor material 52. After the first epitaxial semiconductor material 52 is deposited, top surfaces of the substrate 50 in the region 50N and the first epitaxial semiconductor material 52 in the region 50P may be planarized by a process such as a chemical mechanical polish (CMP). A thickness $T_1$ of the first epitaxial semiconductor material 52 may be from about 10 nm to about 200 nm or from about 40 nm to about 60 nm.

Figures 3A, 3B:
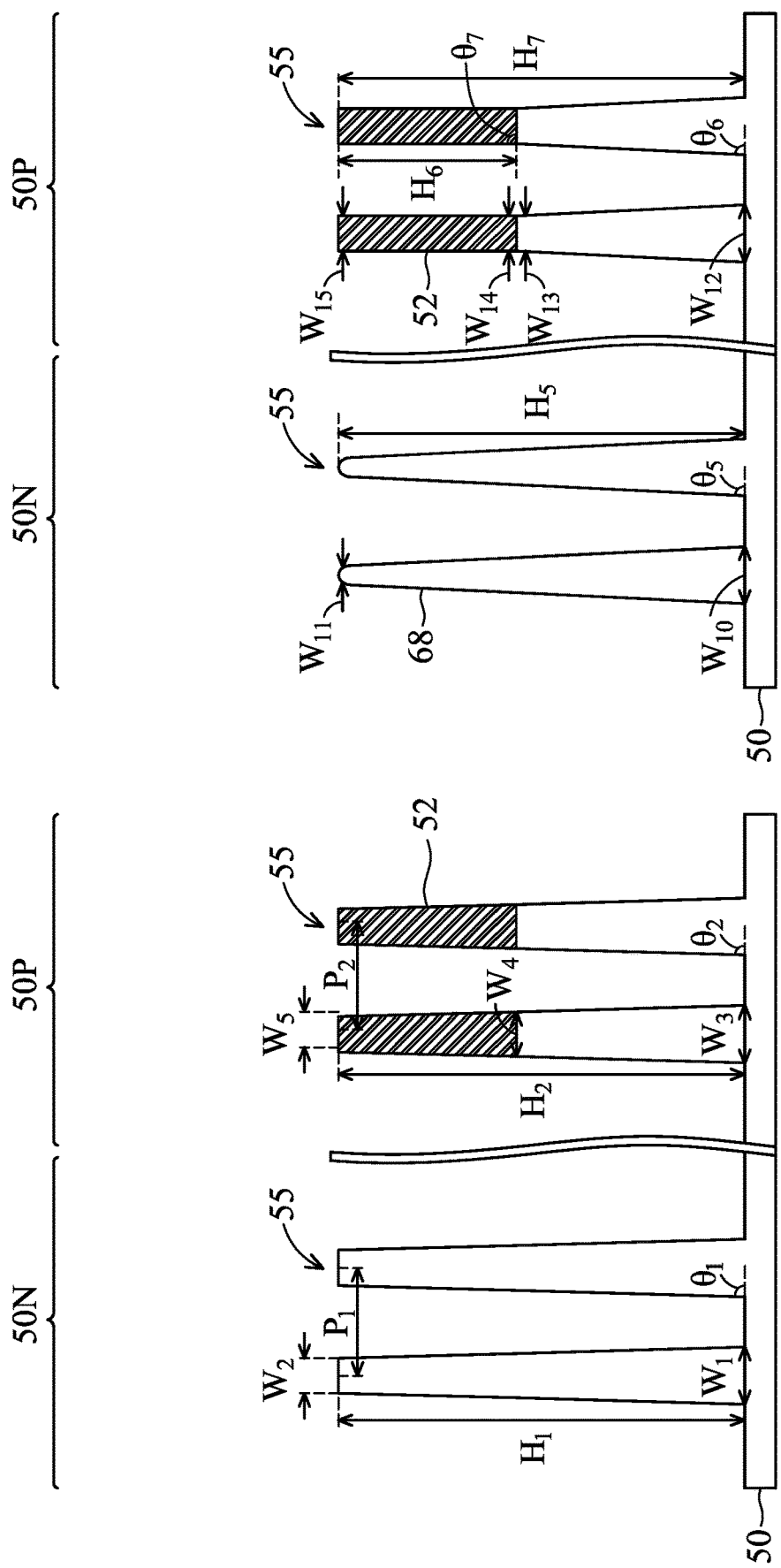

In FIG. 3A, fins 55 are formed in the substrate 50 and the first epitaxial semiconductor material 52. The fins 55 are semiconductor strips. In some embodiments, the fins 55 may be formed in the substrate 50 and the first epitaxial semiconductor material 52 by etching trenches in the substrate 50 and the first epitaxial semiconductor material 52. The etching may be any acceptable etch process, such as a reactive ion etch (RIE), a neutral beam etch (NBE), the like, or a combination thereof. The etch may be anisotropic.

The fins 55 may be patterned by any suitable method. For example, the fins 55 may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 55. In some embodiments, the mask (or other layer) may remain on the fins 55. As illustrated in FIG. 3A, the fins 55 in both the region 50N and the region 50P may have tapered profiles in which widths at the bottoms of the fins 55 are greater than widths at the top of the fins 55.

In the region 50N, the fins 55 (including fin-shaped portions of the substrate 50 extending from a flat top surface of the substrate 50) may have a bottom width $W_1$ from about 2.2 nm to about 100 nm, from about 25 nm to about 35 nm, or from about 28 nm to about 32 nm; a top width $W_2$ from about 2 nm to about 50 nm, from about 20 to 30 nm, or from about 23 nm to about 27 nm; a ratio of the top width $W_2$ to the bottom width $W_1$ from about 0.5 to about 2 or from about 0.7 to about 0.9; and a height $H_1$ from about 10 nm to about 200 nm or from about 70 nm to about 90 nm. The fins 55 in the region 50N may be spaced with a pitch $P_1$ from about 2 nm to about 100 nm or from about 25 nm to about 35 nm. An angle $\theta_1$ between sidewalls of the fins 55 in the region 50N and a top surface of the substrate 50 may be from about 70° to about 85°, from about 78° to about 82°, from about 95° to about 120°, or from about 98° to about 102°. In the region 50P, the fins 55 (including fin-shaped portions of the first epitaxial semiconductor material 52 and the substrate 50 extending from a flat top surface of the substrate 50) may have a bottom width $W_3$ from about 2.2 nm to about 100 nm, from about 25 nm to about 35 nm, or from about 28 nm to about 32 nm; a middle width $W_4$ at an interface between the substrate 50 and the first epitaxial semiconductor material 52 from about 2.2 nm to about 80 nm, from about 23 nm to about 33 nm, or from about 26 nm to about 30 nm; a top width $W_5$ from about 2 nm to about 50 nm, from about 20 nm to about 30 nm, or about 23 nm to about 27 nm; and a height $H_2$ from about 10 nm to about 200 nm or from about 70 nm to about 90 nm. A ratio of the top width $W_5$ to the middle width $W_4$ may be from about 2 to about 0.5 or from about 0.8 to about 1.0 and a ratio of the middle width $W_4$ to the bottom width $W_3$ may be from about 2 to about 0.5 or from about 0.8 to about 1.0. The fins 55 in the region 50p may be spaced with a pitch $P_2$ from about 2 nm to about 100 nm or from about 25 nm to about 35 nm. An angle $\theta_2$ between sidewalls of the fins 55 in the region 50P and a top surface of the substrate 50 may be from about 70° to about 85°, from about 78° to about 82°, from about 95° to about 120°, or from about 98° to about 102°.

FIG. 3B illustrates an embodiment in which a thinning process is performed to thin the fins 55 after forming the fins 55 and before STI regions (such as the STI regions 58, discussed below with respect to FIG. 4A). In the embodiment illustrated in FIG. 3B, the fins 55 in the region 50N may be exposed to etchants used to thin the fins 55 in the region 50P and the fins 55 in the region 50P may be exposed to etchants used to thin the fins in the region 50N.

In FIG. 3B, exposed portions of the fins 55 in the region 50N and exposed portions of the fins 55 in the region 50P formed in the substrate 50 may be etched using first etching chemicals in a first etching process. During the first etching process, the fins 55 in both the region 50N and the region 50P may be exposed to the first etching chemicals. A first etching selectivity, which is the ratio of the etching rate (sometimes referred to as the trimming rate) of the fins 55 in the region 50N and portions of the fins 55 in the region 50P formed in the substrate 50 (e.g., portions of the fins 55 formed of silicon) to the etching rate of portions of the fins 55 in the region 50P formed of the first epitaxial semiconductor material 52 (e.g., portions of the fins 55 formed of silicon germanium), may be desired to be high in order to minimize the etching of the portions of the fins 55 in the region 50P formed of the first epitaxial semiconductor material 52. For example, the first etching selectivity may be higher than about 5, and may range from about 5 to about 20, or higher. The first etching process may be performed at a temperature ranging from about 5° C. to about 100° C., such as about room temperature (e.g. about 23° C.). The fins 55 may be exposed to the first etching chemicals for a period ranging from about 10 seconds to about 5 minutes or from about 45 seconds to about 75 seconds.

In some embodiments, the first etching chemicals may include a first etchant dissolved in a first solvent. The first etching chemicals may be free from oxidants. The first etchant may include an alkaline or an acid. In embodiments in which the first etchant includes an alkaline, the first etchant may include a metal hydroxide ($M^{n+}(OH^-)_n$), amine derivatives, ammonium derivatives, combinations thereof, or the like. The metal hydroxide may include sodium hydroxide (NaOH), potassium hydroxide (KOH), lithium hydroxide (LiOH), rubidium hydroxide (RbOH), cesium hydroxide (CsOH), combinations thereof, or the like. The amine derivatives may include ammonia ($NH_3$), ammonium hydroxide ($NH_4OH$), tetramethylammonium hydroxide (TMAH, $(CH_3)_4N(OH)$), tetraethyl ammonium hydroxide (TEAH, $(C_2H_5)_4N(OH)$), trimethyltetradecylammonium hydroxide (TTAH, $(CH_3)_3(C_{14}H_{29})N(OH)$), tetrabutylammonium hydroxide (TBAH, $(C_4H_9)_4N(OH)$), combinations thereof, or the like. In embodiments in which the first etchant is an alkaline, a pH of the first etching chemicals may be from about 7 to about 13 or from about 8 to about 10. The first etchant may be present in the first etching chemicals in a concentration ranging from about 0.01 M to about 20 M or from about 0.5 M to about 1.5 M.

In embodiments in which the first etchant includes an acid, the first etchant may include hydrochloric acid (HCl), hydrofluoric acid (HF), sulfuric acid ($H_2SO_4$), phosphoric acid ($H_3PO_4$), nitric acid ($HNO_3$), carboxylic acid derivatives ($C_nH_{2n+1}COOH$), combinations thereof, or the like. In embodiments in which the first etchant is an acid, a pH of the first etching chemicals may be from about 0 to about 7 or from about 1 to about 3. The first etchant may be present in the first etching chemicals in a concentration ranging from about 0.01 M to about 20 M or from about 0.5 M to about 1.5 M.

The first solvent may be utilized to help mix and deliver the first etchant. The first solvent may not participate in the etching reaction itself. In a particular embodiment the first etching solvent may be a solvent such as deionized water or the like. However, any suitable solvent may be utilized.

The first etching chemicals may further include ionic or nonionic surfactants such as quaternary ammonium ($NR_4^+$), sulfate ($SO_4^{2-}$), sulfonate (R—$SO_3^-$), phosphate (—$PO_4^{3-}$), carboxylates (R—$COO^-$), alcohol ethoxylates, alkyl phenol ethoxylates, fatty acid ethoxylates, fatty amine ethoxylates, glycol esters, glycerol esters, combinations thereof, or the like, which may be added to reduce the surface tension of the first etching chemicals. The surfactants may be present in the first etching chemicals in a concentration ranging from about 0.0001 M to about 1 M or from about 0.005 m to about 0.02 M.

Prior to etching the fins 55 with the first etching process, the fins 55 have tapered profiles in which widths at the bottom of the fins 55 are greater than widths at the top of the fins 55 (as discussed previously in the discussed related to FIG. 3A). The first etching process may have the same etching rates at the top of the fins 55 and the bottom of the fins 55, such that the fins 55 in the region 50N and portions of the fins 55 in the region 50P formed in the substrate 50 still have a tapered profile after etching the fins 55 with the first etching process.

After the fins 55 in the region 50N and the region 50P are etched with the first etching process, the fins 55 in the region 50N may have a height $H_5$ from about 10 nm to about 200 nm or from about 60 nm to about 80 nm; a bottom width $W_{10}$ from about 2.2 nm to about 100 nm, from about 15 nm to about 25 nm, or from about 18 nm to about 22 nm; a top width $W_{11}$ from about 2 nm to about 50 nm, from about 10 nm to about 20 nm, or from about 13 nm to about 17 nm; and a ratio of the top width $W_{11}$ to the bottom width $W_0$ from about 0.5 to about 2 or from about 0.65 to about 0.85. An angle $\theta_5$ between sidewalls of the fins 55 in the region 50N and a top surface of the substrate 50 may be from about 70° to about 85°, from about 78° to about 82°, from about 95° to about 120°, or from about 98° to about 102°. Portions of the fins 55 in the region 50P formed in the substrate 50 may have a bottom width $W_{12}$ from about 2.2 nm to about 100 nm, from about 15 nm to about 25 nm, or from about 18 nm to about 22 nm; a top width $W_{13}$ from about 2 nm to about 80 nm, from about 13 nm to about 23 nm, or from about 16 nm to about 20 nm; and a ratio of the top width $W_{13}$ to the bottom width $W_{12}$ from about 0.5 to about 2 or from about 0.8 to about 1.0. An angle $\theta_6$ between sidewalls of the portions of the fins 55 formed in the substrate 50 in the region 50P and a top surface of the substrate 50 may be from about 70° to about 85°, from about 78° to about 82°, from about 95° to about 120°, or from about 98° to about 102°.

Further in FIG. 3B, exposed portions of the fins 55 in the region 50P formed of the first epitaxial semiconductor material 52 may be etched using second etching chemicals in a second etching process separate from the first etching process. During the second etching process, the fins 55 in both the region 50P and the region 50N may be exposed to the second etching chemicals. A second etching selectivity, which is the ratio of the etching rate of the portions of the fins 55 in the region 50P formed of the first epitaxial semiconductor material 52 to the etching rate of the fins 55 in the region 50N and the portions of the fins 55 in the region 50P formed in the substrate 50, is desired to be high in order to minimize the etching of the fins 55 in the region 50N and the portions of the fins in the region 50P formed in the substrate 50. For example, the second etching selectivity may be higher than about 5, and may range from about 5 to about 20, or higher. The second etching process may be performed at a temperature ranging from about 5° C. to about 100° C., such as about room temperature (e.g. about 23° C.).

In some embodiments, the second etching chemicals may include an oxidant and a second etchant dissolved in a second solvent. The fins 55 may be exposed to the oxidant and the second etchant simultaneously. In the embodiments in which the fins 55 are exposed to the oxidant and the second etchant simultaneously, the fins 55 may be exposed to the second etching chemicals for a period from about 30 seconds to about 2 minutes or from about 45 seconds to about 75 seconds. In some embodiments, the second etchant may be the same as the first etchant. For example, in some embodiments, the second etchant may be an alkaline or an acid.

In embodiments in which the second etchant includes an alkaline, the second etchant may include a metal hydroxide ($M^{n+}(OH^-)_n$), amine derivatives, ammonium derivatives, combinations thereof, or the like. The metal hydroxide may include sodium hydroxide (NaOH), potassium hydroxide (KOH), lithium hydroxide (LiOH), rubidium hydroxide (RbOH), cesium hydroxide (CsOH), combinations thereof, or the like. The amine derivatives may include ammonia ($NH_3$), ammonium hydroxide ($NH_4OH$), tetramethylammonium hydroxide (TMAH,$(CH_3)_4N(OH)$), tetraethyl ammonium hydroxide (TEAH,$(C_2H_5)_4N(OH)$), trimethyltetradecylammonium hydroxide (TTAH,$(CH_3)_3(C_{14}H_{29})N(OH)$), tetrabutylammonium hydroxide (TBAH,$(C_4H_9)_4N(OH)$), combinations thereof, or the like. In embodiments in which the second etchant is an alkaline, a pH of the second etching chemicals may be from about 7 to about 13 or from about 8 to about 10. The second etchant may be present in the second etching chemicals in a concentration ranging from about 0.01 M to about 20 M or from about 0.5 M to about 1.5 M.

In embodiments in which the second etchant includes an acid, the second etchant may include hydrochloric acid (HCl), hydrofluoric acid (HF), sulfuric acid ($H_2SO_4$), phosphoric acid ($H_3PO_4$), nitric acid ($HNO_3$), carboxylic acid derivatives ($C_nH_{2n+1}COOH$), combinations thereof, or the like. In embodiments in which the second etchant is an acid, a pH of the second etching chemicals may be from about 0 to about 7 or from about 1 to about 3. The second etchant may be present in the second etching chemicals in a concentration ranging from about 0.01 M to about 20 M or from about 0.5 M to about 1.5 M.

The oxidant may include ozonated de-ionized water ($DIO_3$), hydrogen peroxide ($H_2O_2$), other non-metal oxidants, combinations thereof, or the like. An oxidizing agent may be present in the second etching chemicals in a concentration ranging from about 0.0001 M to about 1 M or from about 0.0005 m to about 0.002 M. Including the oxidant in addition to the second etchant allows the first epitaxial semiconductor material 52 to be etched selectively with respect to the fins 55 in the region 50N and portions of the fins 55 in the region 50P formed in the substrate 50. The oxidant may be used to oxidize the fins 55 in the region 50P, forming silicon germanium oxide in the fins 55, and the second etchant may then be used to etch the silicon germanium oxide material, thinning the fins 55 in the region 50P. On the other hand, in the region 50N, the oxidant may be used to oxidize the fins 55, forming silicon oxide in the fins 55, which is etched at a slower rate by the second etchant. Silicon may also be oxidized at a slower rate than silicon germanium, such that any silicon oxide layer formed in the fins 55 in the region 50N and portions of the fins 55 in the region 50P formed in the substrate 50 is thinner than an oxide layer formed in the fins 55 in the region 50P. Accordingly, the fins 55 in the region 50N and portions of the fins 55 in the region 50P formed in the substrate 50 are substantially un-thinned, while the fins 55 in the region 50P are thinned.

The second solvent may be utilized to help mix and deliver the oxidant and the second etchant. The second solvent may not participate in the etching reaction itself. In a particular embodiment the second etching solvent may be a solvent such as deionized water, acetic acid ($CH_3COOH$), or the like. In embodiments in which the oxidant includes ozonated deionized water, the deionized water may also act as a solvent. Any suitable solvents may be utilized.

The second etching chemicals may further include ionic or nonionic surfactants such as quaternary ammonium ($NR_4^+$), sulfate ($SO_4^{2-}$), sulfonate ($R-SO_3^-$), phosphate ($-PO_4^{3-}$), carboxylates ($R-COO^-$), alcohol ethoxylates, alkyl phenol ethoxylates, fatty acid ethoxylates, fatty amine ethoxylates, glycol esters, glycerol esters, combinations thereof, or the like, which may be added to reduce the surface tension of the second etching chemicals. The surfactants may be present in the second etching chemicals in a concentration ranging from about 0.0001 M to about 1 M or from about 0.005 m to about 0.02 M.

In a specific embodiment, the second etching chemicals may include hydrofluoric acid (HF), hydrogen peroxide ($H_2O_2$), and acetic acid ($CH_3COOH$). The acetic acid may be a solvent in which the hydrofluoric acid and the hydrogen peroxide dissolved. The hydrogen peroxide may be an oxidant, which is used to oxidize the fins 55 in the region 50P. The hydrofluoric acid may be a second etchant which is used to thin the fins 55 in the region 50P. A volume ratio of hydrofluoric acid:hydrogen peroxide:acetic acid may be about 1:2:3.

In further embodiments, the fins 55 may be exposed to an oxidant, then the oxidant may be removed and the fins 55 may be exposed to second etchant in a cyclical process to thin the fins 55. Exposing the fins 55 to the oxidant may oxidize the fins 55 in the region 50N and the region 50P. Exposing the fins 55 to the etchants may selectively etch the oxide formed in the first epitaxial semiconductor material 52 relative to the oxide formed in the fins 55 in the region 50N and portions of the fins 55 in the region 50P formed in the substrate 50.

The oxidant used in the cyclical process may be the same as those described above as being used in the process in which the fins 55 are exposed to the oxidant and the second etchant simultaneously. For example, the oxidant may include ozonated de-ionized water ($DIO_3$), hydrogen peroxide ($H_2O_2$), other non-metal oxidants, combinations thereof, or the like. An oxidizing agent may be present in the oxidant at a concentration ranging from about 0.0001 M to about 1 M or from about 0.0005 m to about 0.002 M. As discussed previously, exposing the fins 55 may oxidize the fins 55 in the region 50P. The fins 55 in the region 50N may also be oxidize, but may be oxidized at a slower rate than the fins 55 in the region 50P.

The second etchant used in the cyclical process may be the same as or similar to the first etchant. The second etchant may be present in a concentration ranging from about 0.01 M to about 20 M or from about 0.5 M to about 1.5 M. Exposing the fins 55 to the second etchant thins the fins 55. As discussed previously, the fins 55 in the region 50N may be thinned at a slower rate than the fins 55 in the region 50P.

For each cycle, the fins 55 may be exposed to the oxidant for a period ranging from about 10 seconds to about 2 minutes or from about 45 seconds to about 75 seconds and the fins 55 may be exposed to the second etchant for a period ranging from about 10 seconds to about 5 minutes or from about 45 seconds to about 75 seconds. The cyclical etching process may be repeated for up to 20 cycles, up to 10 cycles, 4 to 6 cycles, or the like. Exposing the fins 55 to the oxidant, then the second etchant in a cyclical process may provide better control of the etching of the first epitaxial semiconductor material 52. This results in improved gate control of resulting FinFETs, reduces the fin-width variation, and leads to decreased DIBL.

The second etching process may have etching rates which depend on the concentration of germanium in the first epitaxial semiconductor material 52. For example, the second etching process may have higher etching rates with increasing germanium concentration in the first epitaxial semiconductor material 52. As discussed previously in the discussion related to FIG. 2, the first epitaxial semiconductor material 52 may have a gradient germanium concentration in which the germanium concentration is higher at the bottom surface of the first epitaxial semiconductor material 52 and gradually and continually decreases towards the top surface of the first epitaxial semiconductor material 52. Thus, bottom portions of the first epitaxial semiconductor material 52 may be etched by the second etching process with higher etching rates than top portions of the first epitaxial semiconductor material 52. A ratio of the etching rate at the bottom surface of the first epitaxial semiconductor material 52 (e.g., a maximum etching rate) to the etching rate at the top surface of the first epitaxial semiconductor material 52 (e.g., a minimum etching rate) may be from about 1 to about 3 or from about 1.25 to about 1.75.

Prior to etching the fins 55 in the region 50P with the second etching process, the fins 55 have a tapered profile in which widths at the bottom of the fins 55 are greater than widths at the top of the fins 55 (as discussed previously in the discussed related to FIG. 3A). Etching the first epitaxial semiconductor material 52 with the second etching process which has a higher etching rate at the bottom of the first epitaxial semiconductor material 52 than the top of the first epitaxial semiconductor material 52 results in the first epitaxial semiconductor material 52 having a more rectangular profile after etching the first epitaxial semiconductor material 52 with the second etching process.

After the first epitaxial semiconductor material 52 is etched with the second etching process, portions of the fins 55 in the region 50P formed of the first epitaxial semiconductor material 52 may have a height $H_6$ from about 5 nm to about 100 nm or from about 60 nm to about 80 nm; a bottom width $W_{14}$ from about 2.2 nm to about 100 nm, from about 10 nm to about 20 nm, or from about 13 nm to about 17 nm; a top width $W_{15}$ from about 2 nm to about 50 nm, from about 10 nm to about 20 nm, or from about 13 nm to about 17 nm; and a ratio of the top width $W_{15}$ to the bottom width $W_{14}$ from about 0.8 to about 1.2 or from about 0.9 to about 1.1. An angle $\theta_7$ between sidewalls of the portions of the fins 55 formed of the first epitaxial semiconductor material 52 in the region 50P and a top surface of the substrate 50 may be from about 80° to about 100°, from about 85° to about 95°, or from about 88° to about 92°. The fins 55 in the region 50P may have a height $H_7$ from about 10 nm to about 200 nm or from about 70 nm to about 90 nm.

Forming the fins 55 in the region 50P having a gradient germanium concentration and thinning the fins 55 in the region 50P using an etching process which has a higher etching rate with increasing germanium concentration results in the fins 55 in the region 50P having more rectangular profiles and improves control of the process used to etch the fins 55 in the region 50P. Including the fins 55 in FinFETs results in better gate control, reduced fin-width variation, and decreased DIBL.

Figure 3C:
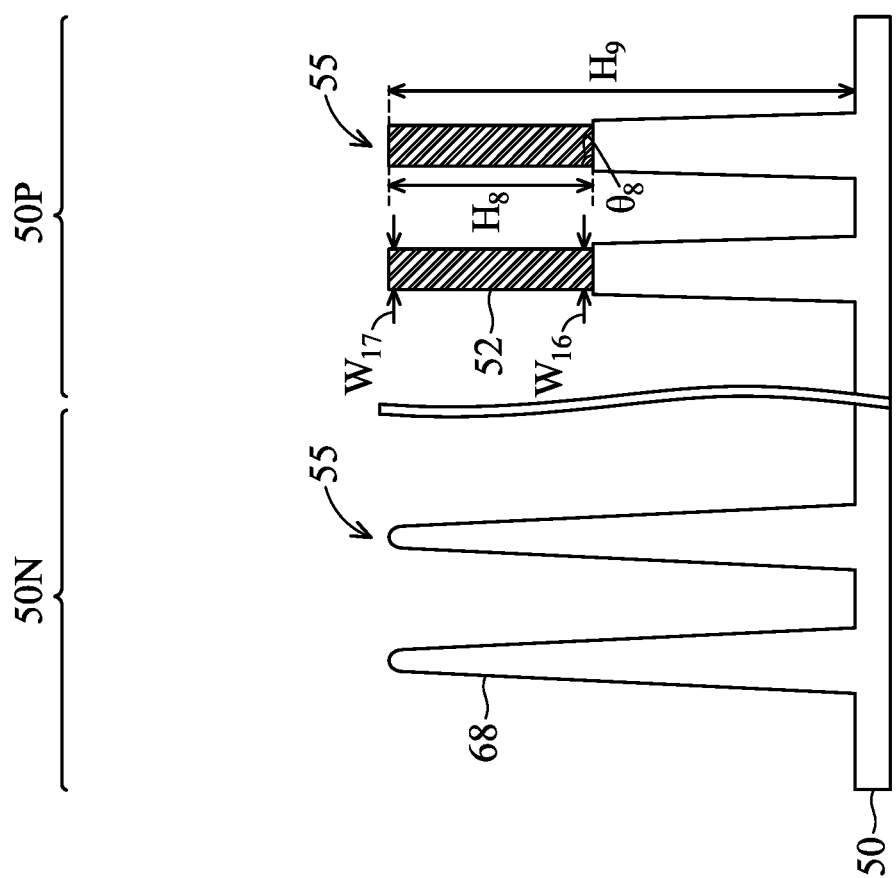

FIG. 3C illustrates another embodiment in which a thinning process is performed to thin the fins 55 after forming the fins 55 and before STI regions (such as the STI regions 58, discussed below with respect to FIG. 4A). In the embodiment illustrated in FIG. 3C, the fins 55 in the region 50N may be masked while the fins 55 in the region 50P are thinned and the fins 55 in the region 50P may be masked while the fins 55 in the region 50N are thinned.

In FIG. 3C, the fins 55 in the region 50N are exposed to the first etching chemicals while the fins 55 in the region 50P are protected. The fins 55 in the region 50P may be protected by forming a patterned mask (not separately illustrated), such as a patterned photoresist, over the region 50P. The patterned photoresist may be formed by depositing a photoresist layer over the substrate 50 using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the patterned photoresist. The fins 55 in the region 50N are then thinned by exposing the fins 55 to the first etching chemicals. The patterned photoresist may then be removed. In some embodiments, the fins 55 in the region 50N may also be protected while the fins 55 in the region 50P are exposed to the second etching chemicals using a process the same as or similar to the process used to protect the fins 55 in the region 50P. The first etching chemicals and processes used to etch the fins 55 in the region 50N and the second etching chemicals and processes used to etch the fins 55 in the region 50P may be the same as or similar to those described above in reference to FIG. 3B.

After the fins 55 in the region 50N and the region 50P are etched, the fins 55 in the region 50N may have the same dimensions as the fins 55 in the region 50N discussed above with respect to FIG. 3B. Portions of the fins 55 in the region 50P formed in the substrate 50 may have the same or similar dimensions as the portions of the fins 55 in the region 50P formed in the substrate 50 as discussed above with respect to FIG. 3A. For example, widths of the fins 55 in the region 50P formed in the substrate 50P may be within about 10 nm of the widths discussed above with respect to FIG. 3A. Portions of the fins 55 in the region 50P formed of the first epitaxial semiconductor material 52 may have a height $H_8$ from about 5 nm to about 100 nm or from about 60 nm to about 80 nm; a bottom width $W_{16}$ from about 2.2 nm to about 100 nm, from about 10 nm to about 20 nm, or from about 13 nm to about 17 nm; a top width $W_{17}$ from about 2 nm to about 50 nm, from about 10 nm to about 20 nm, or from about 13 nm to about 17 nm; and a ratio of the top width $W_{17}$ to the bottom width $W_{16}$ from about 0.8 to about 1.2, or from about 0.9 to about 1.1. An angle $\theta_8$ between sidewalls of the portions of the fins 55 formed of the first epitaxial semiconductor material 52 in the region 50P and a top surface of the substrate 50 may be from about 80° to about 100°, from about 85° to about 95°, or from about 88° to about 92°. The fins 55 in the region 50P may have a height $H_9$ from about 10 nm to about 200 nm or from about 70 nm to about 90 nm.

Forming the fins 55 in the region 50P having a gradient germanium concentration and thinning the fins 55 in the region 50P using an etching process which has a higher etching rate with increasing germanium concentration results in the fins 55 in the region 50P having more rectangular profiles and improves control of the process used to etch the fins 55 in the region 50P. Including the fins 55 in FinFETs results in better gate control, reduced fin-width variation, and decreased DIBL. Using various masks to protect the fins 55 in the region 50N while etching the fins 55 in the region 50P and to protect the fins in the region 50P while etching the fins 55 in the region 50N allows for additional control over fin profiles in the region 50N and the region 50P.

FIG. 4A illustrates an embodiment in which the fins 55 are not thinned until after shallow trench isolation (STI) regions 58 are formed. For example, the thinning process may be performed after the formation of the STI regions 58, as will be discussed below with respect to FIG. 4B, or after the removal of dummy gate stacks (such as dummy gate stacks including the dummy gates 72 and the dummy dielectric layers 60, discussed below with respect to FIGS. 6A and 6B), as will be discussed below with respect to FIGS. 13C through 13E. However, it should be understood that the steps performed in FIG. 4A and subsequent figures may be performed on fins 55 which have been thinned as described above in reference to FIGS. 3B and 3C.

In FIG. 4A, shallow trench isolation (STI) regions 58 are formed adjacent the fins 55. The STI regions 58 may be formed by forming an insulation material (not separately illustrated) over the substrate 50 and between neighboring fins 55. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the fins 55. The insulation material may comprise a single layer or may utilize multiple layers. For example, in some embodiments a liner (not separately illustrated) may first be formed along surfaces of the substrate 50 and the fins 55. Thereafter, a fill material, such as those discussed above may be formed over the liner.

A removal process is then applied to the insulation material to remove excess insulation material over the fins 55. In some embodiments, a planarization process such as a chemical mechanical polish (CMP), an etch-back process, combinations thereof, or the like may be utilized. The planarization process may planarize the insulation material and the fins 55. The planarization process exposes the fins 55 such that top surfaces of the fins 55 and the insulation material are level after the planarization process is complete.

The insulation material is then recessed to form the STI regions 58 as illustrated in FIG. 4A. The insulation material is recessed such that upper portions of the fins 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the fins 55 and the substrate 50). For example, an oxide removal using, for example, dilute hydrofluoric (dHF) acid may be used. A height $H_{11}$ of the STI regions 58 may be from about 30 nm to about 100 nm or from about 55 nm to about 75 nm.

Further in FIG. 4A, appropriate wells (not separately illustrated) may be formed in the fins 55 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 55 and the STI regions 58 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist is removed, such as by an acceptable ashing process.

Following the implanting of the region 50P, a photoresist is formed over the fins 55 and the STI regions 58 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

FIG. 4B illustrates an embodiment in which the thinning process is performed to thin the fins 55 after forming the STI regions 58, rather than being performed after forming the fins 55 and before forming the STI regions 58, as discussed above in reference to FIGS. 3B and 3C. In the embodiment illustrated in FIG. 4B, the fins 55 in the region 50N may be exposed to etchants used to thin the fins 55 in the region 50P and the fins 55 in the region 50P may be exposed to etchants used to thin the fins 55 in the region 50N.

In the embodiment illustrated in FIG. 4B, the fins 55 in both the region 50N and the region 50P are exposed to the first etching chemicals and the second etching chemicals in processes the same as or similar to those described above with respect to FIG. 3B. Following the first etching process, the fins 55 (including fin-shaped portions of the substrate 50 extending from a flat top surface of the substrate 50) in the region 50N may have a height $H_3$ from about 5 nm to about 100 nm or from about 60 nm to about 80 nm; a bottom width $W_6$ from about 2.2 nm to about 80 nm, from about 17 nm to about 27 nm, or from about 20 nm to about 24 nm; a top width $W_7$ from about 2 nm to about 50 nm, from about 10 nm to about 20 nm, or from about 13 nm to about 17 nm; and a ratio of the top width $W_7$ to the bottom width $W_6$ from about 0.5 to about 2 or from about 0.6 to about 0.8. An angle $\theta_3$ between sidewalls of the fins 55 in the region 50N and a top surface of the substrate 50 may be from about 70° to about 85°, from about 78° to about 82°, from about 95° to about 120°, or from about 98° to about 102°. Following the second etching process, the fins 55 (including fin-shaped portions of the first epitaxial semiconductor material 52 and the substrate 50 extending from a flat top surface of the substrate 50) in the region 50P may have a height $H_4$ from about 5 nm to about 100 nm or from about 60 nm to about 80 nm; a bottom width $W_8$ from about 2.2 nm to about 80 nm, from about 10 nm to about 20 nm, or from about 13 nm to about 17 nm; a top width $W_9$ from about 2 nm to about 50 nm, from about 10 nm to about 20 nm, or from about 13 nm to about 17 nm; and a ratio of the top width $W_9$ to the bottom width $W_8$ from about 0.8 to about 1.2 or from about 0.9 to about 1.1. In some embodiments, the bottom width $W_8$ of the fins 55 in the region 50P may be within 10 nm, within 5 nm, or within 1 nm of the top width $W_9$ of the fins 55 in the region 50P. An angle $\theta_4$ between sidewalls of the fins 55 in the region 50P and a top surface of the substrate 50 may be from about 80° to about 100°, from about 85° to about 95°, or from about 88° to about 92°.

Portions of the fins 55 in the region 50N and the region 50P surrounded by the STI regions 58 may remain unchanged after the thinning process is performed. For example, portions of the fins 55 disposed below top surfaces of the STI regions 58 may have widths similar to or the same as those discussed above with respect to FIG. 3A. As illustrated in FIG. 4B, there may be a step change in the widths of the fins 55 level with the top surfaces of the STI regions 58 due to the thinning process.

Forming the fins 55 in the region 50P having a gradient germanium concentration and thinning the fins 55 in the region 50P using an etching process which has a higher etching rate with increasing germanium concentration results in the fins 55 in the region 50P having more rectangular profiles and improves control of the process used to etch the fins 55 in the region 50P. Including the fins 55 in FinFETs results in better gate control, reduced fin-width variation, and decreased DIBL.

Figure 5:
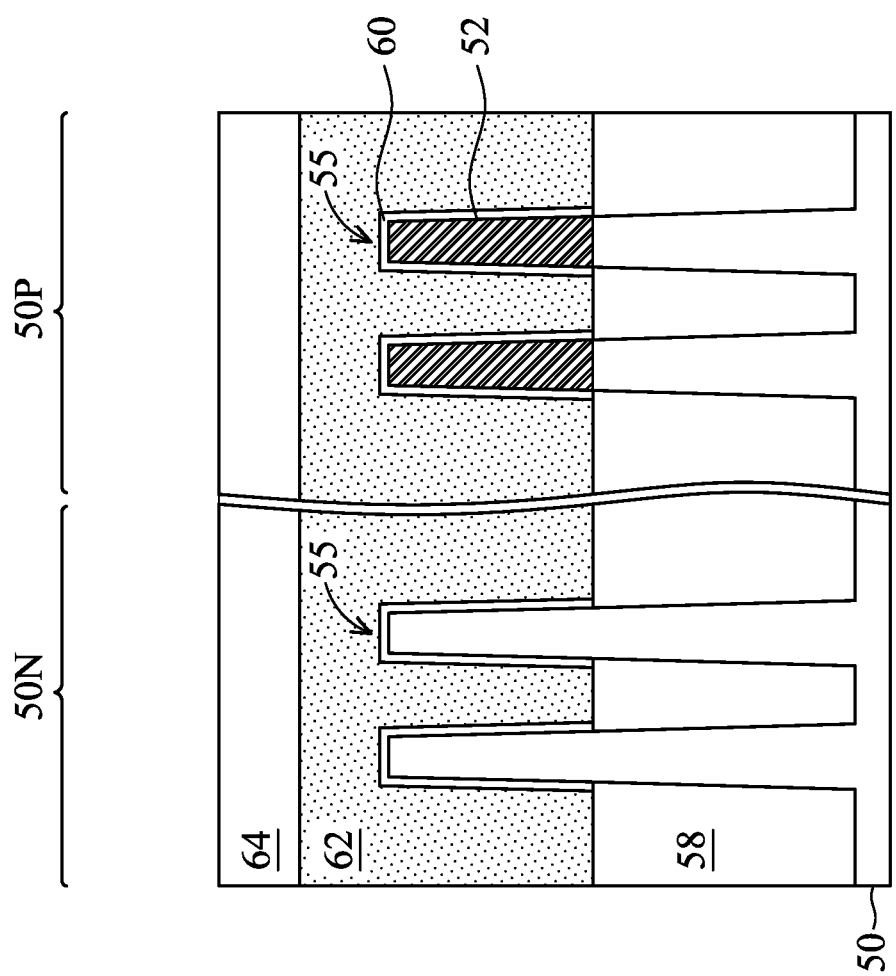

FIG. 5 illustrates an embodiment in which the fins 55 are not thinned until after dummy gates stacks (such as dummy gate stacks including the dummy gates 72 and the dummy dielectric layers 60, discussed below with respect to FIGS. 6A and 6B) are formed. For example, the thinning process may be performed after the removal of the dummy gate stacks, as will be discussed below with respect to FIGS. 13C through 13E. However, it should be understood that the steps performed in FIG. 5 and subsequent figures may be performed on fins 55 which have been thinned as described above in reference to FIGS. 3B, 3C, and 4B.

In FIG. 5, dummy dielectric layers 60 are formed on the fins 55 and the substrate 50. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layers 60 are shown covering only the fins 55 and the substrate 50 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 16E illustrate various additional steps in the manufacturing of embodiment devices. FIGS. 6A through 13B and FIGS. 14A through 16B illustrate features in either of the region 50N or the region 50P. For example, the structures illustrated in FIGS. 6A through 13B and FIGS. 14A through 16B may be applicable to both the region 50N and the region 50P. Differences (if any) in the structures of the region 50N and the region 50P are described in the text accompanying each figure. For example, the structures illustrated in FIGS. 13C through 13E and FIGS. 16C through 16E describe differences between the region 50N and the region 50P.

Figure 6B:
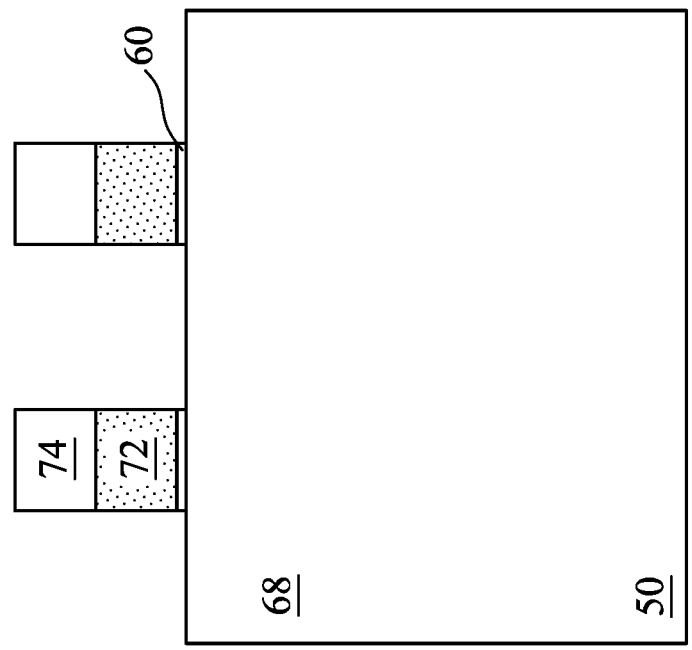
Figure 6A:
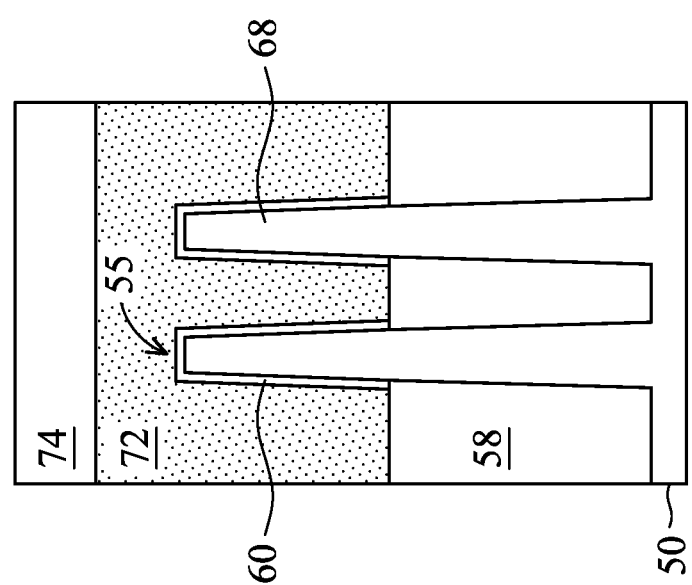

In FIGS. 6A and 6B, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions 68 of the fins 55. The pattern of the masks 74 may be used to physically separate each of the dummy gates 72 from adjacent dummy gates. The dummy gates 72 may also have a lengthwise direction substantially perpendicular to the lengthwise direction of respective fins 55. The dummy dielectric layers 60, the dummy gates 72, and the masks 74 may be collectively referred to as "dummy gate stacks."

Figure 7B:
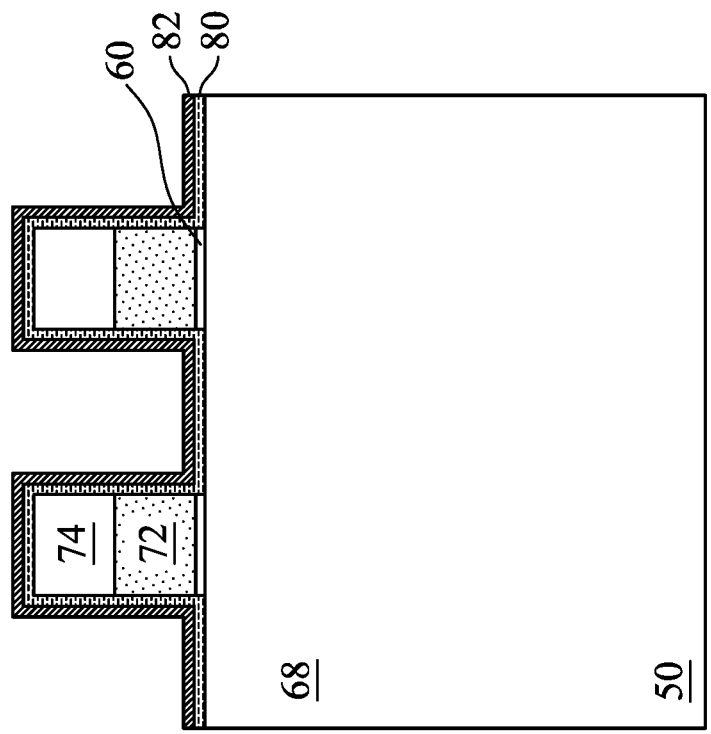
Figure 7A:
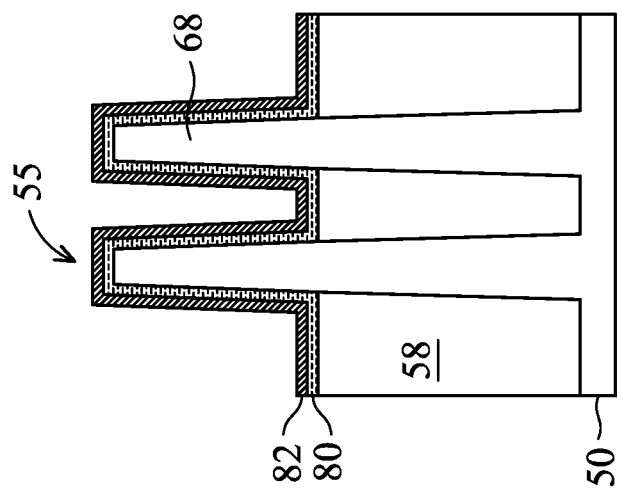

In FIGS. 7A and 7B, a first spacer layer 80 and a second spacer layer 82 are formed over the structures illustrated in FIGS. 6A and 6B. In FIGS. 7A and 7B, the first spacer layer 80 is formed on top surfaces of the STI regions 58, top surfaces and sidewalls of the fins 55 and the masks 74, and sidewalls of the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 8B:
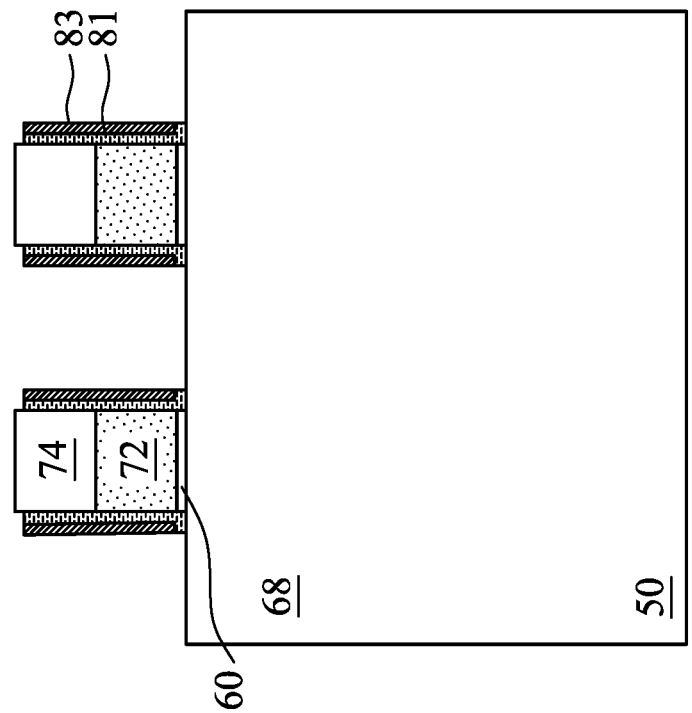
Figure 8A:
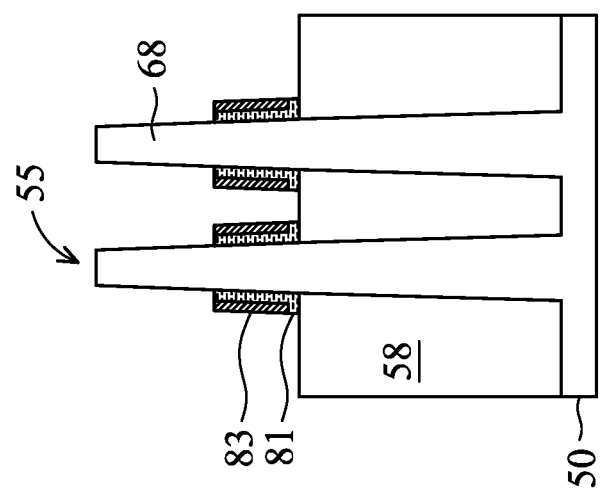

In FIGS. 8A and 8B, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and the second spacers 83 may be disposed on sidewalls of the fins 55, the dummy dielectric layers 60, the dummy gates 72, and the masks 74. The first spacers 81 and the second spacers 83 may have different heights adjacent the fins 55 and the dummy gate stacks due to the etching processes used to etch the first spacer layer 80 and the second spacer layer 82, as well as differing heights between the fins 55 and the dummy gate stacks. Specifically, as illustrated in FIGS. 8A and 8B, in some embodiments, the first spacers 81 and the second spacers 83 may extend partially up sidewalls of the fins 55 and the dummy gate stacks. In some embodiments, the first spacers 81 and the second spacers 83 may extend to top surfaces of the dummy gate stacks.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the region 50N, while exposing the region 50P, and appropriate type (e.g., p-type) impurities may be implanted into the exposed fins 55 and the substrate 50 in the region 50P. The mask may then be removed. Subsequently, a mask, such as a photoresist, may be formed over the region 50P while exposing the region 50N, and appropriate type impurities (e.g., n-type) may be implanted into the exposed fins 55 and the substrate 50 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1\times10^{15}$ atoms/cm$^3$ to about $1\times10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like). Furthermore, the n-type and p-type devices may be formed using a different structures and steps.

In FIGS. 9A and 9B, first recesses 86 are formed in the fins 55 and the substrate 50. As illustrated in FIG. 9A, top surfaces of the STI regions 58 may be level with top surfaces of the substrate 50. The substrate 50 may be etched such that bottom surfaces of the first recesses 86 are disposed above or below the top surfaces of the STI regions 58. The first recesses 86 may be formed by etching the fins 55 and the substrate 50 using anisotropic etching processes, such as RIE, NBE, or the like. The first spacers 81, the second spacers 83, and the masks 74 mask portions of the fins 55 and the substrate 50 during the etching processes used to form the first recesses 86. A single etch process or multiple etch processes may be used to form the first recesses 86. Timed etch processes may be used to stop the etching of the first recesses 86 after the first recesses 86 reach a desired depth.

Figures 10A, 10B, 10C:
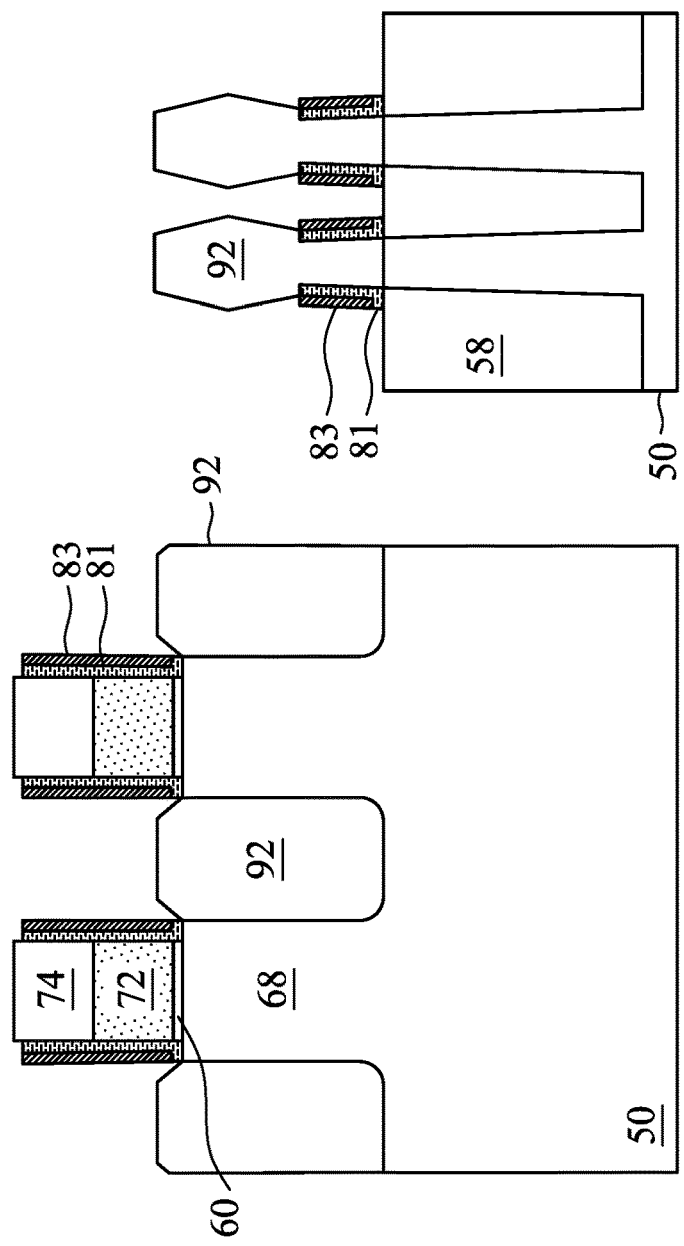

In FIGS. 10A-10C, epitaxial source/drain regions 92 are formed in the first recesses 86 to exert stress on the channel regions 68 of the fins 55, thereby improving performance. As illustrated in FIG. 10B, the epitaxial source/drain regions 92 are formed in the first recesses 86 such that each dummy gate 72 is disposed between respective neighboring pairs of the epitaxial source/drain regions 92. In some embodiments, the first spacers 81 are used to separate the epitaxial source/ drain regions 92 from the dummy gates 72 by an appropriate lateral distance so that the epitaxial source/drain regions 92 do not short out subsequently formed gates of the resulting FinFETs.

The epitaxial source/drain regions 92 in the region 50N, e.g., the NMOS region, may be formed by masking the region 50P, e.g., the PMOS region. Then, the epitaxial source/drain regions 92 are epitaxially grown in the first recesses 86. The epitaxial source/drain regions 92 may include any acceptable material, such as appropriate for n-type FinFETs. For example, if the fins 55 are silicon, the epitaxial source/drain regions 92 may include materials exerting a tensile strain on the fins 55, such as silicon, silicon carbide, phosphorous doped silicon carbide, silicon phosphide, or the like. The epitaxial source/drain regions 92 may have surfaces raised from respective surfaces of the fins 55 and may have facets.

The epitaxial source/drain regions 92 in the region 50P, e.g., the PMOS region, may be formed by masking the region 50N, e.g., the NMOS region. Then, the epitaxial source/drain regions 92 are epitaxially grown in the first recesses 86. The epitaxial source/drain regions 92 may include any acceptable material, such as appropriate for p-type NSFETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the region 50N and the region 50P, upper surfaces of the epitaxial source/drain regions 92 have facets which expand laterally outward beyond sidewalls of the fins 55. In some embodiments, these facets cause adjacent epitaxial source/drain regions 92 of a same FinFET to merge as illustrated by FIG. 10A. In some embodiments, adjacent epitaxial source/drain regions 92 remain separated after the epitaxy process is completed as illustrated by FIG. 10C. In the embodiments illustrated in FIGS. 10A and 10C, the first spacers 81 may be formed covering portions of the sidewalls of the fins 55 that extend above the STI regions 58 thereby blocking the epitaxial growth. In some embodiments, the spacer etch used to form the first spacers 81 may be adjusted to remove the spacer material to allow the epitaxially grown region to extend to the surface of the STI region 58.

Figure 11B:
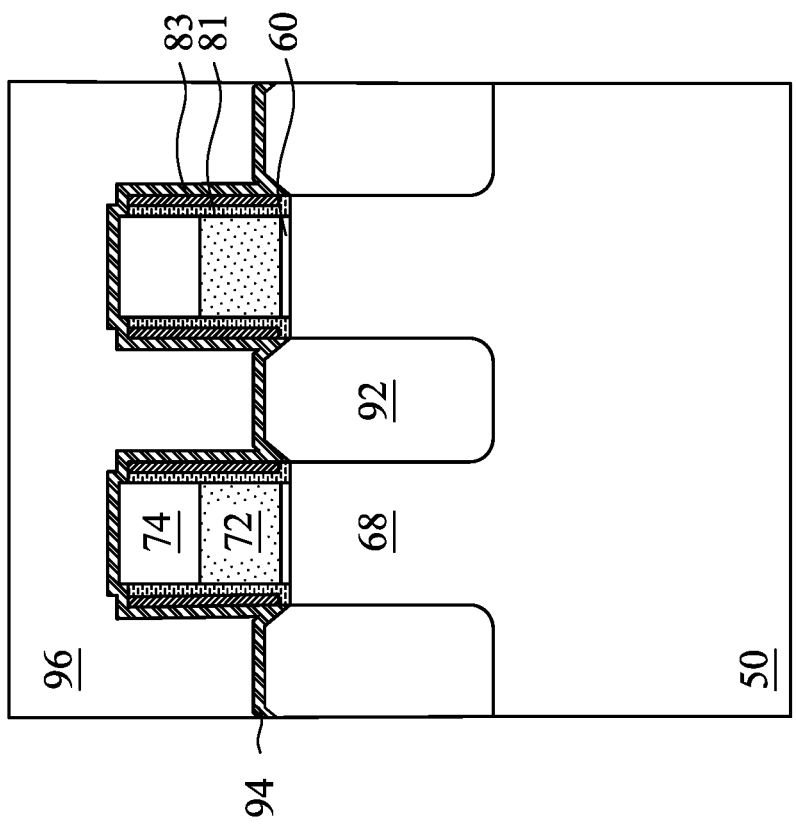
Figure 11A:
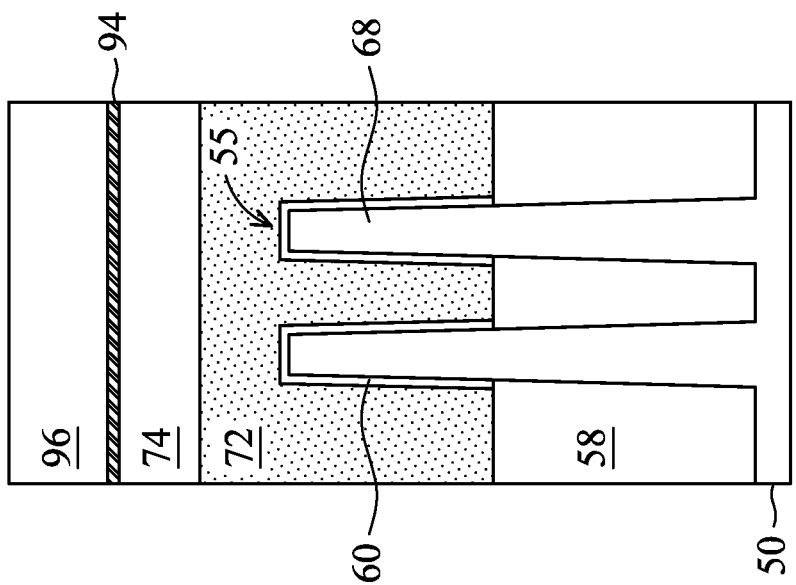

In FIGS. 11A and 11B, a first interlayer dielectric (ILD) 96 is deposited over the structure illustrated in FIGS. 6A and 10B (the processes of FIGS. 7A-10C do not alter the cross-section illustrated in FIG. 6A, which illustrates the dummy gates 72 and the multi-layer stack 56 protected by the dummy gates 72), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 12B:
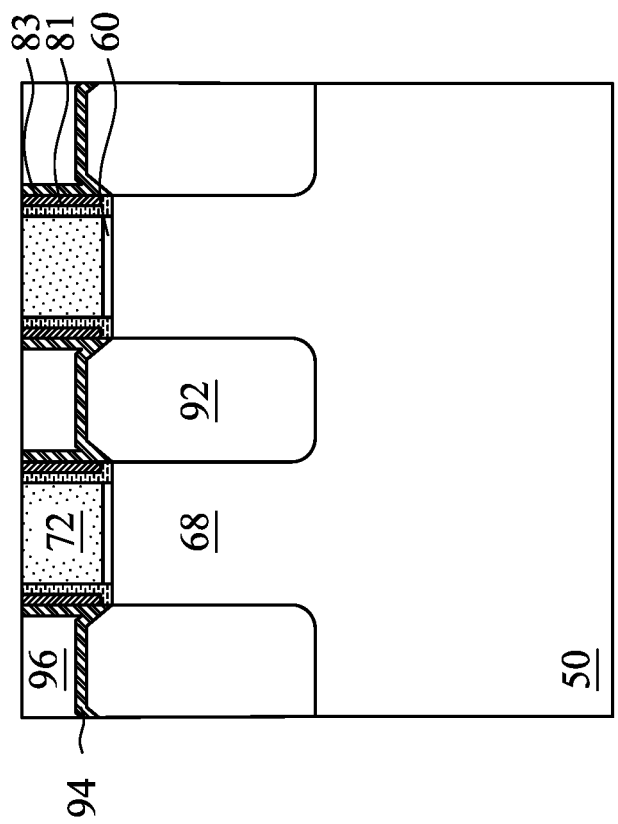
Figure 12A:
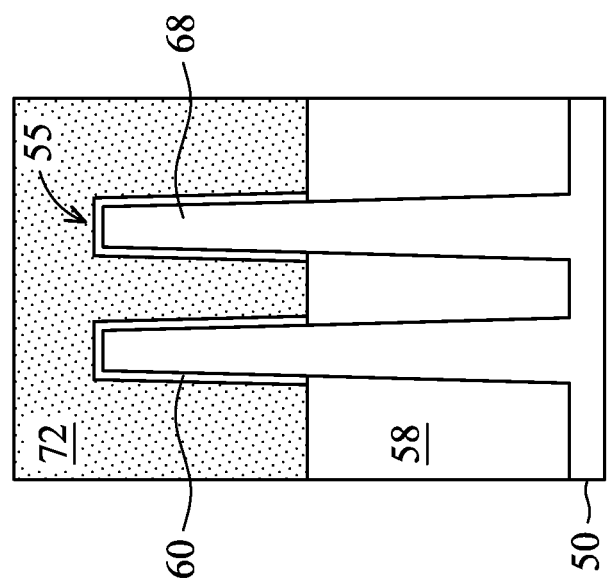

In FIGS. 12A and 12B, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figure 13B:
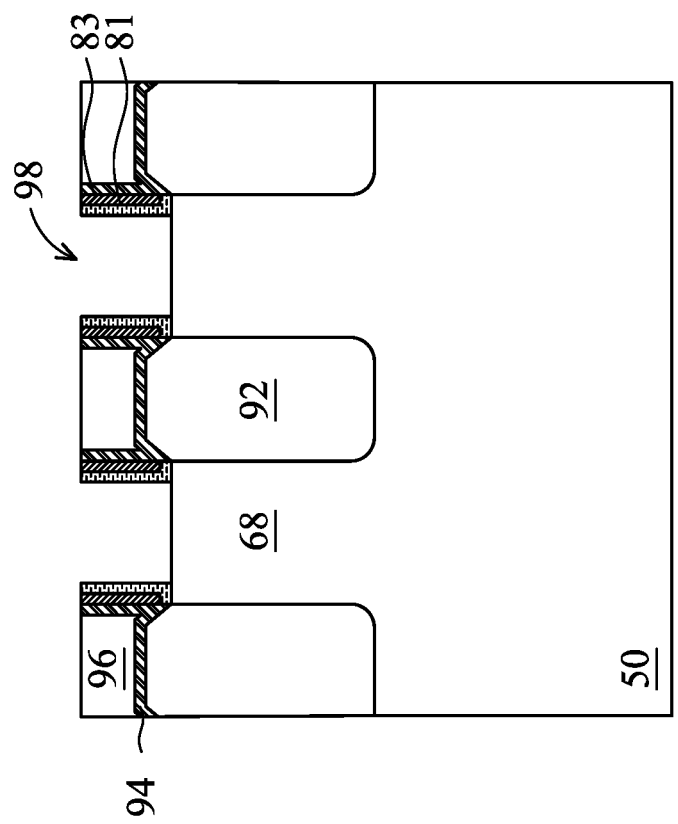
Figure 13A:
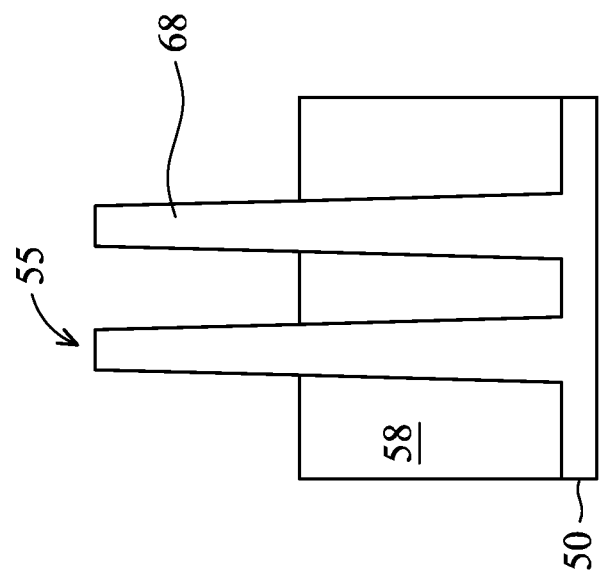

In FIGS. 13A and 13B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies a channel region 68 of a respective fin 55. Each channel region 68 is disposed between neighboring pairs of the epitaxial source/drain regions 92. During the removal, the dummy dielectric layer 60 may be used as an etch stop layer when the dummy gates 72 are etched. The dummy dielectric layer 60 may then be optionally removed after the removal of the dummy gates 72.

Figure 13C:
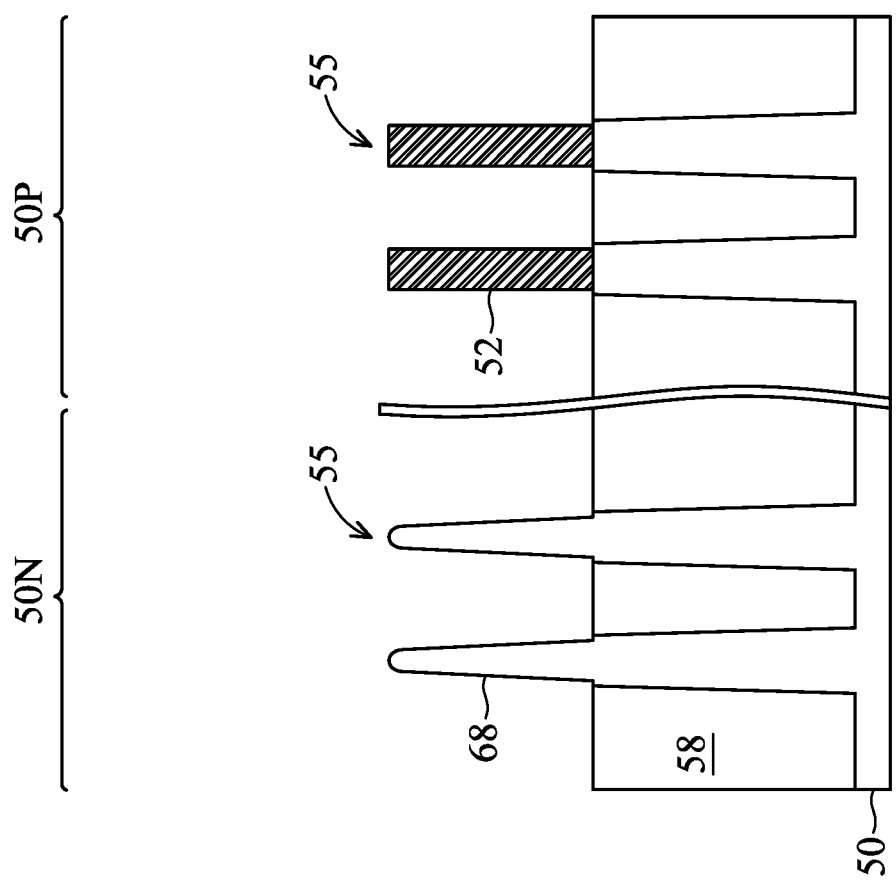
Figure 13E:
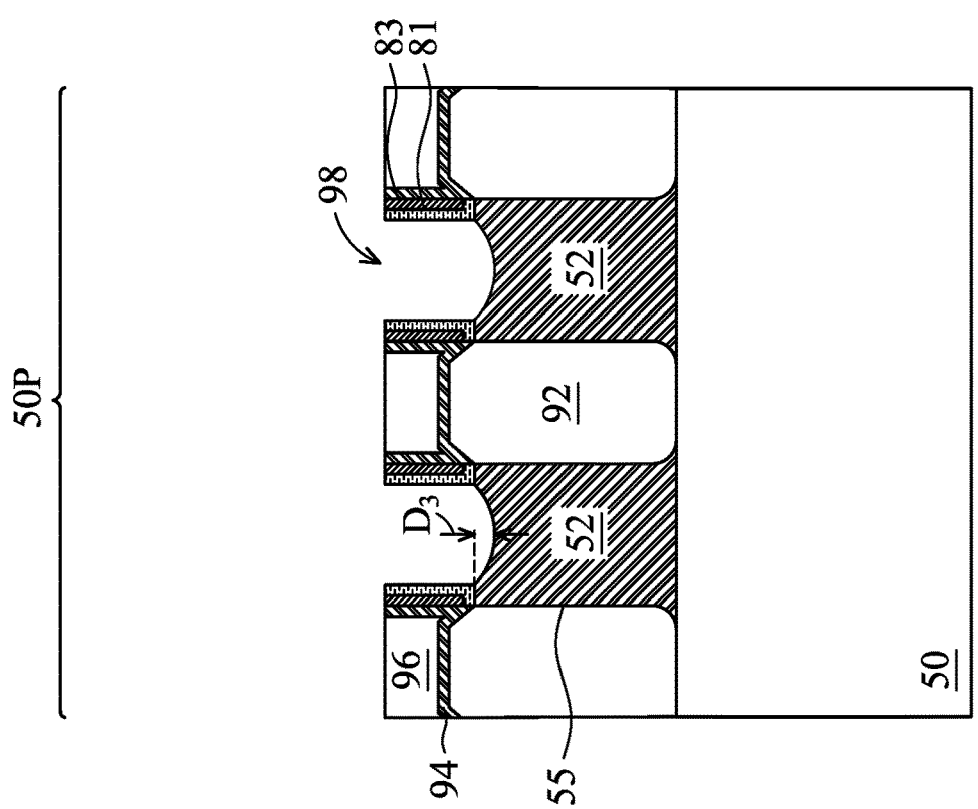
Figure 13D:
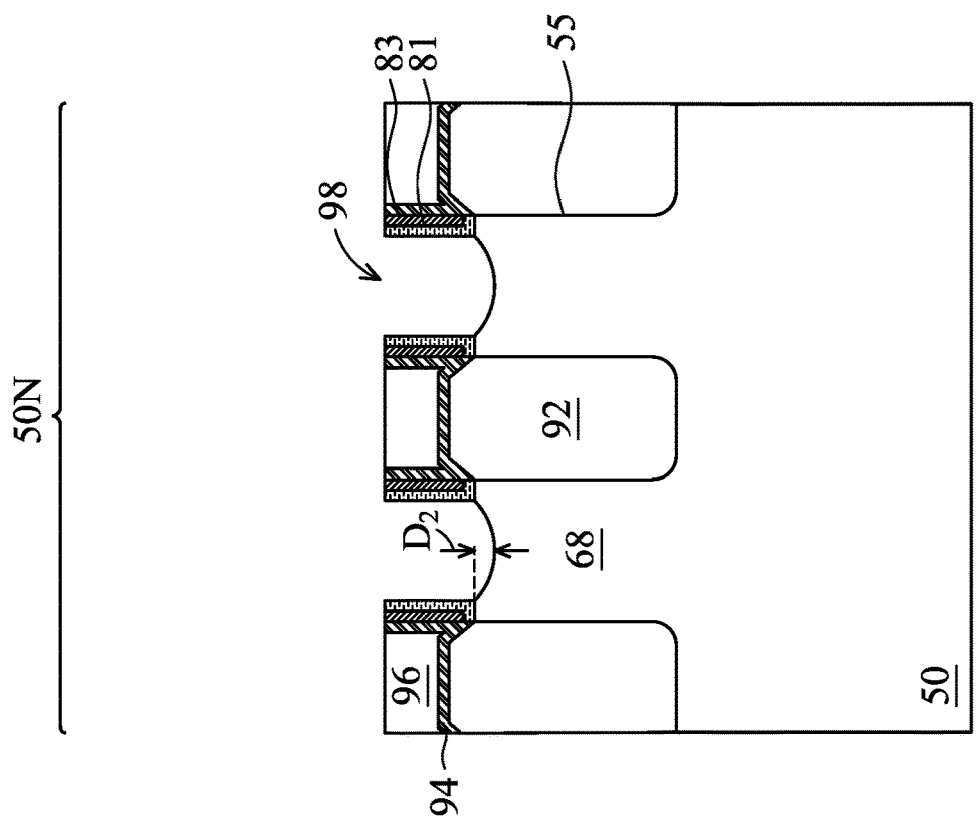

FIGS. 13C through 13E illustrate an embodiment in which the thinning process is performed to thin the fins 55 after removing the dummy gate stacks, rather than being performed after forming the fins 55 and before forming the STI regions 58, as discussed above in reference to FIGS. 3B and 3C, or after forming the STI regions 58, as discussed above in reference to FIG. 4B. In the embodiment illustrated in FIGS. 13C through 13E, the fins 55 in the region 50N may be exposed to etchants used to thin the fins 55 in the region 50P and the fins 55 in the region 50P may be exposed to etchants used to thin the fins 55 in the region 50N.

In the embodiment illustrated in FIGS. 13C through 13E, the fins 55 in both the region 50N and the region 50P are exposed to the first etching chemicals and the second etching chemicals in processes the same as or similar to those described above with respect to FIG. 3B. Following the first etching process, the fins 55 in the region 50N may have the same dimensions as the fins 55 in the region 50N discussed above with respect to FIG. 4B. Following the second etching process, portions of the fins 55 in the region 50P formed of the first epitaxial semiconductor material 52 may have the same dimensions as the portions of the fins 55 in the region 50P formed of the first epitaxial semiconductor material 52 as discussed above with respect to FIG. 4B.

As illustrated in FIGS. 13D and 13E, the thinning of the fins 55 may recess exposed portions of top surfaces of the fins 55 between the second spacers 83. In FIG. 13D, a recess is formed in a top portion of the fin 55 formed of the substrate 50 in the region 50N. In FIG. 13E, a recess is formed in a top portion of the fin 55 formed of the first epitaxial semiconductor material in the region 50P. Depths of the recesses may be greatest at points between the second spacers 83. The depths of the recesses may become shallower closer to the second spacer 83. The fins 55 in the region 50N may be recessed to a depth $D_2$ from about 2 nm to about 50 nm, from about 5 nm to about 15 nm, or from about 8 nm to about 12 nm below topmost surfaces of the fins 55 in the region 50N. The fins 55 in the region 50P may be recessed to a depth $D_3$ from about 2 nm to about 50 nm, from about 5 nm to about 15 nm, or from about 8 nm to about 12 nm below topmost surfaces of the fins 55 in the region 50P.

Forming the fins 55 in the region 50P having a gradient germanium concentration and thinning the fins 55 in the region 50P using an etching process which has a higher etching rate with increasing germanium concentration results in the fins 55 in the region 50P having more rectangular profiles and improves control of the process used to etch the fins 55 in the region 50P. Including the fins 55 in FinFETs results in better gate control, reduced fin-width variation, and decreased DIBL.

Figures 14A, 14B, 14C:
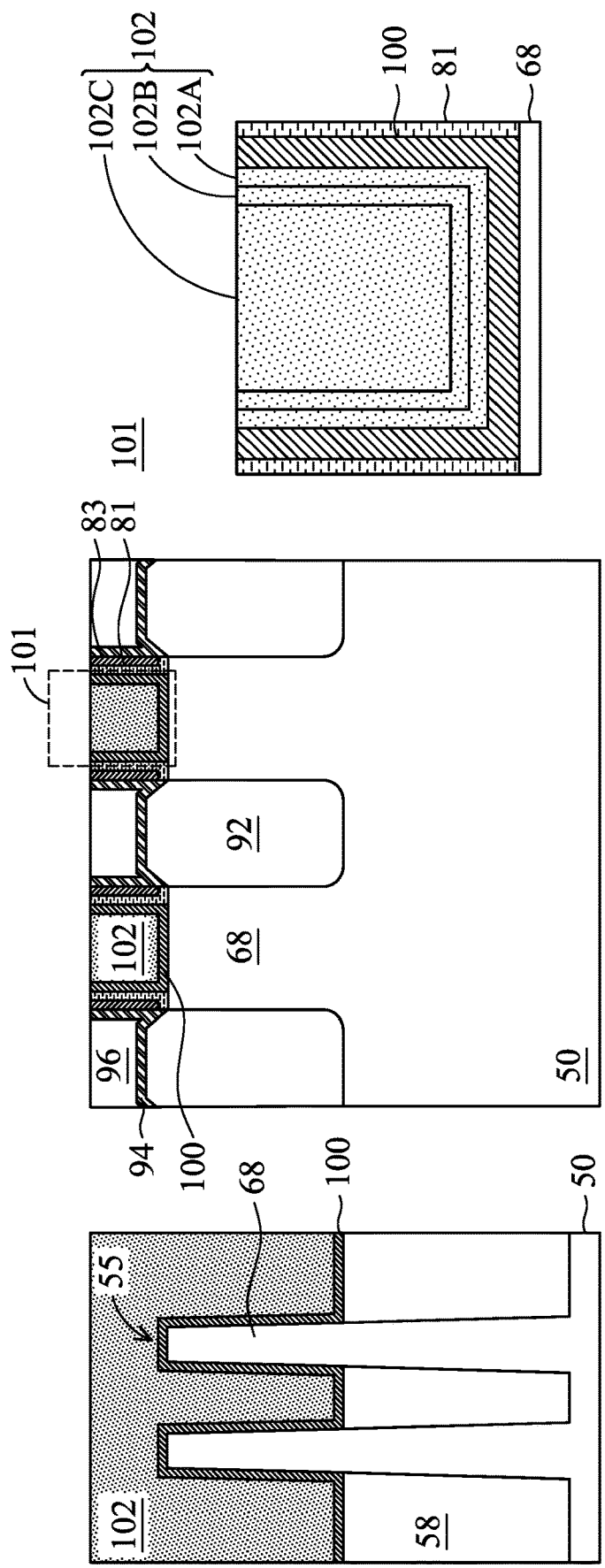

FIGS. 14A through 14C illustrate an embodiment in which the fins 55 are not thinned after removing the dummy gate stacks. In FIGS. 14A and 14B, gate dielectric layers 100 and gate electrodes 102 are formed for replacement gates. FIG. 14C illustrates a detailed view of region 101 of FIG. 14B. The gate dielectric layers 100 are deposited conformally in the second recesses 98, such as on top surfaces and sidewalls of the fins 55 and the first spacers 81 and on top surfaces of the STI regions 58, the first ILD 96, the second spacers 83, and the CESL 94. In accordance with some embodiments, the gate dielectric layers 100 comprise silicon oxide, silicon nitride, or multilayers thereof. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The formation methods of the gate dielectric layers 100 may include molecular-beam deposition (MBD), ALD, PECVD, or the like. In embodiments where portions of the dummy dielectric layers 60 remain in the second recesses 98, the gate dielectric layers 100 include a material of the dummy dielectric layers 60 (e.g., $SiO_2$).

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 102 is illustrated in FIG. 14B, the gate electrode 102 may comprise any number of liner layers 102A, any number of work function tuning layers 102B, and a fill material 102C as illustrated by FIG. 14C. After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gates of the resulting FinFETs. The gate electrodes 102 and the gate dielectric layers 100 may be collectively referred to as "gate stacks." The gate and the gate stacks may extend along sidewalls of the channel regions 68 of the fins 55.

The formation of the gate dielectric layers 100 in the region 50N and the region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials, and/or the gate electrodes 102 in each region may be formed by distinct processes, such that the gate electrodes 102 may be different materials. Various masking steps may be used to mask and expose appropriate regions when using distinct processes.

Figure 15B:
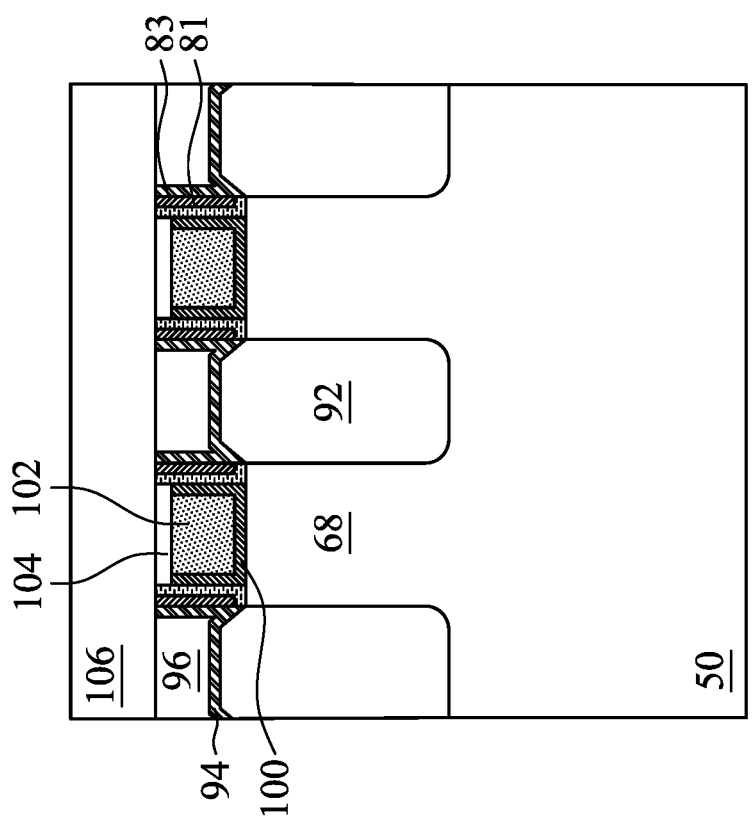
Figure 15A:
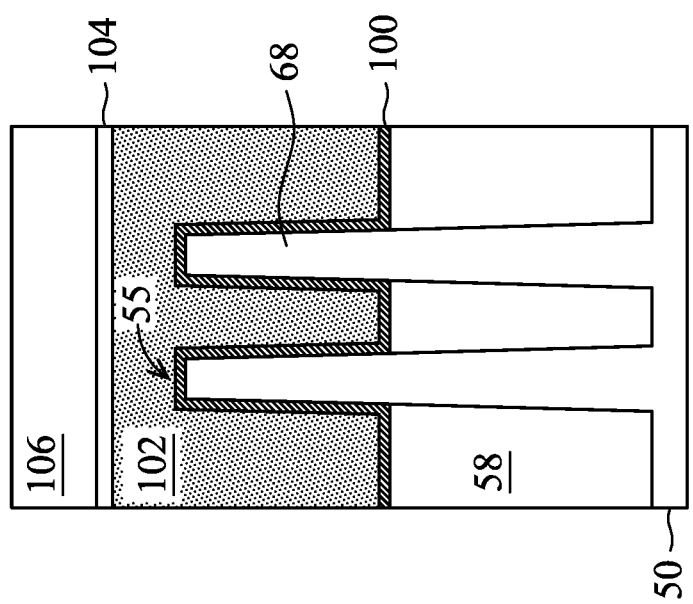

In FIGS. 15A and 15B, a second ILD 106 is deposited over the first ILD 96. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In some embodiments, before the formation of the second ILD 106, the gate stack (including the gate dielectric layers 100 and the corresponding overlying gate electrodes 102) is recessed, so that a recess is formed directly over the gate stack and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 112, discussed below with respect to FIGS. 16A and 16B) penetrate through the gate mask 104 to contact the top surface of the recessed gate electrodes 102.

Figure 16B:
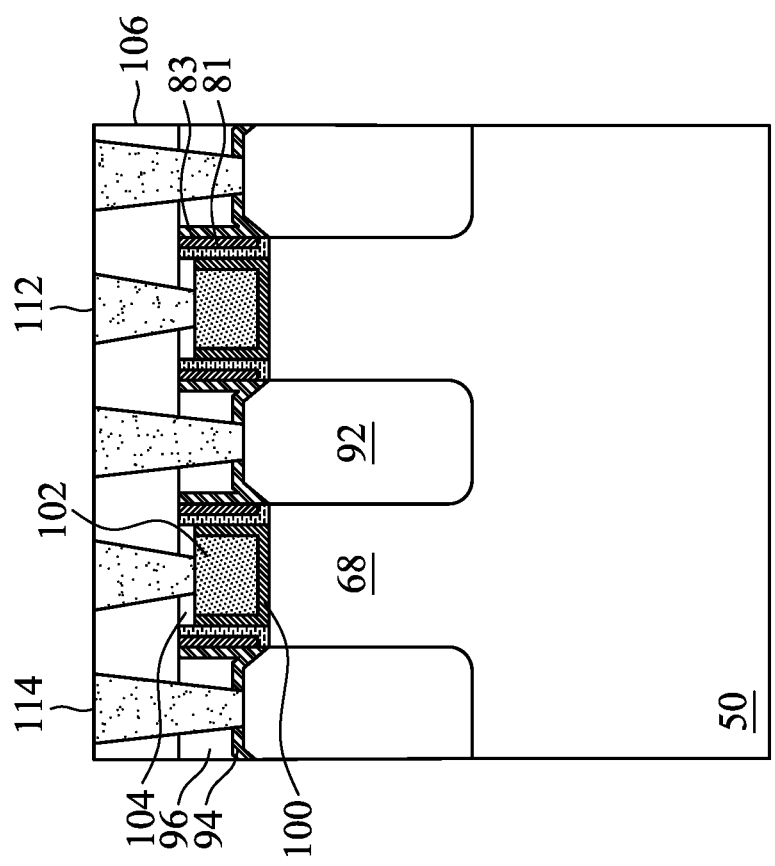
Figure 16A:
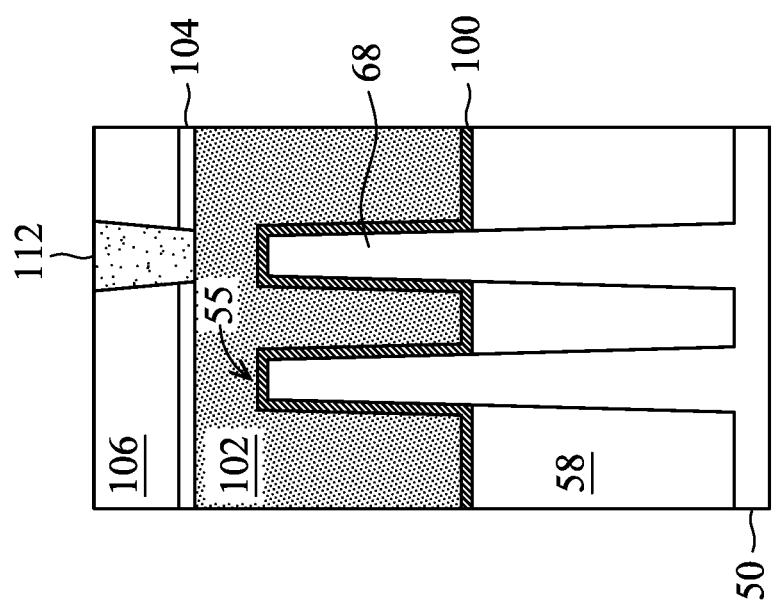

In FIGS. 16A and 16B, gate contacts 112 and source/drain contacts 114 are formed through the second ILD 106 and the first ILD 96. Openings for the source/drain contacts 114 are formed through the first ILD 96 and the second ILD 106 and openings for the gate contacts 112 are formed through the second ILD 106 and the gate mask 104. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the source/drain contacts 114 and the gate contacts 112 in the openings. An anneal process may be performed to form a silicide at the interface between the epitaxial source/drain regions 92 and the source/drain contacts 114. The source/drain contacts 114 are physically and electrically coupled to the epitaxial source/drain regions 92, and the gate contacts 112 are physically and electrically coupled to the gate electrodes 102. The source/drain contacts 114 and the gate contacts 112 may be formed in different processes, or may be formed in the same process. Although shown as being formed in the same cross-sections, it should be appreciated that each of the source/drain contacts 114 and the gate contacts 112 may be formed in different cross-sections, which may avoid shorting of the contacts.

Figure 16D:
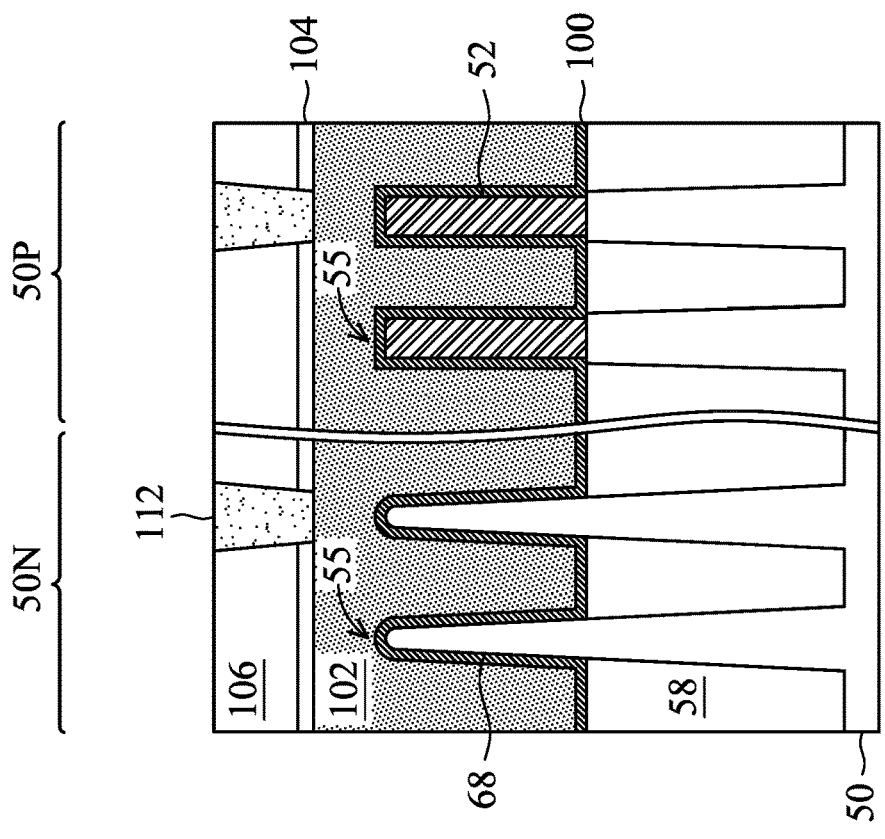
Figure 16C:
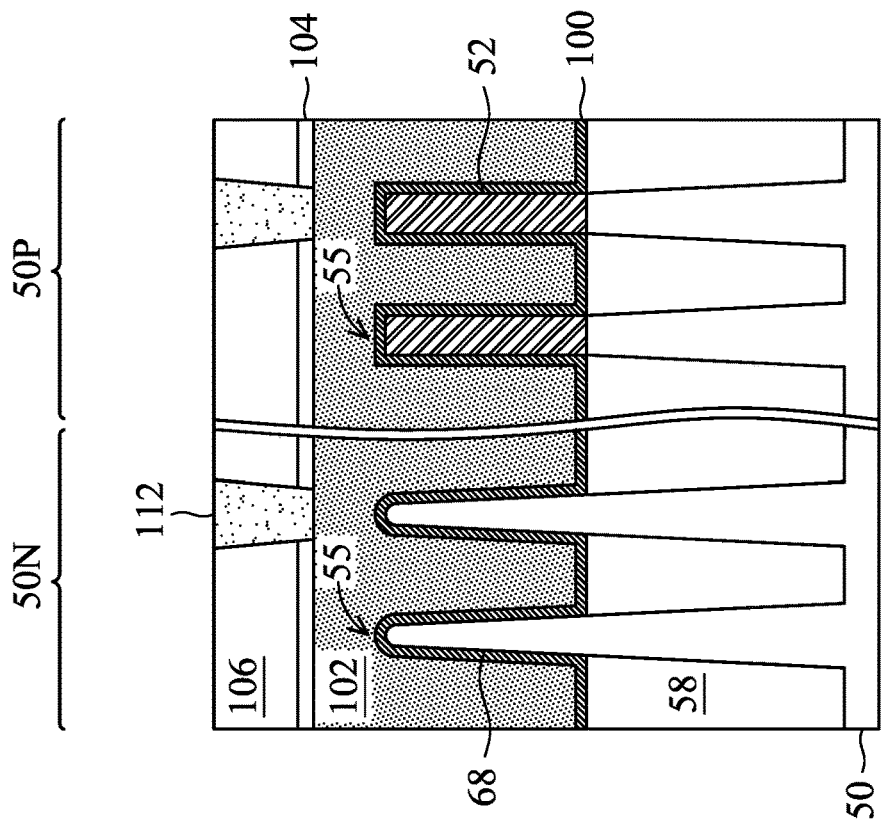
Figure 16E:
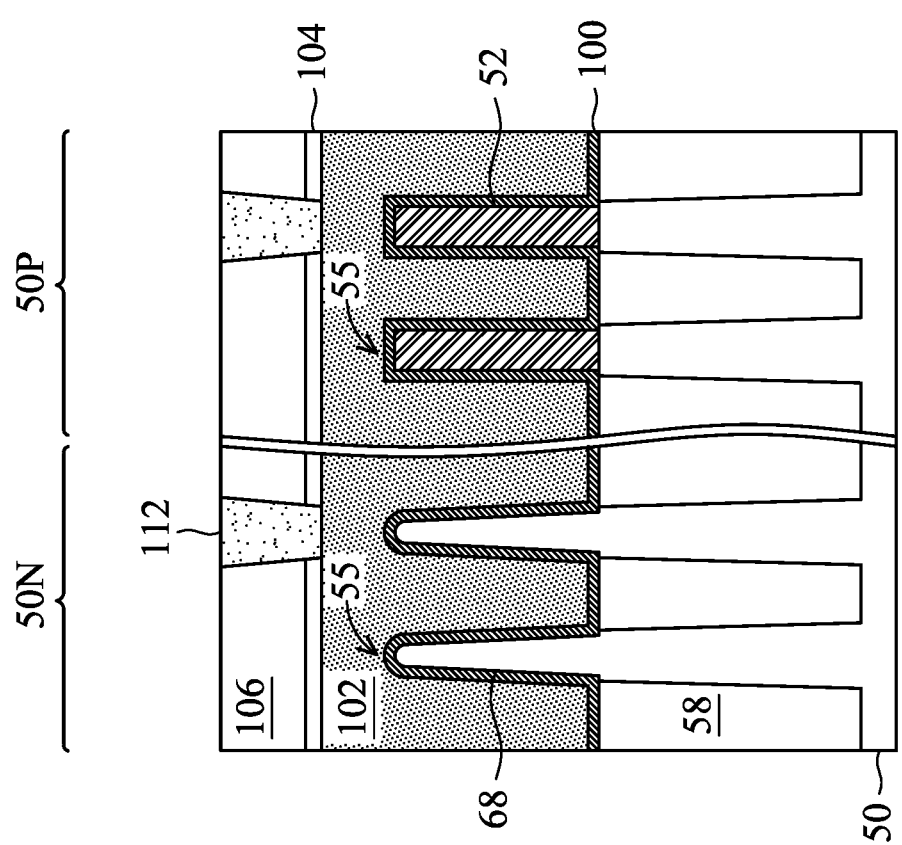

FIGS. 16C through 16E illustrate the structures of FIGS. 16A and 16B in embodiments in which the fins 55 are thinned at various stages. FIG. 16C illustrates the embodiment of FIG. 3B, wherein the fins 55 are thinned simultaneously before forming the STI regions 58. Portions of the fins 55 in the region 50N formed above and below top surfaces of the STI regions 58 may have continuous sidewalls which are angled at the same angles with respect to a major surface of the substrate 50. Portions of the fins 55 in the region 50P formed above and below top surfaces of the STI regions 58 may have sidewalls which are angled at different angles with respect to a major surface of the substrate 50. For example, as illustrated in FIG. 16C, sidewalls of the portion of the fins 55 in the region 50P above the top surfaces of the STI regions 58 and formed of the first epitaxial semiconductor material 52 may be more vertical than sidewalls of the portion of the fins 55 in the region 50P below the top surfaces of the STI regions 58 and formed in the substrate 50.

FIG. 16D illustrates the embodiment of FIG. 3C, wherein the fins 55 in the region 50P are masked while thinning the fins 55 in the region 50N and the fins 55 in the region 50N are masked while thinning the fins 55 in the region 50P. Portions of the fins 55 in the region 50N formed above and below top surfaces of the STI regions 58 may have continuous sidewalls which are angled at a same angle with respect to a major surface of the substrate 50. Portions of the fins 55 in the region 50P formed in the first epitaxial semiconductor material 52 and formed in the substrate 50 may have sidewalls which are angled at different angles with respect to a major surface of the substrate 50 and which have a step difference in widths. For example, as illustrated in FIG. 16D, sidewalls of the portions of the fins 55 in the region 50P formed in the first epitaxial semiconductor material 52 may be more vertical than sidewalls of the portions of the fins 55 in the region 50P formed in the substrate 50. Moreover, there may be a step difference between widths of the portions of the fins 55 formed in the first epitaxial semiconductor material 52 and the portions of the fins 55 formed in the substrate 50, with the portions of the fins 55 formed in the first epitaxial semiconductor material 52 having widths less than widths of the portions of the fins 55 formed in the substrate 50.

FIG. 16E illustrates the embodiment of FIG. 4B or 13C through 13E, wherein the fins 55 are thinned after forming the STI regions 58 or after removing the dummy gate stacks. Portions of the fins 55 in the region 50N formed above and below top surfaces of the STI regions 58 may have sidewalls which are angled at different angles with respect to a major surface of the substrate 50, and which have a step difference in widths. For example, as illustrated in FIG. 16E, sidewalls of the portions of the fins 55 in the region 50N formed below the top surfaces of the STI regions 58 may be more vertical than sidewalls of the portions of the fins 55 in the region 50N formed above the top surfaces of the STI regions 58. Moreover, there may be a step difference between widths of the portions of the fins 55 formed below the top surfaces of the STI regions 58 and the portions of the fins 55 formed above the top surfaces of the STI regions 58, with the portions of the fins 55 formed below the top surfaces of the STI regions 58 having widths greater than widths of the portions of the fins 55 formed above the top surfaces of the STI regions 58.

Portions of the fins 55 in the region 50P formed above and below the top surfaces of the STI regions 58 may have sidewalls which are angled at different angles with respect to a major surface of the substrate 50, and which have a step difference in widths. For example, as illustrated in FIG. 16E, sidewalls of the portions of the fins 55 in the region 50P formed above the top surfaces of the STI regions 58 (e.g., portions of the fins 55 formed in the first epitaxial semiconductor material 52) may be more vertical than sidewalls of the portions of the fins 55 in the region 50P formed below the top surfaces of the STI regions 58 (e.g., portions of the fins 55 formed in the substrate 50). Moreover, there may be a step difference between widths of the portions of the fins 55 formed below the top surfaces of the STI regions 58 and the portions of the fins 55 formed above the top surfaces of the STI regions 58, with the portions of the fins 55 formed below the top surfaces of the STI regions 58 having widths greater than widths of the portions of the fins 55 formed above the top surfaces of the STI regions 58.

As discussed above, forming the fins 55 in the region 50P having a gradient germanium concentration and thinning the fins 55 in the region 50P using an etching process which has a higher etching rate with increasing germanium concentration results in the fins 55 in the region 50P having more rectangular profiles and improves control of the process used to etch the fins 55 in the region 50P. Including the fins 55 in FinFETs results in better gate control, reduced fin-width variation, and decreased DIBL.

Figure 17:
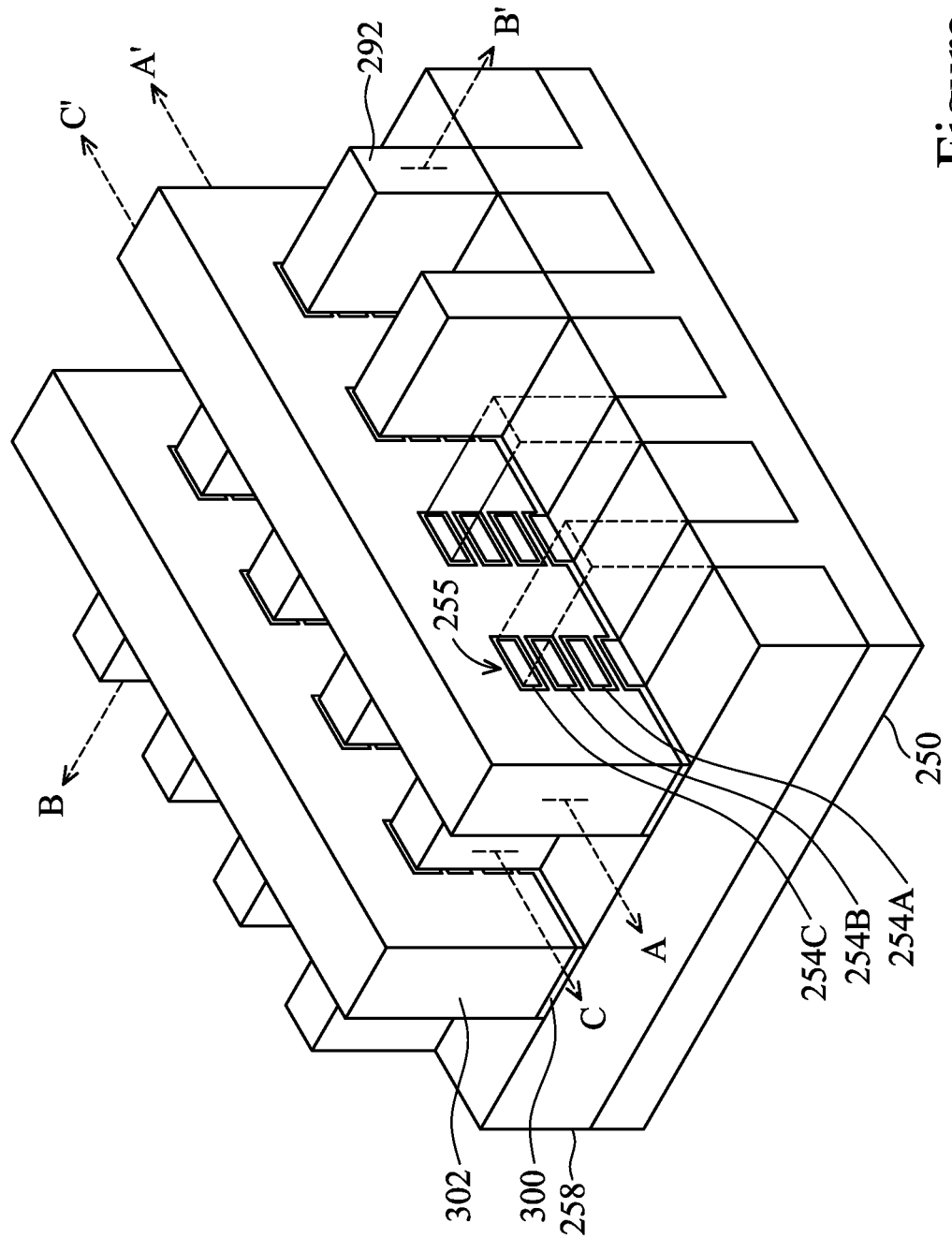
FIG. 17 illustrates an example of a semiconductor device including nanostructure field-effect transistors (NSFETs) in a three-dimensional view, in accordance with some embodiments.

FIG. 17 illustrates an example of nanostructure (e.g., nanosheet, nanowire, gate-all-around, or the like) field effect transistors (NSFETs), in accordance with some embodiments. The NSFETs comprise nanostructures 255 over a substrate 250 (e.g., a semiconductor substrate). The nanostructures 255 include second semiconductor layers 254A-254C, which act as channel regions of the nanostructures 255. Shallow trench isolation (STI) regions 258 are disposed in the substrate 250, and the nanostructures 255 are disposed above and between neighboring STI regions 258. Although the STI regions 258 are described/illustrated as being separate from the substrate 250, as used herein, the term "substrate" may refer to the semiconductor substrate alone or a combination of the semiconductor substrate and the STI regions.

Gate dielectric layers 300 are along top surfaces, sidewalls, and bottom surfaces of the nanostructures 255, such as on top surfaces, sidewalls, and bottom surfaces of each of the second semiconductor layers 254A-254C, and along top surfaces and sidewalls of portions of the substrate 250. Gate electrodes 302 are over the gate dielectric layers 300. Epitaxial source/drain regions 292 are disposed on opposite sides of the nanostructures 255, the gate dielectric layers 300, and the gate electrodes 302. FIG. 17 further illustrates reference cross-sections that are used in later figures. Cross-section A-A' is along a longitudinal axis of a gate electrode 302 and in a direction, for example, perpendicular to the direction of current flow between the epitaxial source/drain regions 292 of the NSFETs. Cross-section B-B' is perpendicular to cross-section A-A' and is along a longitudinal axis of a nanostructure 255 and in a direction of, for example, the current flow between the epitaxial source/drain regions 292 of the NSFETs. Cross-section C-C' is parallel to cross-section A-A' and extends through the epitaxial source/drain regions 292 of the NSFETs. Subsequent figures refer to these reference cross-sections for clarity.

FIGS. 18 through 35D are cross-sectional views of intermediate stages in the manufacturing of NSFETs, in accordance with some embodiments. FIGS. 18, 19A, 19B, 20A, 20B, 21, 31D, 35C, and 35D illustrate reference cross-section A-A' illustrated in FIG. 17, including a region 250N and a region 250P. FIGS. 22A, 29A, 30A, 31A, 32A, 32C, 33A, 33C, 33E, 34A, and 35A are illustrated along reference cross-section A-A' illustrated in FIG. 17 in the region 250N or the region 250P. FIGS. 22B, 23B, 24B, 25B, 26B, 26C, 27B, 27C, 28B, 28C, 29B, 29C, 30B, 30C, 31B, 31C, 31E, 32B, 32D, 33B, 33D, 33F, 34B, and 35B are illustrated along a similar cross-section B-B' illustrated in FIG. 17. FIGS. 23A, 24A, 25A, 26A, 27A, 28A, and 28D are illustrated along reference cross-section C-C' illustrated in FIG. 17.

Figure 18:
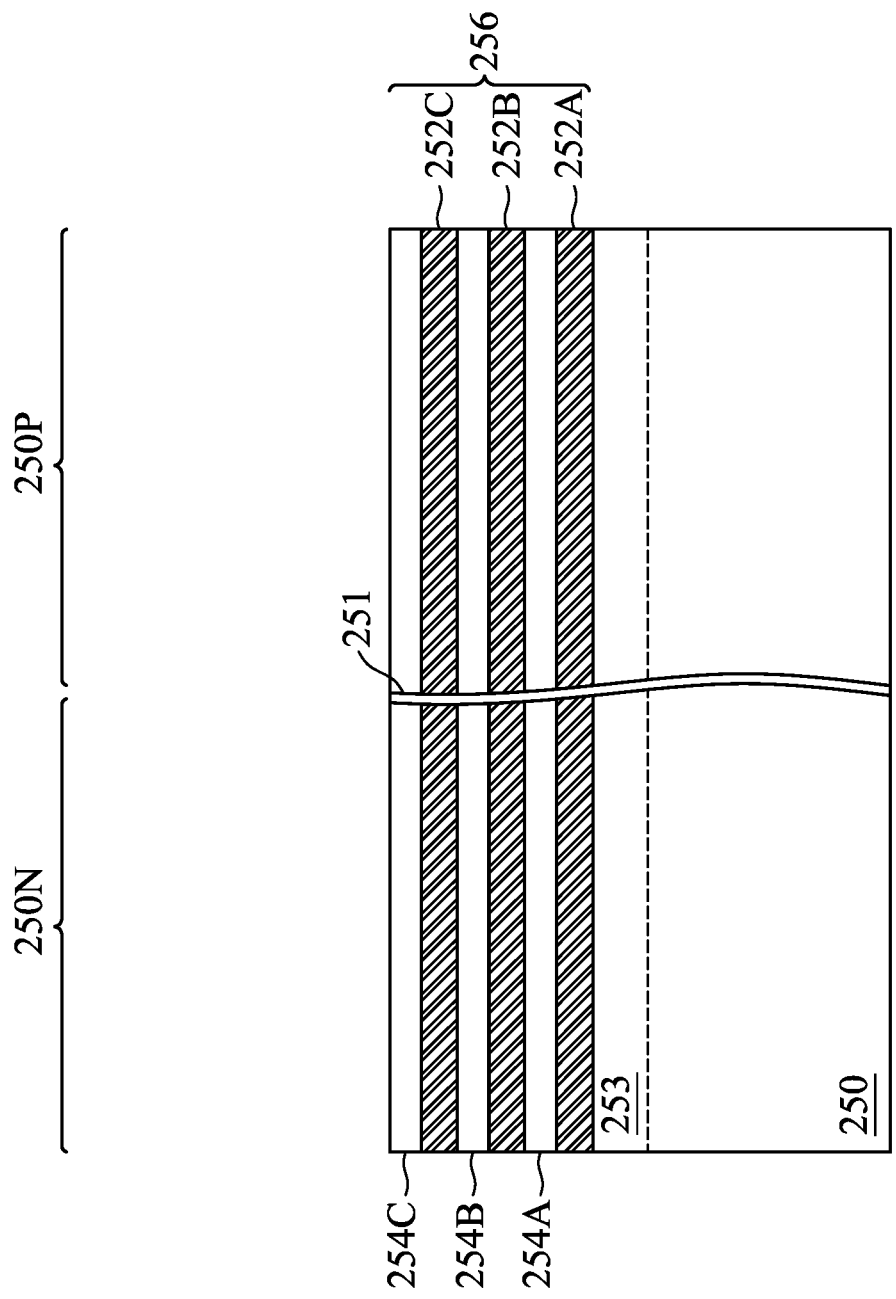
Figure 19:
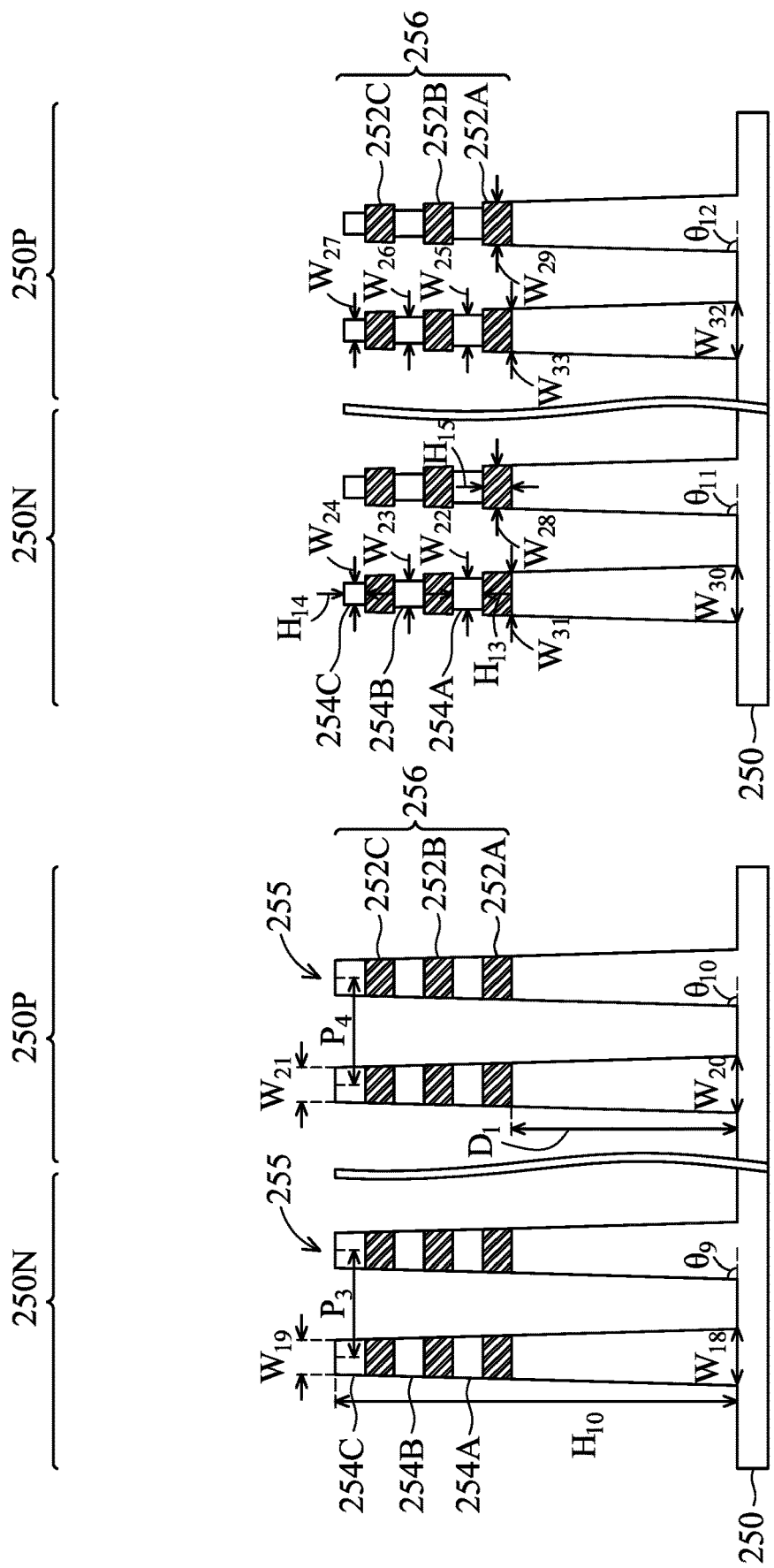
Figure 20:
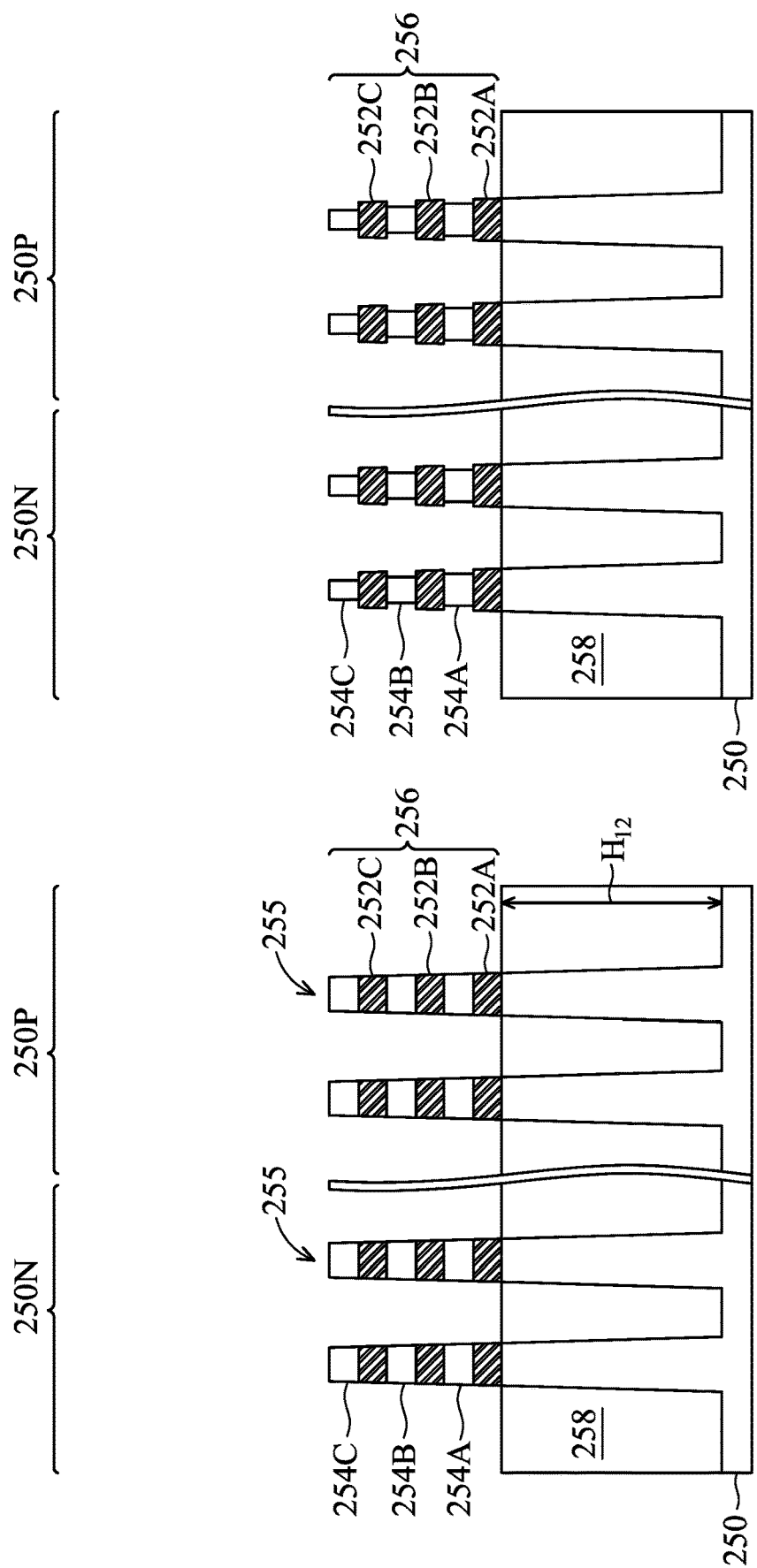

In FIG. 18, a substrate 250 is provided for forming NSFETs. The substrate 250 may be a semiconductor substrate, such as a bulk semiconductor, a semiconductor-on-insulator (SOI) substrate, or the like, which may be doped (e.g., with a p-type or an n-type dopant) or undoped. The substrate 250 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 250 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 250 has a region 250N and a region 250P. The region 250N can be for forming n-type devices, such as NMOS transistors, e.g., n-type NSFETs. The region 250P can be for forming p-type devices, such as PMOS transistors, e.g., p-type NSFETs. The region 250N may be physically separated from the region 250P (as illustrated by divider 251), and any number of device features (e.g., other active devices, doped regions, isolation structures, etc.) may be disposed between the region 250N and the region 250P.

The substrate 250 may be lightly doped with a p-type or an n-type impurity. An anti-punch-through (APT) implantation may be performed on an upper portion of the substrate 250 to form an APT region 253. During the APT implantation, dopants may be implanted in the region 250N and the region 250P. The dopants may have a conductivity type opposite a conductivity type of source/drain regions (such as the epitaxial source/drain regions 292, discussed below with respect to FIGS. 28A-28D) to be formed in each of the region 250N and the region 250P. The APT region 253 may extend under the subsequently formed source/drain regions in the resulting NSFETs, which will be formed in subsequent processes. The APT region 253 may be used to reduce the leakage from the source/drain regions to the substrate 250. In some embodiments, the doping concentration in APT region 253 may be from about $1 \times 10^{18}$ atoms/cm$^3$ to about $1 \times 10^{19}$ atoms/cm$^3$. For simplicity and legibility, the APT region 253 is not illustrated in subsequent drawings.

Further in FIG. 18, a multi-layer stack 256 is formed over the substrate 250. The multi-layer stack 256 includes alternating first semiconductor layers 252 and second semiconductor layers 254 of different semiconductor materials. The first semiconductor layers 252 may be formed of first semiconductor materials, which may include, for example, silicon germanium (SiGe) or the like. The second semiconductor layers 254 may be formed of second semiconductor materials, which may include, for example, silicon (Si), silicon carbon (SiC), or the like. In some embodiments, the first semiconductor layers 252 may be formed of the second semiconductor materials and the second semiconductor layers 254 may be formed of the first semiconductor materials. For purposes of illustration, the multi-layer stack 256 includes three of the first semiconductor layers 252 (e.g., first semiconductor layers 252A-252C) and three of the second semiconductor layers 254 (e.g., second semiconductor layers 254A-254C). In some embodiments, the multi-layer stack 256 may include any number of the first semiconductor layers 252 and the second semiconductor layers 254. Each of the layers of the multi-layer stack 256 may be epitaxially grown using a process such as chemical vapor deposition (CVD), atomic layer deposition (ALD), vapor phase epitaxy (VPE), molecular beam epitaxy (MBE), or the like. Each of the first semiconductor layers 252A-252C may have a thickness from about 2 nm to about 50 nm, from about 15 nm to about 25 nm, or from about 18 nm to about 22 nm. Each of the second semiconductor layers 254A-254C may have a thickness from about 2 nm to about 50 nm, from about 15 nm to about 25 nm, or from about 18 nm to about 22 nm.

The first semiconductor layers 252A-252C may be formed with gradient germanium concentrations. For example, in some embodiments, a germanium concentration of each of the first semiconductor layers 252A-252C may be gradually and continuously decreased from a bottom surface of the layer to a top surface of the layer. An atomic percentage of germanium in the first semiconductor layer 252A may range from about 90 percent at a bottom surface of the first semiconductor layer 252A to about 40 percent at a top surface of the first semiconductor layer 252A, from about 32 percent at the bottom surface of the first semiconductor layer 252A to about 15 percent at the top surface of the first semiconductor layer 252A, or the like. An atomic percentage of germanium in the first semiconductor layer 252B may range from about 60 percent at a bottom surface of the first semiconductor layer 252B to about 20 percent at a top surface of the first semiconductor layer 252B, from about 25 percent at the bottom surface of the first semiconductor layer 252B to about 8 percent at the top surface of the first semiconductor layer 252B, or the like. An atomic percentage of germanium in the first semiconductor layer 252C may range from about 50 percent at a bottom surface of the first semiconductor layer 252C to about 0 percent at a top surface of the first semiconductor layer 252C, from about 20 percent at the bottom surface of the first semiconductor layer 252C to about 8 percent at the top surface of the first semiconductor layer 252C, or the like.

In some embodiments, a ratio of the atomic percentage of germanium at the top surface of the each of the first semiconductor layers 252A-252C to the atomic percentage of germanium at the bottom surface of each of the first semiconductor layers 252A-252C may range from about 1:1 to about 1:4 or from about 1:2 to about 1:3. A ratio of the atomic percentage of germanium at the top surface of the first semiconductor layer 252C to the atomic percentage of germanium at the bottom surface of the first semiconductor layer 252A may range from about 1:2 to about 1:8 or from about 1:3 to about 1:5. As will be discussed in greater detail below, including the first semiconductor layers 252A-252C with the prescribed ratios of atomic percentages of germanium results in nanostructures (such as the nanostructures 255, discussed below with respect to FIGS. 19A through 20B) having improved rectangular profiles, which results in better gate control, reduced nanostructure-width variation, and decreased drain induced barrier loading.

In embodiments in which the first semiconductor layers 252A-252C are deposited by CVD, the gradient germanium concentrations in the first semiconductor layers 252A-252C may be achieved by gradually decreasing a flowrate of a germanium-containing precursor (e.g., germane ($GeH_4$) or the like) relative to a flowrate of a silicon-containing precursor (e.g., dichlorosilane ($H_2Cl_2Si$), silane ($SiH_4$), or the like) during the deposition of each of the first semiconductor layers 252A-252C. For example, a ratio of a flowrate of a germanium precursor to a flowrate of a silicon precursor may be from about 1 to about 9 or from about 1 to about 3 at the beginning of the deposition process used to deposit the first semiconductor layer 252A and a ratio of the flowrate of the germanium precursor to the flowrate of the silicon precursor may be from about 0 to about 1 or from about 0 to about 0.5 at the end of the deposition process used to deposit the first semiconductor layer 252C.

For purposes of illustration, the second semiconductor layers 254 will be described as forming channel regions in the region 250N and the first semiconductor layers 252 will be described as forming channel regions in the region 250P in completed NSFET devices. The first semiconductor layers 252 may be sacrificial layers in the region 250N and the second semiconductor layers 254 may be sacrificial layers in the region 250P, which may be subsequently removed. In some embodiments, the first semiconductor layers 252 may form channel regions in the region 250N and the region 250P and the second semiconductor layers 254 may be sacrificial layers. In some embodiments, the second semiconductor layers 254 may form channel regions in the region 250N and the region 250P and the first semiconductor layers 252 may be sacrificial layers.

In FIG. 19A, nanostructures 255 are formed in the multi-layer stack 256 and the substrate 250 is etched. In some embodiments, the nanostructures 255 may be formed by etching trenches in the multi-layer stack 256 and the substrate 250. The etching may be any acceptable etch process, such as a reactive ion etch (RIE), neutral beam etch (NBE), the like, or a combination thereof. The etching may be anisotropic.

The nanostructures 255 and the substrate 250 may be patterned by any suitable method. For example, the nanostructures 255 and the substrate 250 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures 255 and the substrate 250. In some embodiments, a mask (or other layer) may remain on the nanostructures 255 after patterning the nanostructures 255 and the substrate 250. As illustrated in FIG. 19A, the nanostructures 255 in both the region 250N and the region 250P may have tapered profiles in which widths at the bottoms of the nanostructures 255 are greater than widths at the top of the nanostructures 255.

In the region 250N, the nanostructures 255 may have a bottom width $W_{18}$ from about 2.2 nm to about 100 nm, from about 25 nm to about 35 nm, or from about 28 nm to about 32 nm; a top width $W_{19}$ from about 2 nm to about 50 nm, from about 20 nm to about 30 nm, or from about 23 nm to about 27 nm; and a ratio of the top width $W_{19}$ to the bottom width $W_{18}$ from about 0.5 to about 2 or from about 0.7 to about 0.9. The nanostructures 255 in the region 250N may be spaced with a pitch $P_3$ from about 2 nm to about 50 nm or from about 15 nm to about 25 nm. An angle $\theta_9$ between sidewalls of the nanostructures 255 in the region 250N and a top surface of the substrate 250 may be from about 70° to about 85°, from about 78° to about 82°, from about 95° to about 120°, or from about 98° to about 102°. In the region 250P, the nanostructures 255 may have a bottom width $W_{20}$ from about 2.2 nm to about 100 nm, from about 25 nm to about 35 nm, or from about 28 nm to about 32 nm; a top width $W_{21}$ from about 2 nm to about 50 nm, from about 20 nm to about 30 nm, or from about 23 nm to about 27 nm; and a ratio of the top width $W_{21}$ to the bottom width $W_{20}$ from about 0.5 to about 2 or from about 0.7 to about 0.9. The nanostructures 255 in the region 250P may be spaced with a pitch $P_4$ from about 2 nm to about 50 nm or from about 15 nm to about 25 nm. An angle $\theta_{10}$ between sidewalls of the nanostructures 255 in the region 250P and a top surface of the substrate 250 may be from about 70° to about 85°, from about 78° to about 82°, from about 95° to about 120°, or from about 98° to about 102°. The nanostructures 255 in the region 250N and the region 250P may have heights $H_{10}$ from about 10 nm to about 200 nm or from about 70 nm to about 90 nm. The substrate 250 may be etched to a depth $D_1$ from about 30 nm to about 100 nm or from about 60 nm to about 70 nm below a top surface of the substrate 250.

FIG. 19B illustrates an embodiment in which a thinning process is performed to thin the nanostructures 255 after forming the nanostructures 255 and before STI regions (such as the STI regions 258, discussed below with respect to FIG. 20A). In the embodiment illustrated in FIG. 19B, the nanostructures 255 in the region 250N may be exposed to etchants used to thin the nanostructures 255 in the region 250P and the nanostructures 255 in the region 250P may be exposed to etchants used to thin the nanostructures in the region 250N.

In FIG. 19B, exposed portions of the second semiconductor layers 254A-254C in the region 250N and the region 250P may be etched using first etching chemicals in a first etching process. During the first etching process, the first semiconductor layers 252A-252C and the second semiconductor layers 254A-254C in both the region 250N and the region 250P may be exposed to the first etching chemicals. A first etching selectivity, which is the ratio of the etching rate (sometimes referred to as the trimming rate) of the second semiconductor layers 254A-254C (formed of, e.g., silicon) to the etching rate of the first semiconductor layers 252A-252C (formed of, e.g., silicon germanium), is desired to be high in order to minimize the etching of the first semiconductor layers 252A-252C. For example, the first etching selectivity may be higher than about 5, and may range from about 5 to about 20, or higher. The first etching process may be performed at a temperature ranging from about 5° C. to about 100° C., such as about room temperature (e.g. about 23° C.). The nanostructures 255 may be exposed to the first etching chemicals for a period ranging from about 10 seconds to about 5 minutes or from about 45 seconds to about 75 seconds.

In some embodiments, the first etching chemicals may include a first etchant dissolved in a first solvent. The first etching chemicals may be free from oxidants. The first etchant may include an alkaline or an acid. In embodiments in which the first etchant includes an alkaline, the first etchant may include a metal hydroxide ($M^{n+}(OH^-)_n$), amine derivatives, ammonium derivatives, combinations thereof, or the like. The metal hydroxide may include sodium hydroxide (NaOH), potassium hydroxide (KOH), lithium hydroxide (LiOH), rubidium hydroxide (RbOH), cesium hydroxide (CsOH), combinations thereof, or the like. The amine derivatives may include ammonia ($NH_3$), ammonium hydroxide ($NH_4OH$), tetramethylammonium hydroxide (TMAH, $(CH_3)_4N(OH)$), tetraethyl ammonium hydroxide (TEAH, $(C_2H_5)_4N(OH)$), trimethyltetradecylammonium hydroxide (TTAH, $(CH_3)_3(C_{14}H_{29})N(OH)$), tetrabutylammonium hydroxide (TBAH, $(C_4H_9)_4N(OH)$), combinations thereof, or the like. In embodiments in which the first etchant is an alkaline, a pH of the first etching chemicals may be from about 7 to about 13 or from about 8 to about 10. The first etchant may be present in the first etching chemicals in a concentration ranging from about 0.01 M to about 20 M or from about 0.5 M to about 1.5 M.

In embodiments in which the first etchant includes an acid, the first etchant may include hydrochloric acid (HCl), hydrofluoric acid (HF), sulfuric acid ($H_2SO_4$), phosphoric acid ($H_3PO_4$), nitric acid ($HNO_3$), carboxylic acid derivatives ($C_nH_{2n+1}COOH$), combinations thereof, or the like. In embodiments in which the first etchant is an acid, a pH of the first etching chemicals may be from about 0 to about 7 or from about 1 to about 3. The first etchant may be present in the first etching chemicals in a concentration ranging from about 0.01 M to about 20 M or from about 0.5 M to about 1.5 M.

The first solvent may be utilized to help mix and deliver the first etchant. The first solvent may not participate in the etching reaction itself. In a particular embodiment the first etching solvent may be a solvent such as deionized water or the like. However, any suitable solvent may be utilized.

The first etching chemicals may further include ionic or nonionic surfactants such as quaternary ammonium ($NR_4^+$), sulfate ($SO_4^{2-}$), sulfonate ($R-SO_3^-$), phosphate ($-PO_4^{3-}$), carboxylates ($R-COO^-$), alcohol ethoxylates, alkyl phenol ethoxylates, fatty acid ethoxylates, fatty amine ethoxylates, glycol esters, glycerol esters, combinations thereof, or the like, which may be added to reduce the surface tension of the first etching chemicals. The surfactants may be present in the first etching chemicals in a concentration ranging from about 0.0001 M to about 1 M or from about 0.0005 m to about 0.002 M.

Prior to etching the second semiconductor layers 254A-254C with the first etching process, each of the second semiconductor layers 254A-254C have tapered profiles in which widths at the bottom of the second semiconductor layers 254A-254C are greater than widths at the top of the second semiconductor layers 254A-254C (as discussed previously in the discussed related to FIG. 19A). The first etching process may have the same etching rates at the top of the second semiconductor layers 254A-254C and the bottom of the second semiconductor layers 254A-254C, such that the second semiconductor layers 254A-254C still have tapered profiles after etching the nanostructures 255 with the first etching process. The first etching process may etch top surfaces as well as sidewalls of the second semiconductor layers 254C such that the second semiconductor layers 254C have heights less than the second semiconductor layers 254A-254B.

After the nanostructures 255 in the region 250N and the region 250P are etched with the first etching process, the second semiconductor layers 254A-254B may have a height $H_{13}$ from about 2 nm to about 50 nm, from about 15 nm to about 25 nm, or from about 18 nm to about 22 nm and the second semiconductor layers 254C may have a height $H_{14}$ from about 2 nm to about 30 nm, from about 10 nm to about 20 nm, or from about 13 nm to about 17 nm. In some embodiments, the widths of the nanostructures 255 may be different in the region 250N and the region 250P. For example, in the region 250N, an average width $W_{22}$ of the second semiconductor layers 254A may be from about 2.2 nm to about 80 nm, from about 12 nm to about 22 nm, or from about 15 nm to about 19 nm; an average width $W_{23}$ of the second semiconductor layers 254B may be from about 2.2 nm to about 80 nm, from about 11 nm to about 21 nm, or from about 14 nm to about 18 nm; and an average width $W_{24}$ of the second semiconductor layers 254C may be from about 2.2 nm to about 80 nm, from about 10 nm to about 20 nm, or from about 13 nm to about 17 nm. A ratio of the width $W_{24}$ to the width $W_{23}$ may be from about 0.5 to about 2 or from about 0.8 to about 1.0, a ratio of the width $W_{23}$ to the width $W_{22}$ may be from about 0.5 to about 2 or from about 0.8 to about 1.0, and a ratio of the width $W_{24}$ to the width $W_{22}$ may be from about 0.25 to about 4 or from about 0.64 to about 1.0. In the region 250P, an average width $W_{25}$ of the second semiconductor layers 254A may be from about 2.2 nm to about 80 nm, from about 12 nm to about 22 nm, or from about 15 nm to about 19 nm; an average width $W_{26}$ of the second semiconductor layers 254B may be from about 2.2 nm to about 80 nm, from about 11 nm to about 21 nm, or from about 14 nm to about 18 nm; and an average width $W_{27}$ of the second semiconductor layers 254C may be from about 2.2 nm to about 80 nm, from about 10 nm to about 20 nm, or from about 13 nm to about 17 nm. A ratio of the width $W_{27}$ to the width $W_{26}$ may be from about 0.5 to about 2 or from about 0.8 to about 1.0 and a ratio of the width $W_{26}$ to the width $W_{25}$ may be from about 0.5 to about 2 or from about 0.8 to about 1.0.

Portions of the nanostructures 255 formed in the substrate 250 in the region 250N may have a bottom width $W_{30}$ from about 2.2 nm to about 100 nm, from about 15 nm to about 25 nm, or from about 18 nm to about 22 nm and a top width $W_{31}$ from about 2.2 nm to about 80 nm, from about 13 nm to about 23 nm, or from about 16 nm to about 20 nm. A ratio of the top width $W_{31}$ to the bottom width $W_{30}$ may be from about 0.5 to about 2 or from about 0.8 to about 1.0. An angle $\theta_{11}$ between sidewalls of the portions of the nanostructures 255 formed in the substrate 250 in the region 250N and a top surface of the substrate 250 may be from about 70° to about 85°, from about 78° to about 82°, from about 95° to about 120°, or from about 98° to about 102°. Portions of the nanostructures 255 formed in the substrate 250 in the region 250P may have a bottom width $W_{32}$ from about 2.2 nm to about 100 nm, from about 15 nm to about 25 nm, or from about 18 nm to about 22 nm and a top width $W_{33}$ from about 2.2 nm to about 80 nm, from about 13 nm to about 23 nm, or from about 15 nm to about 20 nm. An angle $\theta_{12}$ between sidewalls of the portions of the nanostructures 255 formed in the substrate 250 in the region 250P and a top surface of the substrate 250 may be from about 70° to about 85°, from about 78° to about 82°, from about 95° to about 120°, or from about 98° to about 102°. A ratio of the top width $W_{33}$ to the bottom width $W_{32}$ may be from about 0.5 to about 2 or from about 0.8 to about 1.0.

Further in FIG. 19B, exposed portions of the first semiconductor layers 252A-252C in the region 250N and the region 250P may be etched using second etching chemicals in a second etching process separate from the first etching process. During the second etching process, the first semiconductor layers 252A-252C and the second semiconductor layers 254A-254C in both the region 250N and the region 250P may be exposed to the second etching chemicals. A second etching selectivity, which is the ratio of the etching rate (sometimes referred to as the trimming rate) of the first semiconductor layers 252A-252C (formed of, e.g., silicon germanium) to the etching rate of the second semiconductor layers 254A-254C (formed of, e.g., silicon), is desired to be high in order to minimize the etching of the second semiconductor layers 254A-254C. For example, the second etching selectivity may be higher than about 5, and may range from about 5 to about 20, or higher. The second etching process may be performed at a temperature ranging from about 5° C. to about 100° C., such as about room temperature (e.g. about 23° C.).

In some embodiments, the second etching chemicals may include an oxidant and a second etchant dissolved in a second solvent. The nanostructures 255 may be exposed to the oxidant and the second etchant simultaneously. In the embodiments in which the nanostructures 255 are exposed to the oxidants and the second etchants simultaneously, the nanostructures 255 may be exposed to the second etching chemicals for a period from about 30 seconds to about 2 minutes or from about 45 seconds to about 75 seconds. In some embodiments, the second etchant may be the same as the first etchant. The second etchant may be an alkaline or an acid.

In embodiments in which the second etchant includes an alkaline, the second etchant may include a metal hydroxide ($M^{n+}(OH^-)_n$), amine derivatives, ammonium derivatives, combinations thereof, or the like. The metal hydroxide may include sodium hydroxide (NaOH), potassium hydroxide (KOH), lithium hydroxide (LiOH), rubidium hydroxide (RbOH), cesium hydroxide (CsOH), combinations thereof, or the like. The amine derivatives may include ammonia ($NH_3$), ammonium hydroxide ($NH_4OH$), tetramethylammonium hydroxide (TMAH,$(CH_3)_4N(OH)$), tetraethyl ammonium hydroxide (TEAH,$(C_2H_5)_4N(OH)$), trimethyltetradecylammonium hydroxide (TTAH,$(CH_3)_3(C_{14}H_{29})N(OH)$), tetrabutylammonium hydroxide (TBAH,$(C_4H_9)_4N(OH)$), combinations thereof, or the like. In embodiments in which the second etchant is an alkaline, a pH of the second etching chemicals may be from about 7 to about 13 or from about 8 to about 10. The second etchant may be present in the second etching chemicals in a concentration ranging from about 0.01 M to about 20 M or from about 0.5 M to about 1.5 M.

In embodiments in which the second etchant includes an acid, the second etchant may include hydrochloric acid (HCl), hydrofluoric acid (HF), sulfuric acid ($H_2SO_4$), phosphoric acid ($H_3PO_4$), nitric acid ($HNO_3$), carboxylic acid derivatives ($C_nH_{2n+1}COOH$), combinations thereof, or the like. In embodiments in which the second etchant is an acid, a pH of the second etching chemicals may be from about 0 to about 7 or from about 1 to about 3. The second etchant may be present in the second etching chemicals in a concentration ranging from about 0.01 M to about 20 M or from about 0.5 M to about 1.5 M.

The oxidant may include ozonated de-ionized water ($DIO_3$), hydrogen peroxide ($H_2O_2$), other non-metal oxidants, combinations thereof, or the like. An oxidizing agent may be present in the second etching chemicals in a concentration ranging from about 0.0001 M to about 1 M or from about 0.0005 m to about 0.002 M. Including the oxidant in addition to the second etchant allows the first semiconductor layers 252A-252C to be etched selectively with respect to the second semiconductor layers 254A-254C. The oxidant may be used to oxidize the first semiconductor layers 252A-252C, forming silicon germanium oxide in the first semiconductor layers 252A-252C, and the second etchant may then be used to etch the silicon germanium oxide material, thinning the first semiconductor layers 252A-252C. On the other hand, in the region 250N, the oxidant may be used to oxidize the second semiconductor layers 254A-254C, forming silicon oxide in the second semiconductor layers 254A-254C, which is etched at a slower rate by the second etchant. Silicon may also be oxidized at a slower rate than silicon germanium, such that any silicon oxide layer formed in the second semiconductor layers 254A-254C is thinner than an oxide formed in the first semiconductor layers 252A-252C. Accordingly, the second semiconductor layers 254A-254C are substantially un-thinned, while the first semiconductor layers 252A-252C are thinned.

The second solvent may be utilized to help mix and deliver the oxidant and the second etchant. The second solvent may not participate in the etching reaction itself. In a particular embodiment the second etching solvent may be a solvent such as deionized water, acetic acid ($CH_3COOH$), or the like. In embodiments in which the oxidant includes ozonated deionized water, the deionized water may also act as a solvent. Any suitable solvents may be utilized.

The second etching chemicals may further include ionic or nonionic surfactants such as quaternary ammonium ($NR_4^+$), sulfate ($SO_4^{2-}$), sulfonate ($R\text{—}SO_3^-$), phosphate ($\text{—}PO_4^{3-}$), carboxylates ($R\text{—}COO^-$), alcohol ethoxylates, alkyl phenol ethoxylates, fatty acid ethoxylates, fatty amine ethoxylates, glycol esters, glycerol esters, combinations thereof, or the like, which may be added to reduce the surface tension of the second etching chemicals. The surfactants may be present in the second etching chemicals in a concentration ranging from about 0.01 M to about 20 M or from about 0.5 M to about 1.5 M.

In a specific embodiment, the second etching chemicals may include hydrofluoric acid (HF), hydrogen peroxide ($H_2O_2$), and acetic acid ($CH_3COOH$). The acetic acid may be a solvent in which the hydrofluoric acid and the hydrogen peroxide dissolved. The hydrogen peroxide may be an oxidant, which is used to oxidize the first semiconductor layers 252A-252C. The hydrofluoric acid may be a second etchant which is used to thin the first semiconductor layers 252A-252C. A volume ratio of hydrofluoric acid:hydrogen peroxide:acetic acid may be about 1:2:3.

In further embodiments, the nanostructures 255 may be exposed to the oxidant, then the oxidant may be removed and the nanostructures 255 may be exposed to the second etchant in a cyclical process to thin the second semiconductor layers 254A-254C of the nanostructures 255. Exposing the nanostructures 255 to the oxidant may oxidize the nanostructures 255 in the region 250N and the region 250P. Exposing the nanostructures 255 to the second etchant may selectively etch the oxide formed in the first semiconductor layers 252A-252C relative to the oxide formed in the second semiconductor layers 254A-254C.

The oxidant used in the cyclical process may be the same as those described above as being used in the process in which the nanostructures 255 are exposed to the oxidant and the second etchant simultaneously. For example, the oxidant may include ozonated de-ionized water ($DIO_3$), hydrogen peroxide ($H_2O_2$), other non-metal oxidants, combinations thereof, or the like. An oxidizing agent may be present in the oxidant in a concentration ranging from about 0.0001 M to about 1 M or from about 0.0005 m to about 0.002 M. As discussed previously, exposing the nanostructures 255 may oxidize the first semiconductor layers 252A-252C. The second semiconductor layers 254A-254C may also be oxidize, but may be oxidized at a slower rate than the first semiconductor layers 252A-252C.

The second etchant used in the cyclical process may be the same as or similar to the first etchant. The second etchant may be present in a concentration ranging from about 0.01 M to about 20 M or from about 0.5 M to about 1.5 M. Exposing the nanostructures 255 to the second etchant thins the second semiconductor layers 254A-254C. As discussed previously, the first semiconductor layers 252A-252C may be thinned at a slower rate than the second semiconductor layers 254A-254C.

For each cycle, the nanostructures 255 may be exposed to the oxidant for a period ranging from about 10 seconds to about 5 minutes or from about 45 seconds to about 75 seconds and the nanostructures 255 may be exposed to the second etchant for a period ranging from about 10 seconds to about 5 minutes or from about 45 seconds to about 75 seconds. The cyclical etching process may be repeated for up to 20 cycles, up to 10 cycles, 4 to 6 cycles, or the like. Exposing the nanostructures 255 to the oxidant, then the second etchant in a cyclical process may provide better control of the etching of the first semiconductor layers 252A-252C. This results in improved gate control of resulting NSFETs, reduces the nanostructure-width variation, and leads to decreased DIBL.

The second etching process may have etching rates which depend on the concentration of germanium in the first semiconductor layers 252A-252C. For example, the second etching process may have higher etching rates with increasing germanium concentration in the first semiconductor layers 252A-252C. As discussed previously in the discussion related to FIG. 18, each of the first semiconductor layers 252A-252C may have a gradient germanium concentration in which the germanium concentration is higher at the bottom surface of the respective first semiconductor layer 252A-252C and gradually and continually decreases towards the top surface of the respective first semiconductor layer 252A-252C. Thus, bottom portions of the first semiconductor layers 252A-252C may be etched by the second etching process with higher etching rates than top portions of the first semiconductor layers 252A-252C. A ratio of the etching rate at the bottom surface of the first semiconductor layer 252A (e.g., a maximum etching rate) to the etching rate at the top surface of the first semiconductor layer 252C (e.g., a minimum etching rate) may be from about 0.5 to about 2 or from about 0.75 to about 1.25.

Prior to etching the first semiconductor layers 252A-252C with the second etching process, the first semiconductor layers 252A-252C have tapered profiles in which widths at the bottom of each of the first semiconductor layers 252A-252C are greater than widths at the top of each of the first semiconductor layers 252A-252C (as discussed previously in the discussed related to FIG. 19A). Etching the first semiconductor layers 252A-252C with the second etching process which has a higher etching rate at the bottom of each of the first semiconductor layers 252A-252C than the top of each of the first semiconductor layers 252A-252C results in the first semiconductor layers 252A-252C having a more rectangular profile after etching the first semiconductor layers 252A-252C with the second etching process.

After the first semiconductor layers 252A-252C are etched with the second etching process, each of the first semiconductor layers 252A-252C in the region 250N may an average width $W_{28}$ from about 2.2 nm to about 80 nm, from about 23 nm to about 33 nm, or from about 26 nm to about 30 nm. A ratio of the width $W_{28}$ of the top first semiconductor layers 252C to the bottom first semiconductor layers 252A may be from about 0.8 to about 1.2 or from about 0.9 to about 1.1. Each of the first semiconductor layers 252A-252C in the region 250P may an average width $W_{29}$ from about 2.2 nm to about 80 nm, from about 23 nm to about 33 nm, or from about 26 nm to about 30 nm. A ratio of the width $W_{29}$ of the top first semiconductor layers 252C to the bottom first semiconductor layers 252A may be from about 0.8 to about 1.2 or from about 0.9 to about 1.1. Each of the first semiconductor layers 252A-252C in the region 250N and the region 250P may have a height $H_{15}$ from about 2 nm to about 50 nm, from about 15 nm to about 25 nm, or from about 18 nm to about 22 nm.

Forming the first semiconductor layers 252A-252C having a gradient germanium concentration and thinning the first semiconductor layers 252A-252C using an etching process which has a higher etching rate with increasing germanium concentration results in the first semiconductor layers 252A-252C having more rectangular profiles and improves control of the process used to etch the first semiconductor layers 252A-252C. Including the first semiconductor layers 252A-252C in NSFETs results in better gate control, reduced nanostructure-width variation, and decreased DIBL.

FIG. 20A illustrates an embodiment in which the nanostructures 255 are not thinned until after shallow trench isolation (STI) regions 258 are formed. For example, the thinning process may be performed after the formation of the STI regions 258, as will be discussed below with respect to FIG. 20B, or after the removal of dummy gate stacks (such as dummy gate stacks including the dummy gates 272 and the dummy dielectric layers 260, discussed below with respect to FIGS. 22A and 22B), as will be discussed below with respect to FIGS. 31D and 31E. However, it should be understood that the steps performed in FIG. 20A and subsequent figures may be performed on nanostructures 255 which have been thinned as described above in reference to FIG. 19B.

In FIG. 20A, shallow trench isolation (STI) regions 258 are formed adjacent the nanostructures 255 and the patterned portions of the substrate 250. The STI regions 258 may be formed by forming an insulation material (not separately illustrated) over the substrate 250 and between neighboring nanostructures 255/patterned portions of the substrate 250. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In some embodiments, the insulation material is silicon oxide formed by an FCVD process. An anneal process may be performed once the insulation material is formed. In some embodiments, the insulation material is formed such that excess insulation material covers the nanostructures 255. The insulation material may comprise a single layer or may utilize multiple layers. For example, in some embodiments a liner (not separately illustrated) may first be formed along surfaces of the substrate 250 and the nanostructures 255. Thereafter, a fill material, such as those discussed above may be formed over the liner.

A removal process is then applied to the insulation material to remove excess insulation material over the nanostructures 255. In some embodiments, a planarization process such as a chemical mechanical polish (CMP), an etch-back process, combinations thereof, or the like may be utilized. The planarization process may planarize the insulation material and the nanostructures 255. The planarization process exposes the nanostructures 255 such that top surfaces of the nanostructures 255 and the insulation material are level after the planarization process is complete.

The insulation material is then recessed to form the STI regions 258 as illustrated in FIG. 20A. The insulation material is recessed such that upper portions of the nanostructures 255 and the substrate 250 protrude from between neighboring STI regions 258. Further, the top surfaces of the STI regions 258 may have flat surfaces as illustrated, convex surfaces, concave surfaces (such as dishing), or a combination thereof. The top surfaces of the STI regions 258 may be formed flat, convex, and/or concave by an appropriate etch. The STI regions 258 may be recessed using an acceptable etching process, such as one that is selective to the material of the insulation material (e.g., etches the material of the insulation material at a faster rate than the material of the nanostructures 255 and the substrate 250). For example, an oxide removal using, for example, dilute hydrofluoric (dHF) acid may be used. A height $H_{12}$ of the STI regions 258 may be from about 30 nm to about 100 nm or from about 55 nm to about 75 nm.

FIG. 20B illustrates an embodiment in which the thinning process is performed to thin the nanostructures 255 after forming the STI regions 258, rather than being performed after forming the nanostructures 255 and before forming the STI regions 258, as discussed above in reference to FIG. 19B. In the embodiment illustrated in FIG. 20B, the nanostructures 255 in the region 250N may be exposed to etchants used to thin the nanostructures 255 in the region 250P and the nanostructures 255 in the region 250P may be exposed to etchants used to thin the nanostructures 255 in the region 250N.

In the embodiment illustrated in FIG. 20B, the nanostructures 255 in both the region 250N and the region 250P are exposed to the first etching chemicals and the second etching chemicals in processes the same as or similar to those described above with respect to FIG. 19B. Following the first etching process, the second semiconductor layers 254A-254C in the region 250N and the region 250P may have the same or similar dimensions as the second semiconductor layers 254A-254C discussed above with respect to FIG. 19B. Following the second etching process, the first semiconductor layers 252A-252C in the region 250N and the region 250P may have the same or similar dimensions as the first semiconductor layers 252A-252C as discussed above with respect to FIG. 19B. For example, the dimensions of the first semiconductor layers 252A-252C and the dimensions of the second semiconductor layers 254A-254C may be within about 10 nm of the dimensions discussed above with respect to FIG. 19B.

Forming the first semiconductor layers 252A-252C having a gradient germanium concentration and thinning the first semiconductor layers 252A-252C using an etching process which has a higher etching rate with increasing germanium concentration results in the first semiconductor layers 252A-252C having more rectangular profiles and improves control of the process used to etch the first semiconductor layers 252A-252C. Including the first semiconductor layers 252A-252C in NSFETs results in better gate control, reduced nanostructure-width variation, and decreased DIBL.

Portions of the nanostructures 255 in the region 250N and the region 250P surrounded by the STI regions 258 may remain unchanged after the thinning process is performed. For example, portions of the nanostructures 255 disposed below top surfaces of the STI regions 258 may have widths similar to or the same as those discussed above with respect to FIG. 19A. As illustrated in FIG. 20B, there may be a step change in the widths of the nanostructures 255 level with the top surfaces of the STI regions 258 due to the thinning process.

Figure 21:
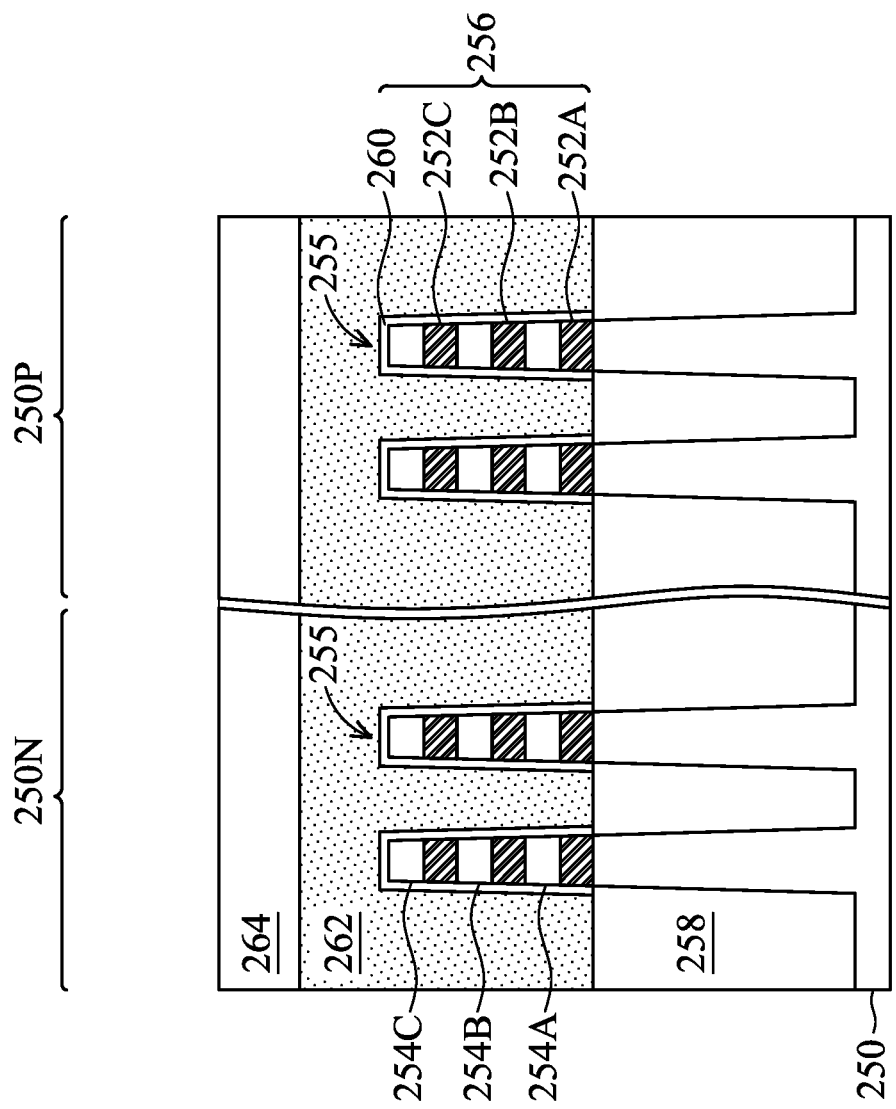

FIG. 21 illustrates an embodiment in which the nanostructures 255 are not thinned until after dummy gates stacks (such as dummy gate stacks including the dummy gates 272 and the dummy dielectric layers 260, discussed below with respect to FIGS. 22A and 22B) are formed. For example, the thinning process may be performed after the removal of the dummy gate stacks, as will be discussed below with respect to FIGS. 31D and 31E. However, it should be understood that the steps performed in FIG. 21 and subsequent figures may be performed on nanostructures 255 which have been thinned as described above in reference to FIG. 19B or 20B.

In FIG. 21, dummy dielectric layers 260 are formed on the nanostructures 255 and the substrate 250. The dummy dielectric layers 260 may be, for example, silicon oxide, silicon nitride, a combination thereof, or the like, and may be deposited or thermally grown according to acceptable techniques. A dummy gate layer 262 is formed over the dummy dielectric layers 260, and a mask layer 264 is formed over the dummy gate layer 262. The dummy gate layer 262 may be deposited over the dummy dielectric layers 260 and then planarized by a process such as CMP. The mask layer 264 may be deposited over the dummy gate layer 262. The dummy gate layer 262 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 262 may be deposited by physical vapor deposition (PVD), CVD, sputter deposition, or other techniques known and used in the art for depositing the selected material. The dummy gate layer 262 may be made of other materials that have a high etching selectivity from the material of the STI regions 258. The mask layer 264 may include, for example, silicon nitride, silicon oxynitride, or the like. In this example, a single dummy gate layer 262 and a single mask layer 264 are formed across the region 250N and the region 250P. It is noted that the dummy dielectric layers 260 are shown covering only the nanostructures 255 and the substrate 250 for illustrative purposes only. In some embodiments, the dummy dielectric layers 260 may be deposited such that the dummy dielectric layers 260 cover the STI regions 258, extending between the dummy gate layer 262 and the STI regions 258.

FIGS. 22A through 35D illustrate various additional steps in the manufacturing of embodiment devices. FIGS. 22A through 25B, 26A, 27A, 28A, 28D, 29A, 30A, 31A, 31E, 34A, and 35A illustrate features in either of the region 250N or the region 250P. For example, the structures illustrated in FIGS. 22A through 25B, 26A, 27A, 28A, 28D, 29A, 30A, 31A, 31E, 34A, and 35A may be applicable to both the region 250N and the region 250P. Differences (if any) in the structures of the region 250N and the region 250P are described in the text accompanying each figure. For example, the FIGS. 26B, 27B, 28B, 29B, 30B, 31B, 32A, 32B, 33A, 33B, 33E, 33F, 34B, and 35B illustrate structures in the region 250N, FIGS. 26C, 27C, 28C, 29C, 30C, 31C, 32C, 32D, 33C, and 33D illustrate structures in the region 250P, and FIGS. 31D, 35C, and 35D illustrate structures in the region 250N and the region 250P.

Figure 22B:
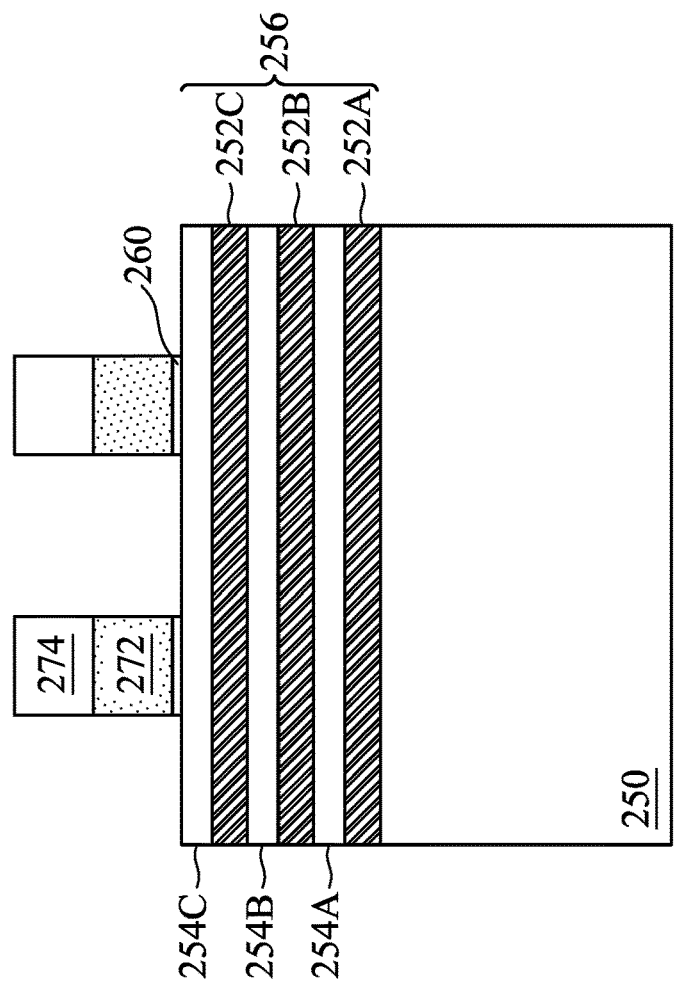
Figure 22A:
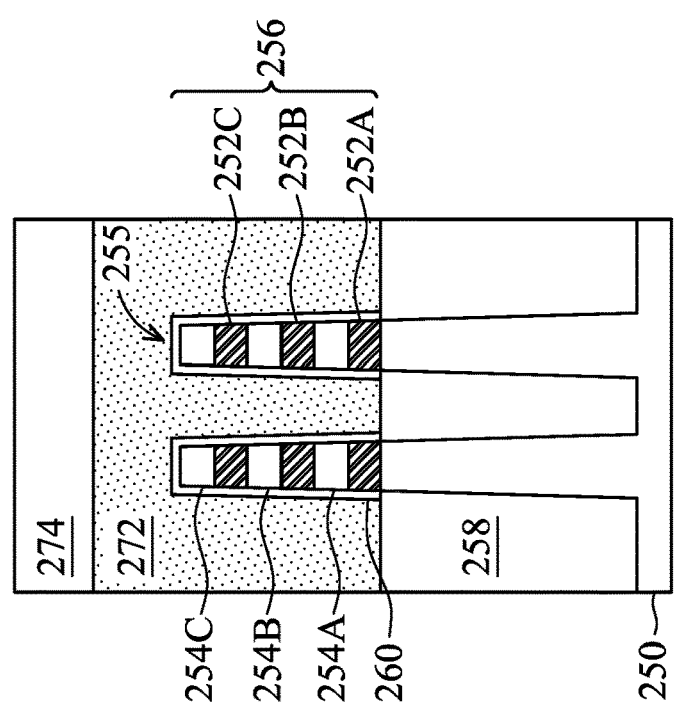

In FIGS. 22A and 22B, the mask layer 264 (see FIG. 21) may be patterned using acceptable photolithography and etching techniques to form masks 274. An acceptable etching technique may be used to transfer the pattern of the masks 274 to the dummy gate layer 262 to form dummy gates 272. In some embodiments, the pattern of the masks 274 may also be transferred to the dummy dielectric layers 260. The dummy gates 272 cover respective channel regions of the nanostructures 255. In some embodiments, the channel regions may be formed in the second semiconductor layers 254A-254C including the second semiconductor materials in the region 250N and the channel regions may be formed in the first semiconductor layers 252A-252C including the first semiconductor materials in the region 250P. The pattern of the masks 274 may be used to physically separate each of the dummy gates 272 from adjacent dummy gates 272. The dummy gates 272 may have a lengthwise direction substantially perpendicular to lengthwise directions of respective nanostructures 255. The dummy dielectric layers 260, the dummy gates 272, and the masks 274 may be collectively referred to as "dummy gate stacks."

In FIGS. 23A and 23B, a first spacer layer 280 and a second spacer layer 282 are formed over the structures illustrated in FIGS. 22A and 22B. In FIGS. 23A and 23B, the first spacer layer 280 is formed on top surfaces of the STI regions 258, top surfaces and sidewalls of the nanostructures 255 and the masks 274, and sidewalls of the substrate 250, the dummy gates 272 and the dummy dielectric layers 260. The second spacer layer 282 is deposited over the first spacer layer 280. The first spacer layer 280 may be formed by thermal oxidation or deposited by CVD, ALD, or the like. The first spacer layer 280 may be formed of silicon oxide, silicon nitride, silicon oxynitride, or the like. The second spacer layer 282 may be deposited by CVD, ALD, or the like. The second spacer layer 282 may be formed of silicon oxide, silicon nitride, silicon oxynitride, or the like.

Figure 24B:
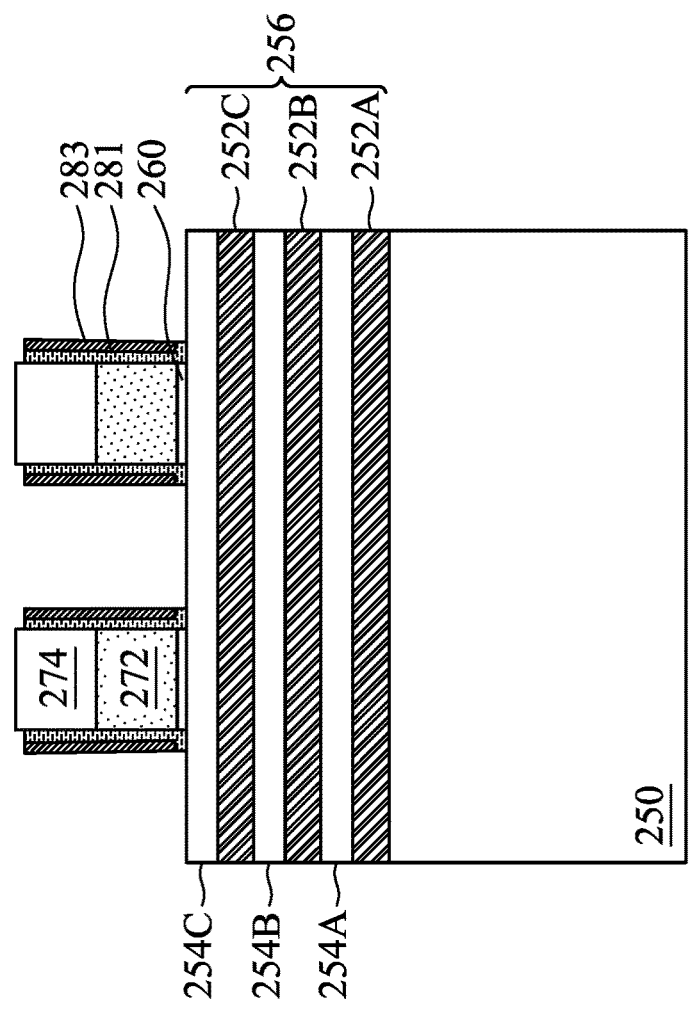
Figure 24A:
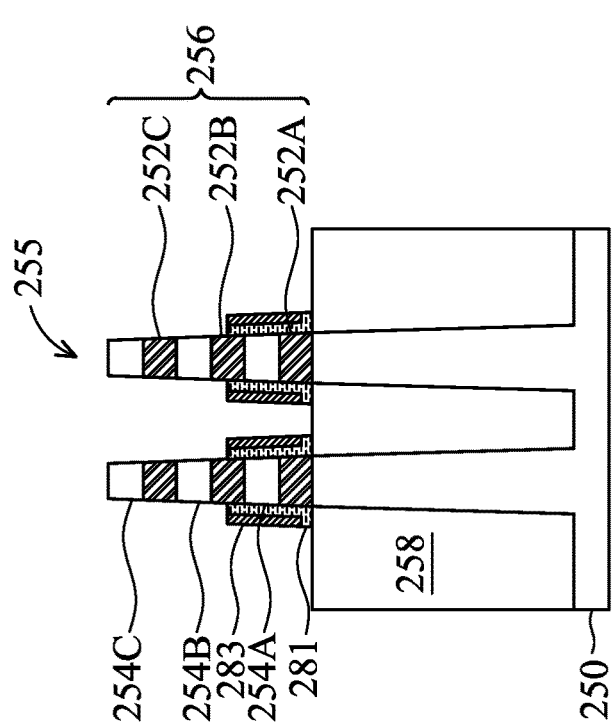

In FIGS. 24A and 24B, the first spacer layer 280 and the second spacer layer 282 are etched to form first spacers 281 and second spacers 283. The first spacer layer 280 and the second spacer layer 282 may be etched using a suitable etching process, such as an anisotropic etching process (e.g., a dry etching process) or the like. The first spacers 281 and the second spacers 283 may be disposed on sidewalls of the nanostructures 255, the dummy dielectric layers 260, the dummy gates 272, and the masks 274. The first spacers 281 and the second spacers 283 may have different heights adjacent the nanostructures 255 and the dummy gate stacks due to the etching processes used to etch the first spacer layer 280 and the second spacer layer 282, as well as differing heights between the nanostructures 255 and the dummy gate stacks. Specifically, as illustrated in FIGS. 24A and 24B, in some embodiments, the first spacers 281 and the second spacers 283 may extend partially up sidewalls of the nanostructures 255 and may extend to top surfaces of the dummy gate stacks. In some embodiments, the first spacers 281 and the second spacers 283 may extend partially up sidewalls of the dummy gate stacks. For example, top surfaces of the first spacers 281 and the second spacers 283 may be disposed above top surfaces of the dummy gates 272 and below top surfaces of the masks 274.

Figure 25B:
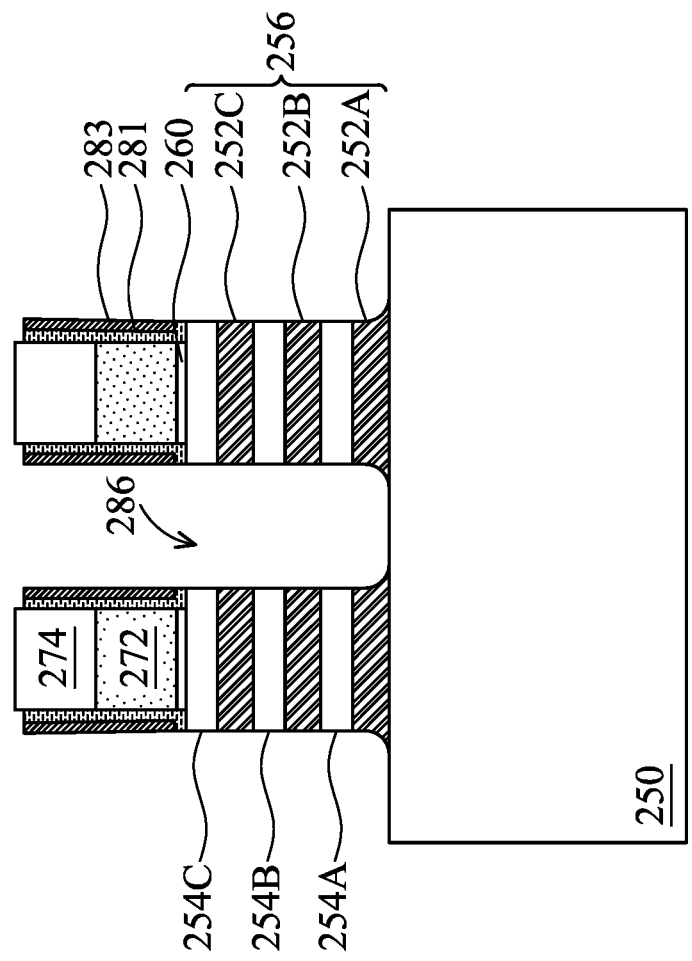
Figure 25A:
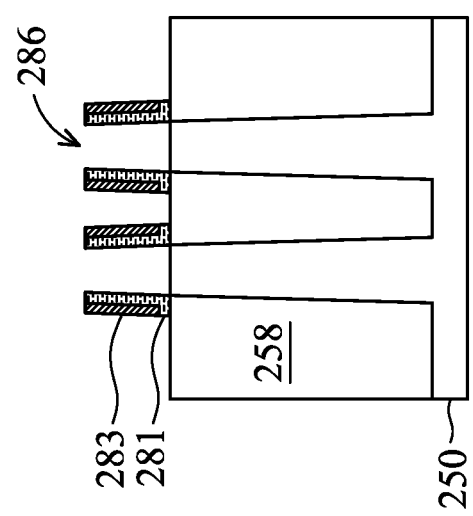

In FIGS. 25A and 25B, first recesses 286 are formed in the nanostructures 255 and the substrate 250. The first recesses 286 may extend through the first semiconductor layers 252A-252C and the second semiconductor layers 254A-254C. In some embodiments, the first recesses 286 may also extend into the substrate 250. As illustrated in FIG. 25A, top surfaces of the STI regions 258 may be level with top surfaces of the substrate 250. In some embodiments, the substrate 250 may be etched such that bottom surfaces of the first recesses 286 are disposed below the top surfaces of the STI regions 258 or the like. The first recesses 286 may be formed by etching the nanostructures 255 and/or the substrate 250 using one or more anisotropic etching processes, such as RIE, NBE, or the like. The first spacers 281, the second spacers 283, and the masks 274 mask portions of the nanostructures 255 and the substrate 250 during the etching processes used to form the first recesses 286. A single etch process may be used to etch each layer of the multi-layer stack 256. In some embodiments, multiple etch processes may be used to etch the layers of the multi-layer stack 256. Timed etch processes may be used to stop the etching of the first recesses 286 after the first recesses 286 reach a desired depth.

Figure 26B:
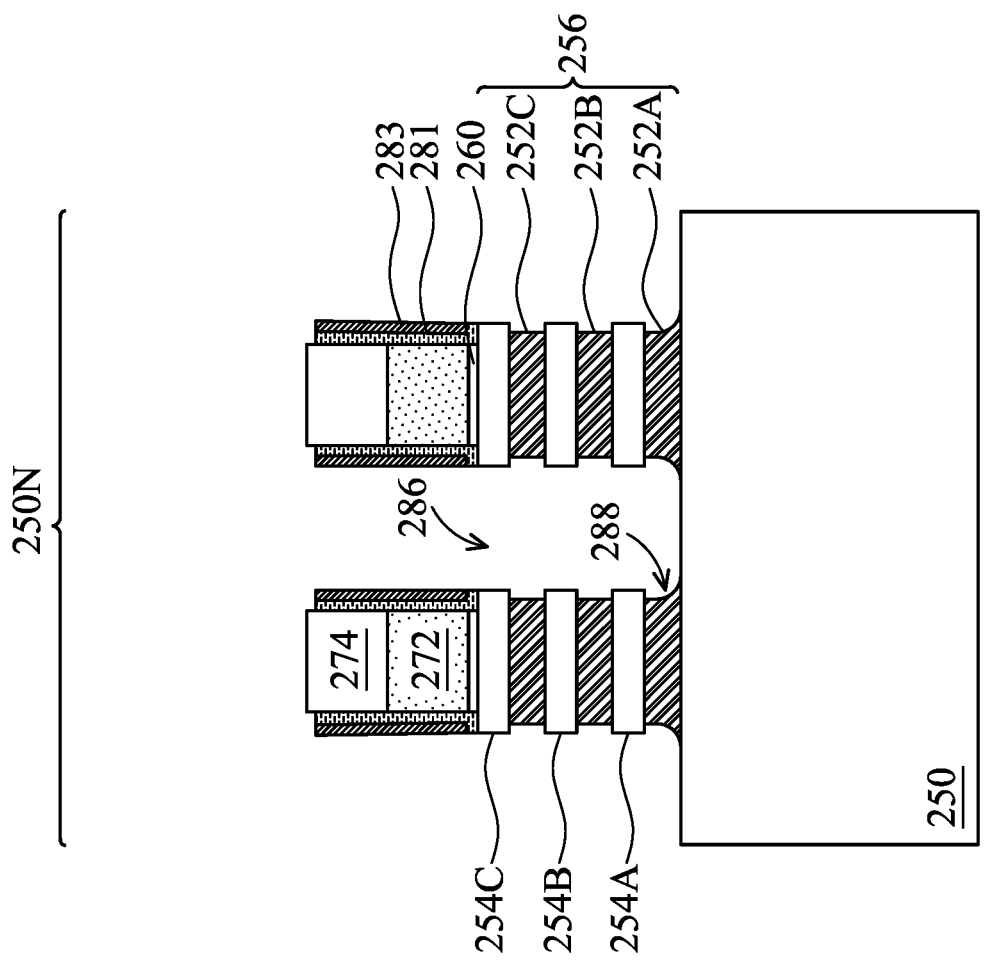
Figure 26A:
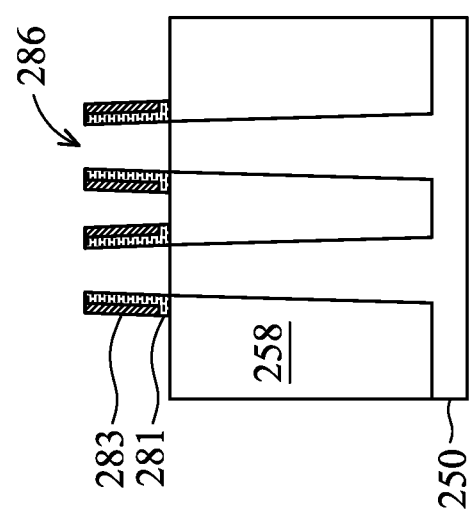
Figure 26C:
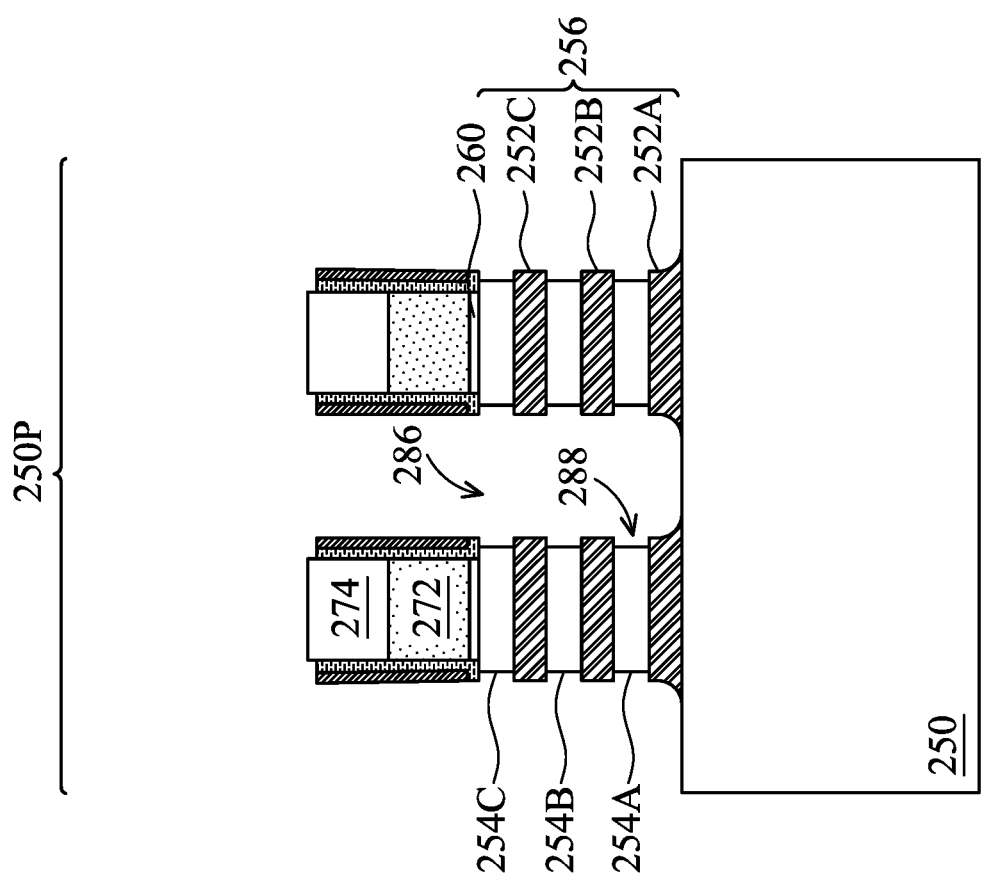
Figure 27B:
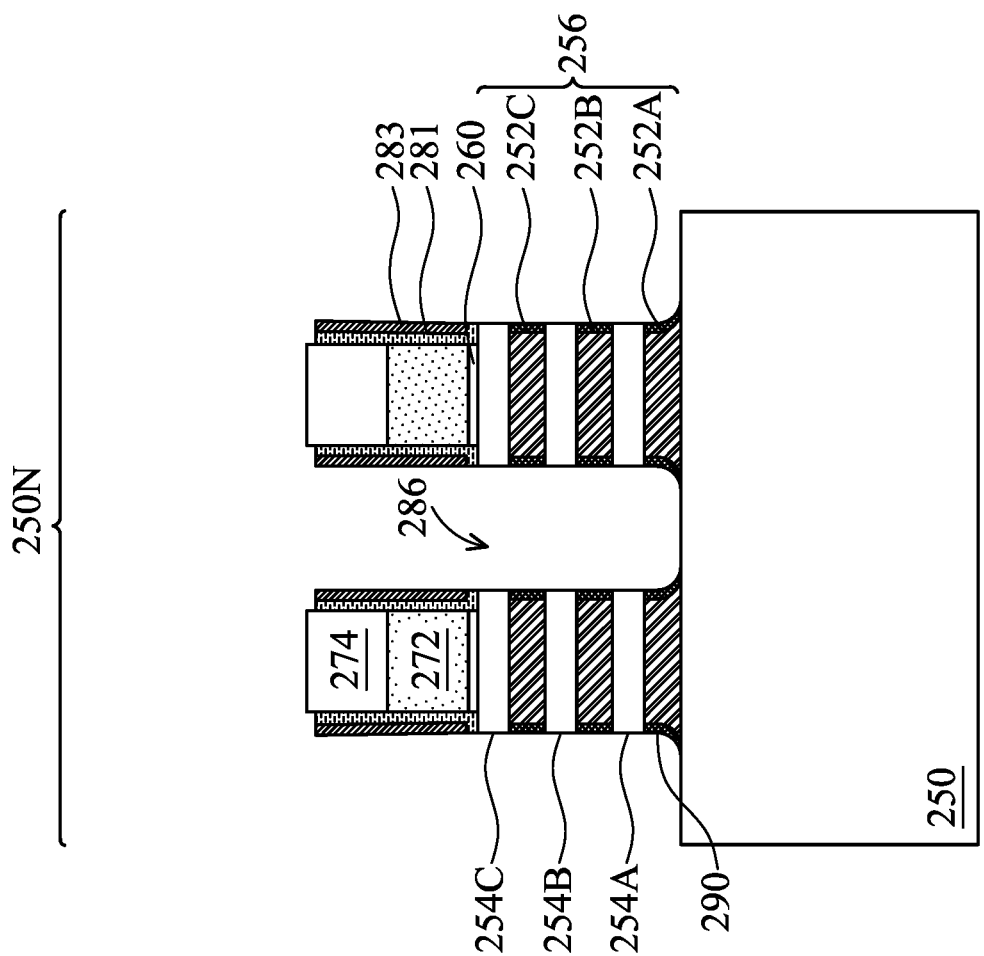
Figure 27A:
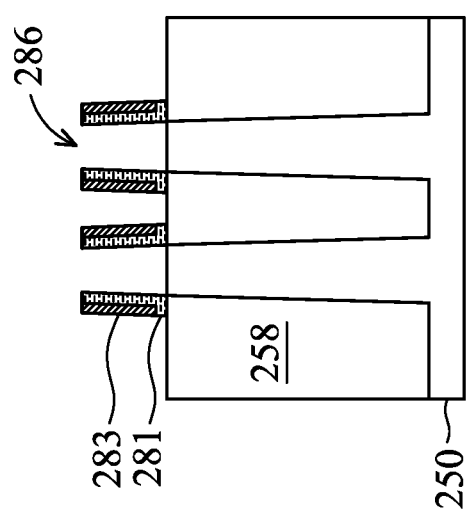
Figure 27C:
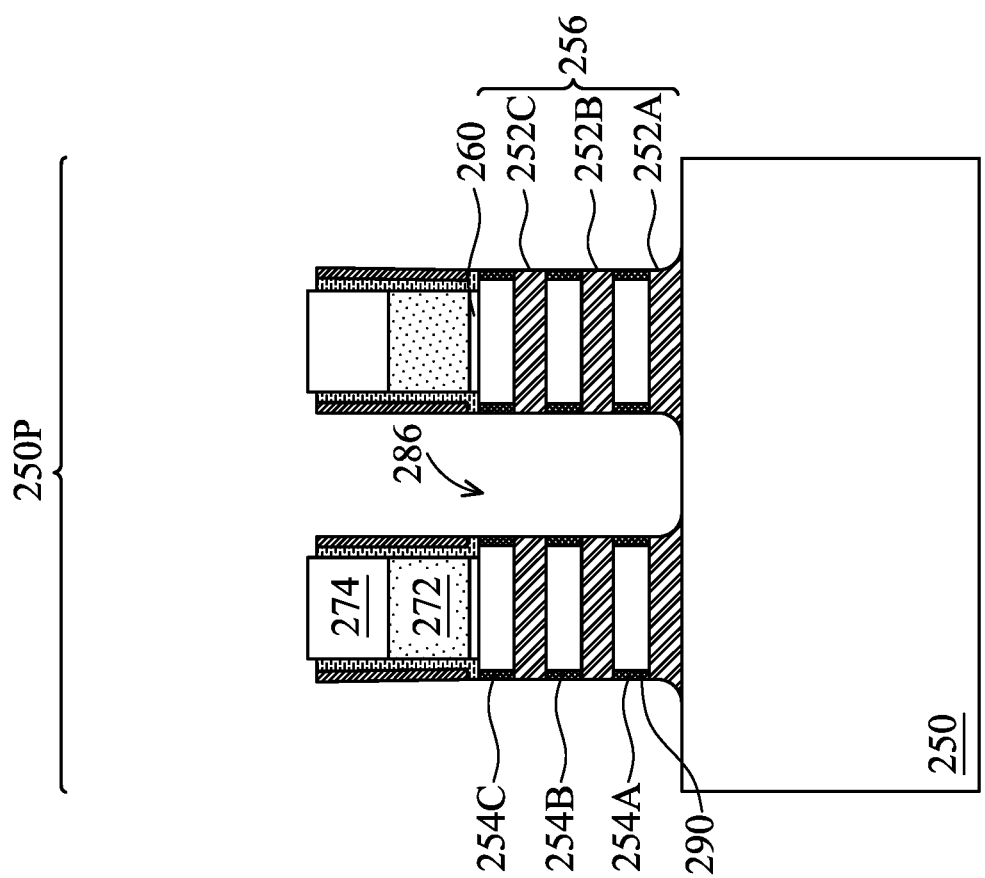

In FIGS. 26A through 26C, portions of sidewalls of the first semiconductor layers 252A-252C and the second semiconductor layers 254A-254C of the multi-layer stack 256 are etched to form sidewall recesses 288. For example, as illustrated in FIGS. 26B and 26C, respectively, sidewalls of the first semiconductor layers 252A-252C in the region 250N formed of the first semiconductor materials and sidewalls of the second semiconductor layers 254A-254C in the region 250P formed of the second semiconductor materials are etched to form the sidewall recesses 288. A mask, such as a photoresist, may be formed over the region 250P, while sidewall recesses 288 are formed in the first semiconductor layers 252A-252C in the region 250N. The mask may then be removed. Subsequently, a mask, such as a photoresist, may be formed over the region 250N while sidewall recesses 288 are formed in the second semiconductor layers 254A-254C in the region 250P. The mask may then be removed.

Although sidewalls of the first semiconductor layers 252A-252C and the second semiconductor layers 254A-254C adjacent the sidewall recesses 288 are illustrated as being straight in FIGS. 26B and 26C, the sidewalls may be concave or convex. The sidewalls may be etched using isotropic etching processes, such as wet etching, dry etching, or the like. The etchants used to etch the first semiconductor layers 252A-252C may be selective to the first semiconductor materials such that the second semiconductor layers 254A-254C and the substrate 250 remain relatively unetched as compared to the first semiconductor layers 252A-252C. Similarly, the etchants used to etch the second semiconductor layers 254A-254C may be selective to the second semiconductor materials such that the first semiconductor layers 252A-252C and the substrate 250 remain relatively unetched as compared to the second semiconductor layers 254A-254C In FIGS. 27A through 27C, first inner spacers 290 are formed in the sidewall recess 288. The first inner spacers 290 may be formed by depositing an inner spacer layer (not separately illustrated) over the structures illustrated in FIGS. 26A through 26C. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be etched to form the first inner spacers 290. Although outer sidewalls of the first inner spacers 290 are illustrated as being flush with sidewalls of the second semiconductor layers 254A-254C in FIG. 27B and the first semiconductor layers 252A-252C in FIG. 27C, the outer sidewalls of the first inner spacers 290 may extend beyond or be recessed from sidewalls of the second semiconductor layers 254A-254C and the first semiconductor layers 252A-252C. Moreover, although the outer sidewalls of the first inner spacers 290 are illustrated as being straight in FIGS. 27B and 27C, the outer sidewalls of the first inner spacers 290 may be concave or convex. The inner spacer layer may be etched by an anisotropic etching process, such as RIE, NBE, or the like.

The first inner spacers 290 may be used to prevent damage to subsequently formed source/drain regions (such as the epitaxial source/drain regions 292, discussed below with respect to FIGS. 28A through 28D) by subsequent etching processes. The first inner spacers 290 may also insulate subsequently formed gate electrodes (such as the gate electrodes 302, discussed below with respect to FIGS. 33A through 33F) from the subsequently formed epitaxial source/drain regions 292, which may prevent shorts in the resulting NSFETs.

Figure 28B:
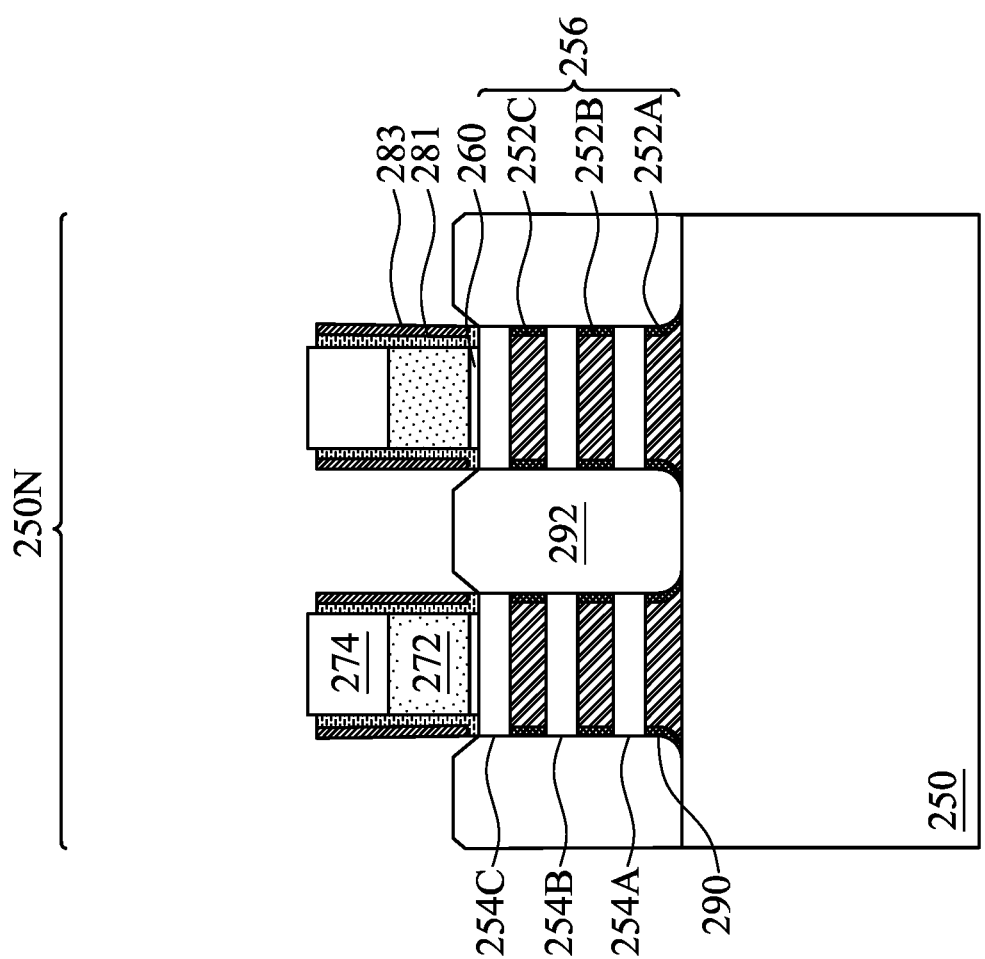
Figure 28A:
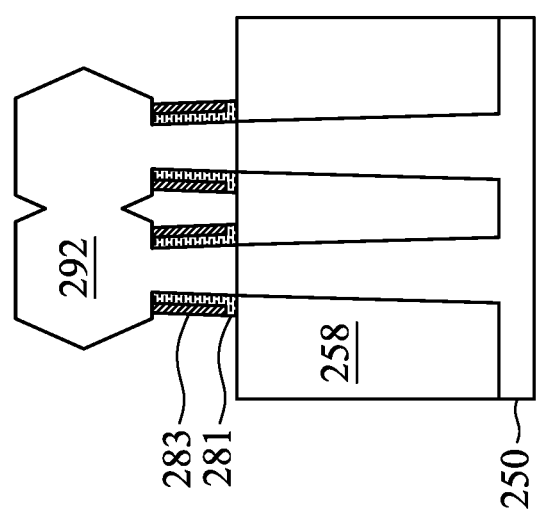
Figure 28D:
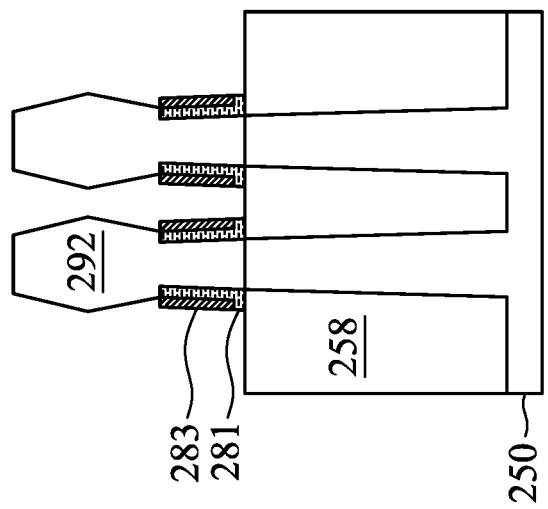
Figure 28C:
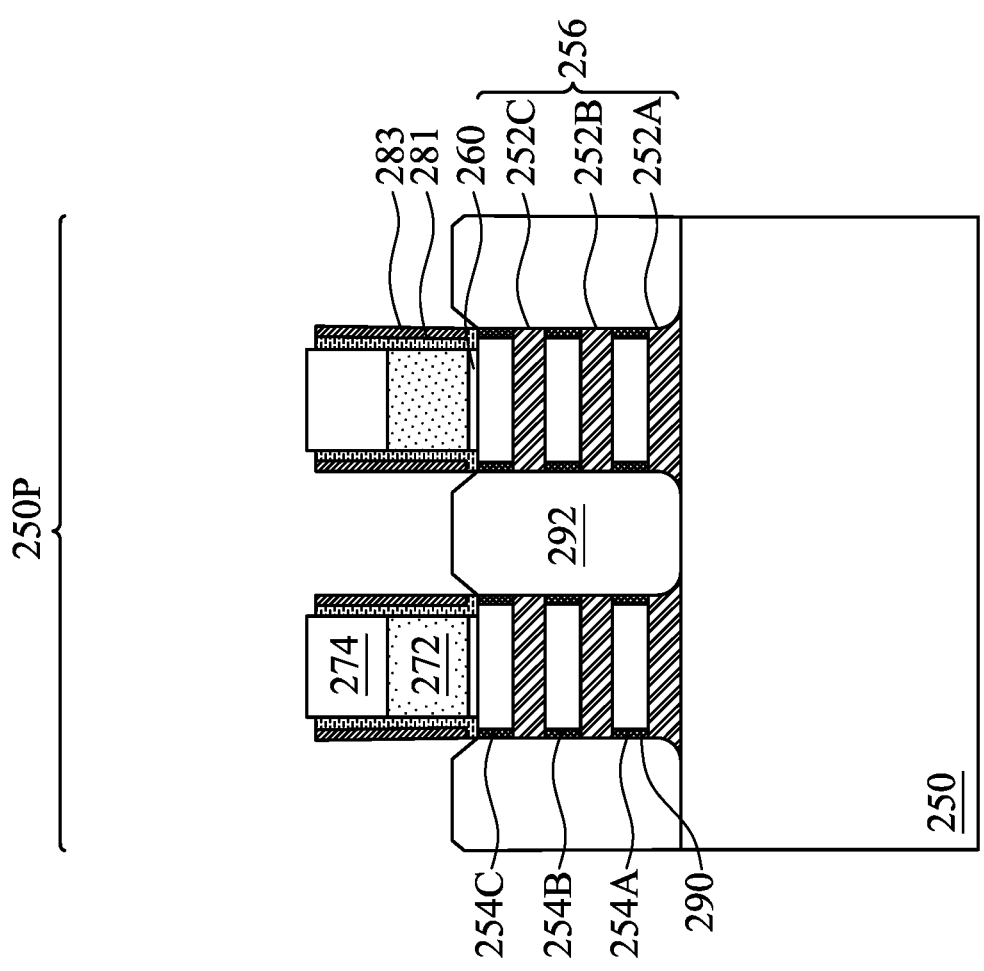

In FIGS. 28A through 28D, epitaxial source/drain regions 292 are formed in the first recesses 286 to exert stress on the second semiconductor layers 254A-254C and the first semiconductor layers 252A-252C of the nanostructures 255, thereby improving performance. As illustrated in FIGS. 28B and 28C, the epitaxial source/drain regions 292 are formed in the first recesses 286 such that each dummy gate 272 is disposed between respective neighboring pairs of the epitaxial source/drain regions 292. In some embodiments, the first spacers 281 are used to separate the epitaxial source/drain regions 292 from the dummy gates 272 by an appropriate lateral distance so that the epitaxial source/drain regions 292 do not short out subsequently formed gates of the resulting NSFETs.

The epitaxial source/drain regions 292 in the region 250N, e.g., the NMOS region, may be formed by masking the region 250P, e.g., the PMOS region. Then, the epitaxial source/drain regions 292 are epitaxially grown in the first recesses 286. The epitaxial source/drain regions 292 may include any acceptable material, such as appropriate for n-type NSFETs. For example, if the second semiconductor layers 254A-254C are silicon, the epitaxial source/drain regions 292 may include materials exerting a tensile strain on the second semiconductor layers 254A-254C, such as silicon, silicon carbide, phosphorous doped silicon carbide, silicon phosphide, or the like. The epitaxial source/drain regions 292 may have surfaces raised from respective surfaces of the multi-layer stack 256 and may have facets.

The epitaxial source/drain regions 292 in the region 250P, e.g., the PMOS region, may be formed by masking the region 250N, e.g., the NMOS region. Then, the epitaxial source/drain regions 292 are epitaxially grown in the first recesses 286. The epitaxial source/drain regions 292 may include any acceptable material, such as appropriate for p-type NSFETs. For example, if the second semiconductor layers 254A-254C are silicon germanium, the epitaxial source/drain regions 292 may comprise materials exerting a compressive strain on the second semiconductor layers 254A-254C, such as silicon germanium, boron doped silicon germanium, germanium, germanium tin, or the like. The epitaxial source/drain regions 292 may also have surfaces raised from respective surfaces of the multi-layer stack 256 and may have facets.

The epitaxial source/drain regions 292 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 292 may be in situ doped during growth.

As a result of the epitaxy processes used to form the epitaxial source/drain regions 292 in the region 250N and the region 250P, upper surfaces of the epitaxial source/drain regions 292 have facets which expand laterally outward beyond sidewalls of the nanostructures 255. In some embodiments, these facets cause adjacent epitaxial source/drain regions 292 of a same NSFET to merge as illustrated by FIG. 28A. In some embodiments, adjacent epitaxial source/drain regions 292 remain separated after the epitaxy process is completed as illustrated by FIG. 28D. In the embodiments illustrated in FIGS. 28A and 28D, the first spacers 281 may be formed covering portions of the sidewalls of the nanostructures 255 and the substrate 250 that extend above the STI regions 258 thereby blocking the epitaxial growth. In some embodiments, the spacer etch used to form the first spacers 281 may be adjusted to remove the spacer material to allow the epitaxially grown region to extend to the surface of the STI region 258.

Figure 29B:
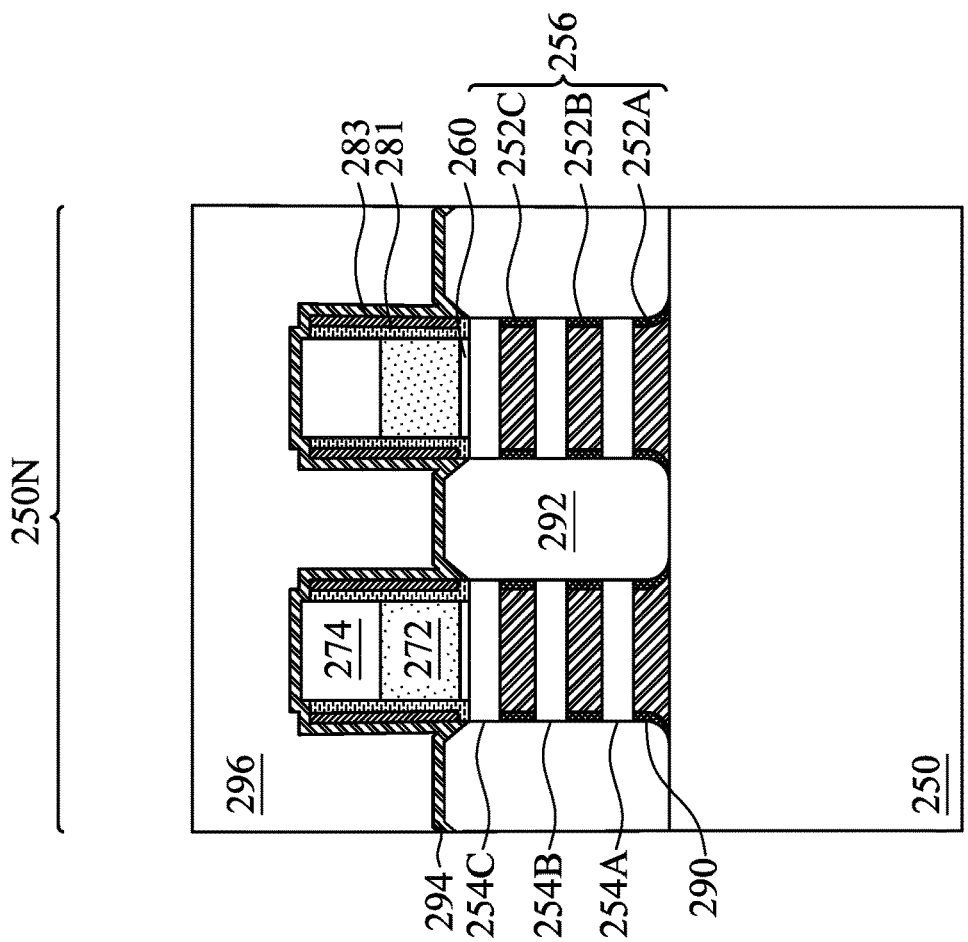
Figure 29A:
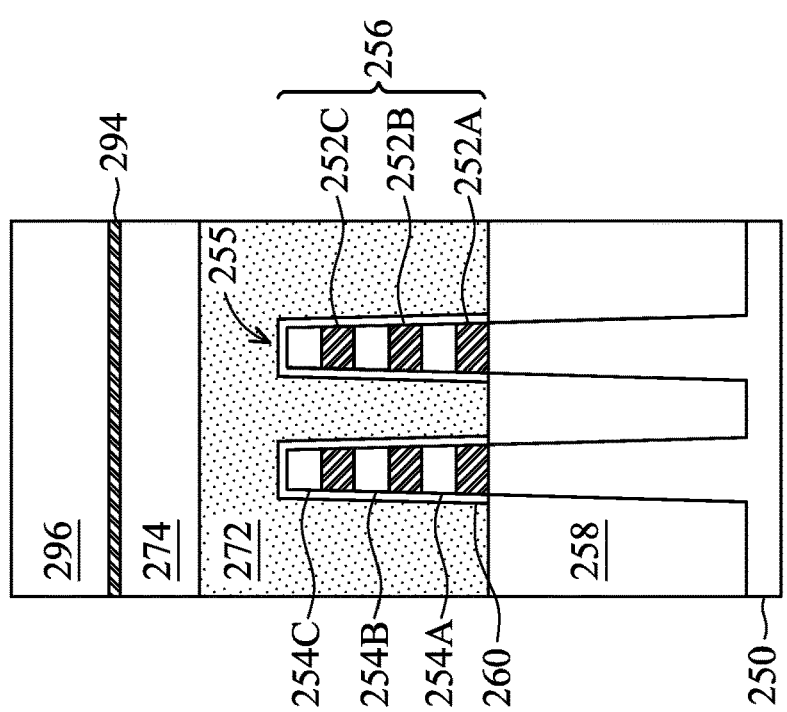
Figure 29C:
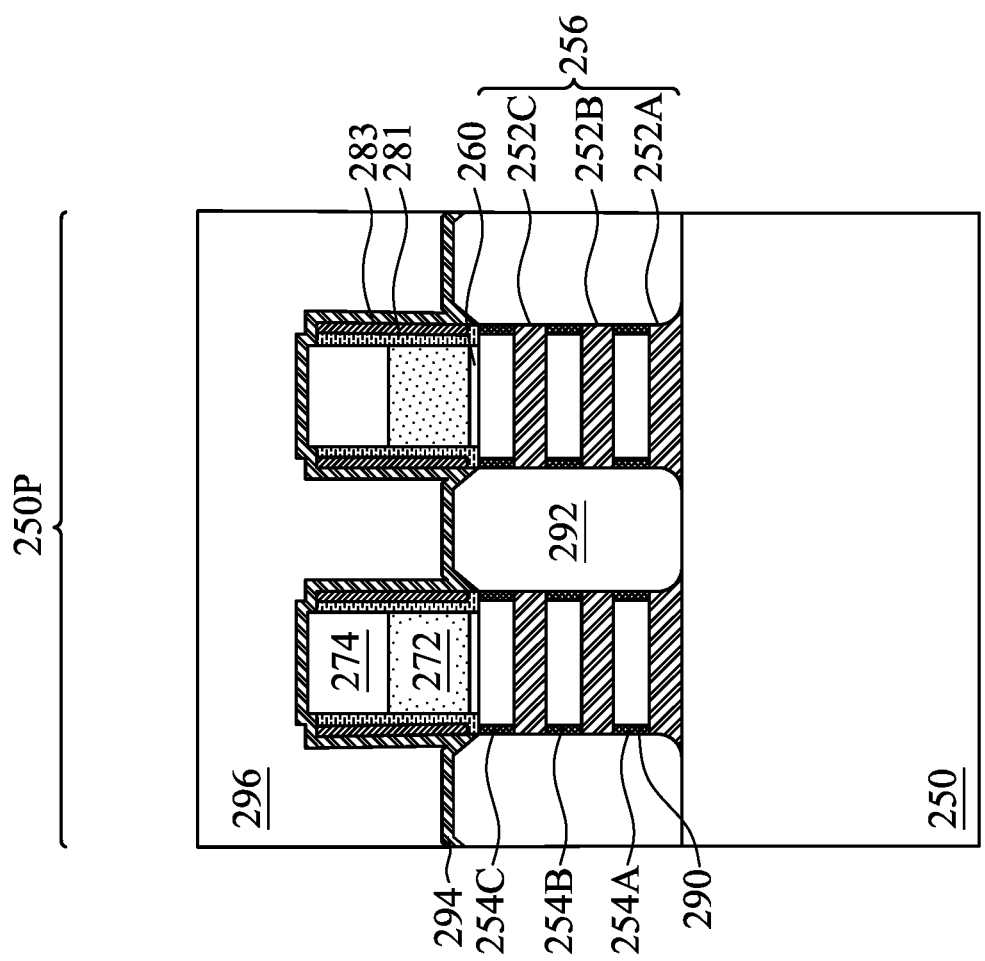

In FIGS. 29A through 29C, a first interlayer dielectric (ILD) 296 is deposited over the structure illustrated in FIGS. 22A, 28B, and 28C (the processes of FIGS. 23A through 28D do not alter the cross-section illustrated in FIG. 22A, which illustrates the dummy gates 272 and the multi-layer stack 256 protected by the dummy gates 272), respectively. The first ILD 296 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 294 is disposed between the first ILD 296 and the epitaxial source/drain regions 292, the masks 274, and the first spacers 281. The CESL 294 may comprise a dielectric material, such as, silicon nitride, silicon oxide, silicon oxynitride, or the like, having a different etch rate than the material of the overlying first ILD 296.

Figure 30B:
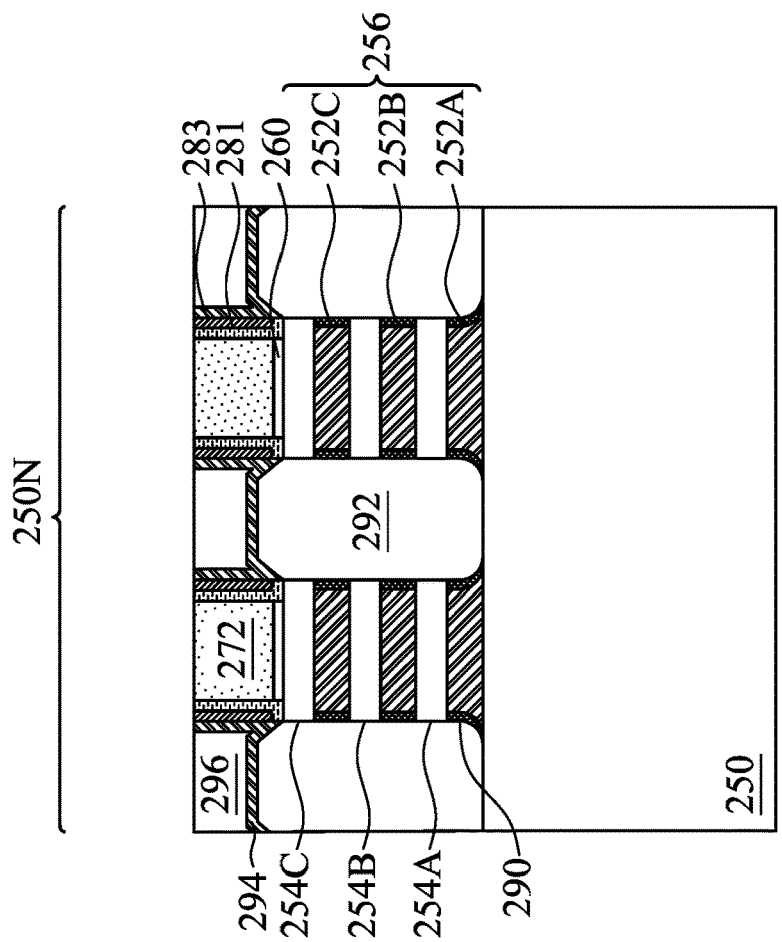
Figure 30A:
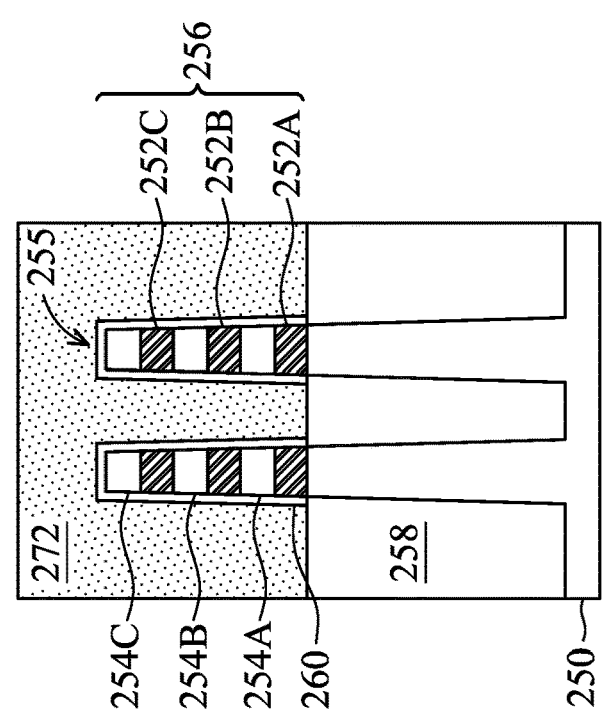
Figure 30C:
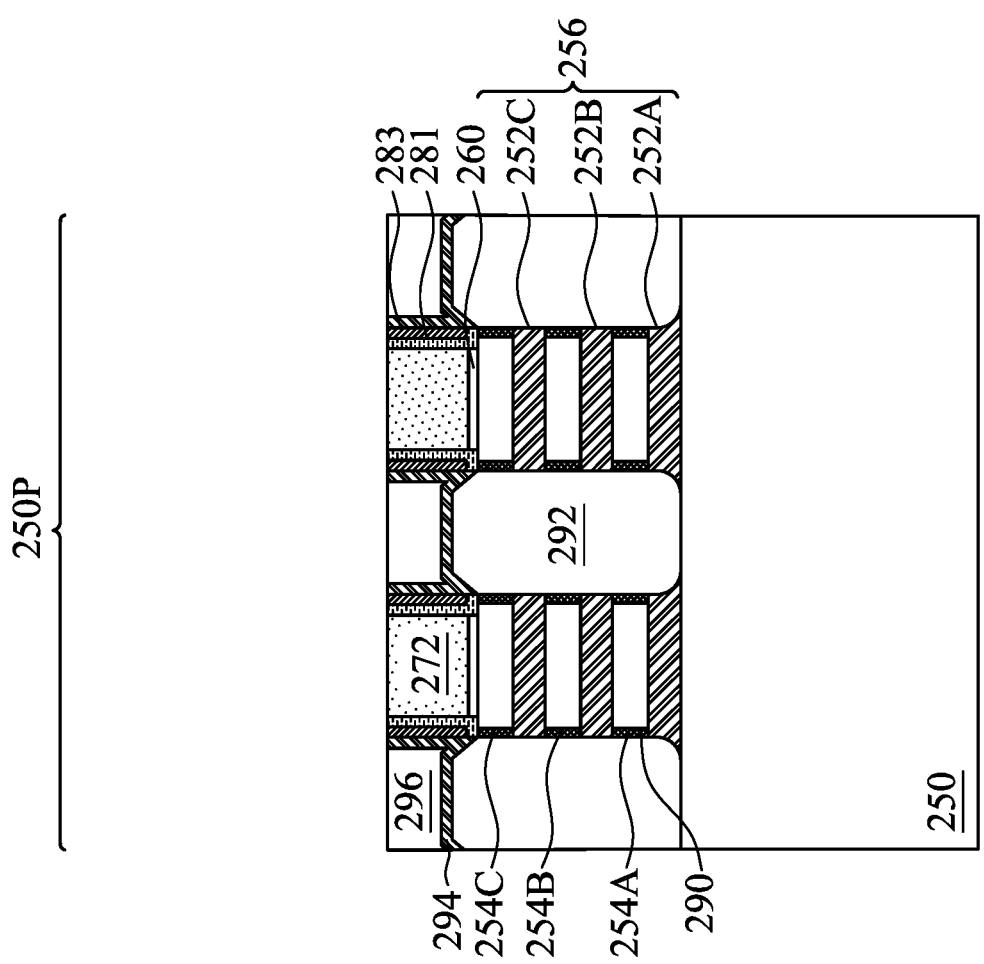
Figures 31C, 31D:
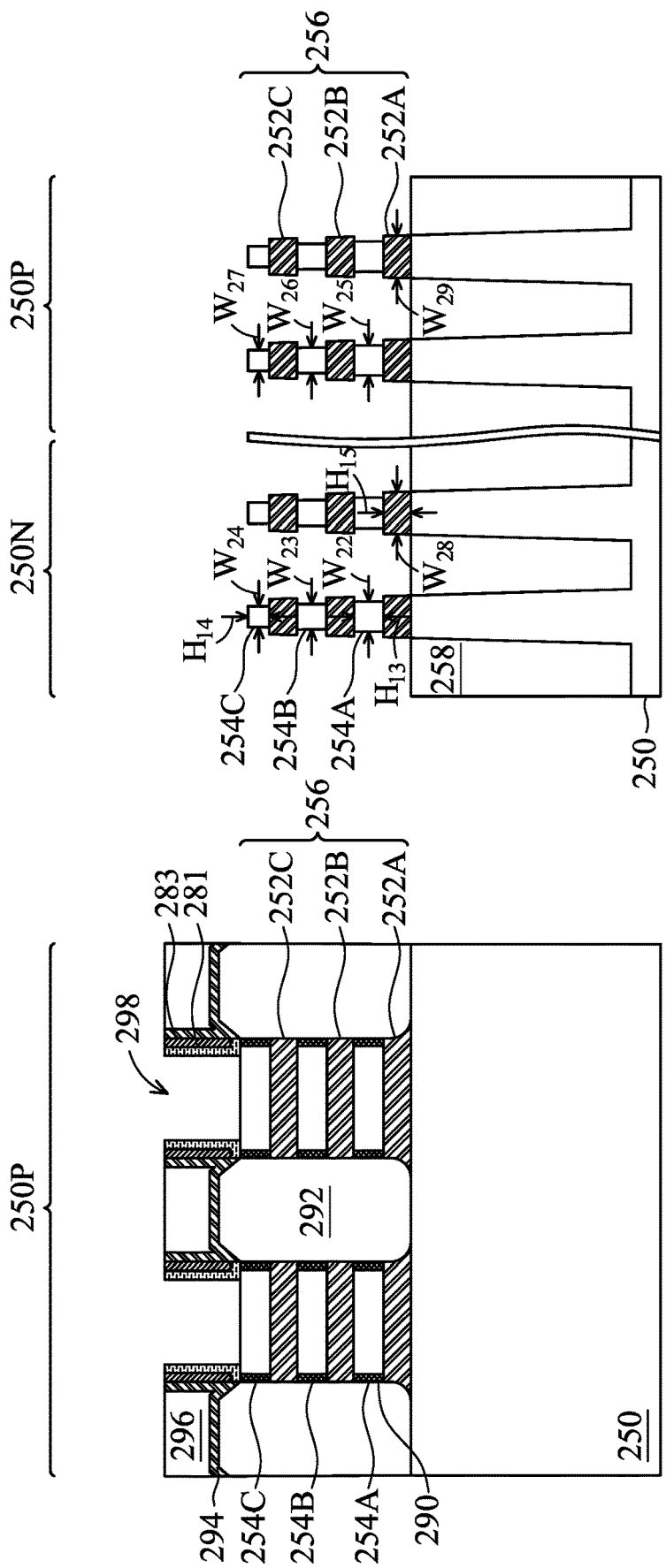

In FIGS. 30A through 30C, a planarization process, such as a CMP, may be performed to level the top surface of the first ILD 296 with the top surfaces of the dummy gates 272 or the masks 274. The planarization process may also remove the masks 274 on the dummy gates 272, and portions of the first spacers 281 along sidewalls of the masks 274. After the planarization process, top surfaces of the dummy gates 272, the first spacers 281, and the first ILD 296 are level. Accordingly, the top surfaces of the dummy gates 272 are exposed through the first ILD 296. In some embodiments, the masks 274 may remain, in which case the planarization process levels the top surface of the first ILD 296 with top surface of the masks 274 and the first spacers 281.

In FIGS. 31A through 31C, the dummy gates 272, and the masks 274 if present, are removed in an etching step(s), so that second recesses 298 are formed. Portions of the dummy dielectric layers 260 in the second recesses 298 may also be removed. In some embodiments, the dummy gates 272 are removed by an anisotropic dry etch process. For example, the etching process may include a dry etch process using reaction gas(es) that selectively etch the dummy gates 272 at a faster rate than the first ILD 296 or the first spacers 281. Each second recess 298 exposes and/or overlies portions of the multi-layer stack 256, which act as channel regions in subsequently completed NSFETs. Portions of the multi-layer stack 256 which act as the channel regions are disposed between neighboring pairs of the epitaxial source/drain regions 292. During the removal, the dummy dielectric layers 260 may be used as etch stop layers when the dummy gates 272 are etched. The dummy dielectric layers 260 may then be removed after the removal of the dummy gates 272.

Figure 31E:
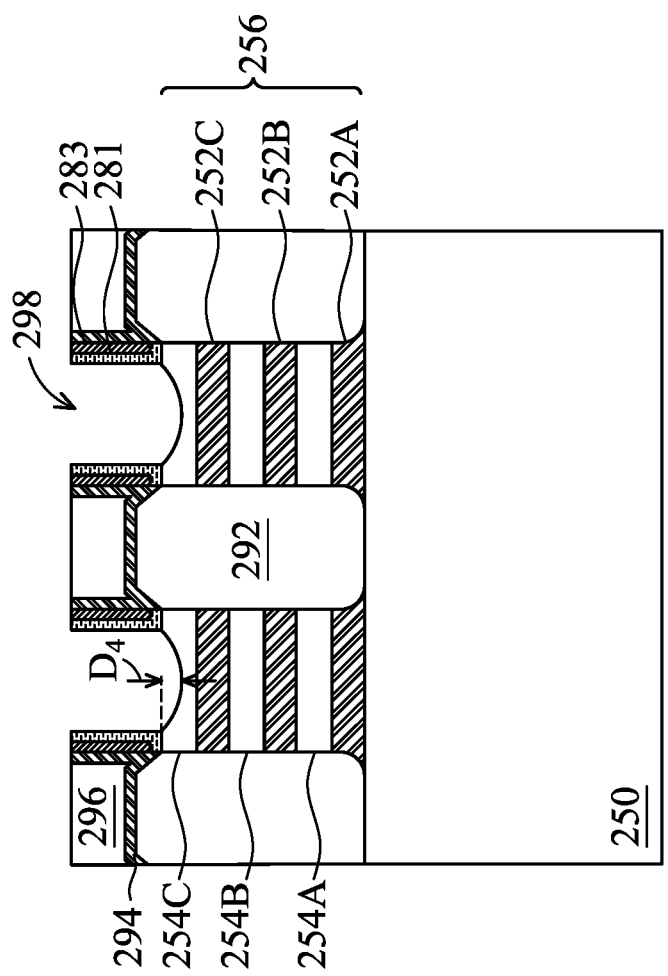
Figure 32D:
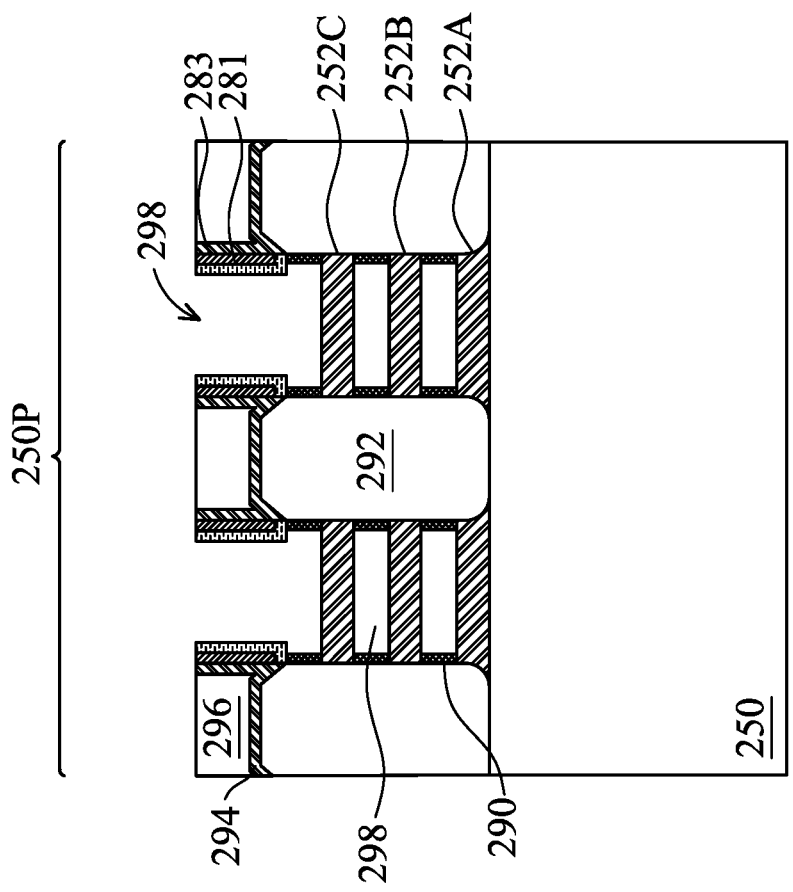
Figure 32C:
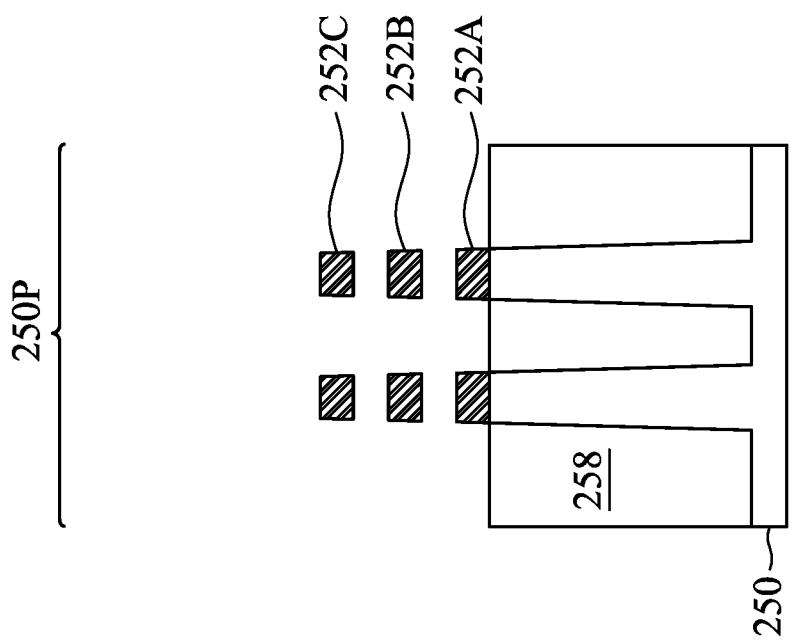

FIGS. 31D and 31E illustrate an embodiment in which the thinning process is performed to thin the nanostructures 255 after removing the dummy gate stacks, rather than being performed after forming the nanostructures 255 and before forming the STI regions 258, as discussed above in reference to FIG. 19B, or after forming the STI regions 258, as discussed above in reference to FIG. 20B. In the embodiment illustrated in FIGS. 31D and 31E, the nanostructures 255 in the region 250N may be exposed to etchants used to thin the nanostructures 255 in the region 250P and the nanostructures 255 in the region 250P may be exposed to etchants used to thin the nanostructures 255 in the region 250N.

In the embodiment illustrated in FIGS. 31D and 31E, the nanostructures 255 in both the region 250N and the region 250P are exposed to the first etching chemicals and the second etching chemicals in processes the same as or similar to those described above with respect to FIG. 19B. Following the first etching process, the second semiconductor layers 254A-254C in the region 250N and the region 250P may have the same dimensions as the second semiconductor layers 254A-254C discussed above with respect to FIG. 19B. Following the second etching process, the first semiconductor layers 252A-252C in the region 250N and the region 250P may have the same dimensions as the first semiconductor layers 252A-252C as discussed above with respect to FIG. 19B.

As illustrated in FIG. 31E, the thinning of the nanostructures 255 may recess exposed portions of top surfaces of the second semiconductor layers 254C between the second spacers 283. In FIG. 31E, recesses are formed in top portions of the second semiconductor layer 254C. Depths of the recesses may be greatest at points between the second spacers 283. The depths of the recesses may become shallower closer to the second spacer 283. The second semiconductor layers 254C may be recessed to a depth $D_4$ from about 5 nm to about 40 nm, from about 5 nm to about 15 nm, or from about 8 nm to about 12 nm below topmost surfaces of the second semiconductor layers 254C in both the region 250N and the region 250P.

Forming the first semiconductor layers 252A-252C having a gradient germanium concentration and thinning the first semiconductor layers 252A-252C using an etching process which has a higher etching rate with increasing germanium concentration results in the first semiconductor layers 252A-252C having more rectangular profiles and improves control of the process used to etch the first semiconductor layers 252A-252C. Including the first semiconductor layers 252A-252C in NSFETs results in better gate control, reduced nanostructure-width variation, and decreased DIBL.

FIGS. 32A through 32D illustrate an embodiment in which the nanostructures 255 are not thinned after removing the dummy gate stacks. In FIGS. 32A through 32D, the first semiconductor layers 252A-252C are removed from the region 250N and the second semiconductor layers 254A-254C are removed from the region 250P, extending the second recesses 298. A mask, such as a photoresist, may be formed over the region 250P, while removing the first semiconductor layers 252A-252C from the region 250N. The mask may then be removed. Subsequently, a mask, such as a photoresist, may be formed over the region 250N while removing the second semiconductor layers 254A-254C from the regions 250P. The mask may then be removed.

The layers of the multi-layer stack 256 may be removed by isotropic etching processes such as wet etching or the like. The etchants used to remove the first semiconductor layers 252A-252C may be selective to the materials of the second semiconductor layers 254A-254C, while the etchants used to etch the second semiconductor layers 254A-254C may be selective to the materials of the first semiconductor layers 252A-252C. In an embodiment in which the first semiconductor layers 252A-252C comprise the first semiconductor material (e.g., SiGe or the like) and the second semiconductor layers 254A-254C comprise the second semiconductor material (e.g., Si, SiC, or the like), tetramethylammonium hydroxide (TMAH), ammonium hydroxide ($NH_4OH$), or the like may be used remove layers of the multi-layer stack 256 in the regions 250N and diluted ammonium hydroxide-hydrogen peroxide mixture (APM), sulfuric acid-hydrogen peroxide mixture (SPM), or the like may be used to remove layers of the multi-layer stack 256 in the region 250P. A plasma, such as a plasma formed from hydrogen gas ($H_2$) or the like, may be used to remove the first semiconductor layers 252A-252C. A solution including hydrofluoric acid (HF) and hydrogen peroxide ($H_2O_2$), a solution including hydrofluoric acid, nitric acid ($HNO_3$), and water ($H_2O$), or the like may be used to remove the second semiconductor layers 254A-254C.

Figures 33A, 33B:
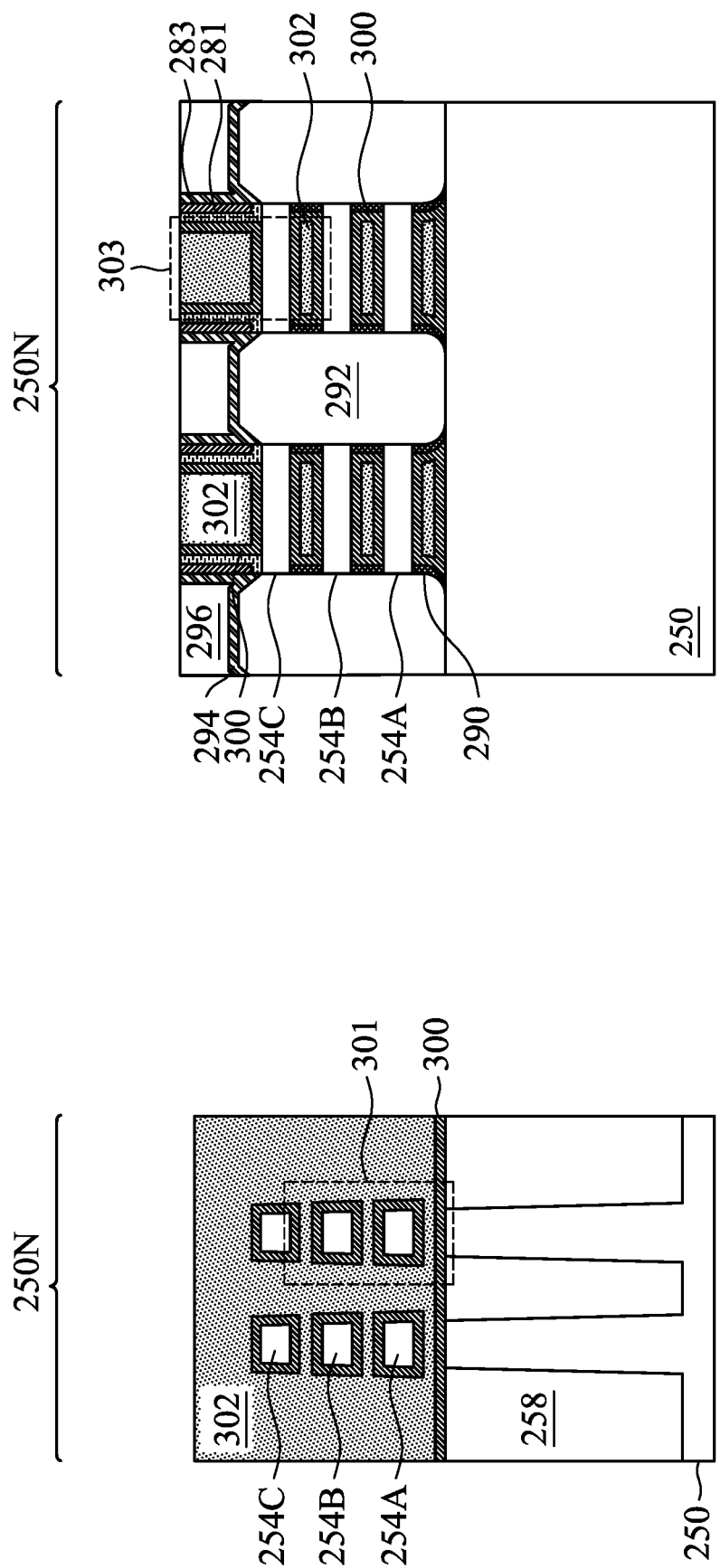
Figure 33D:
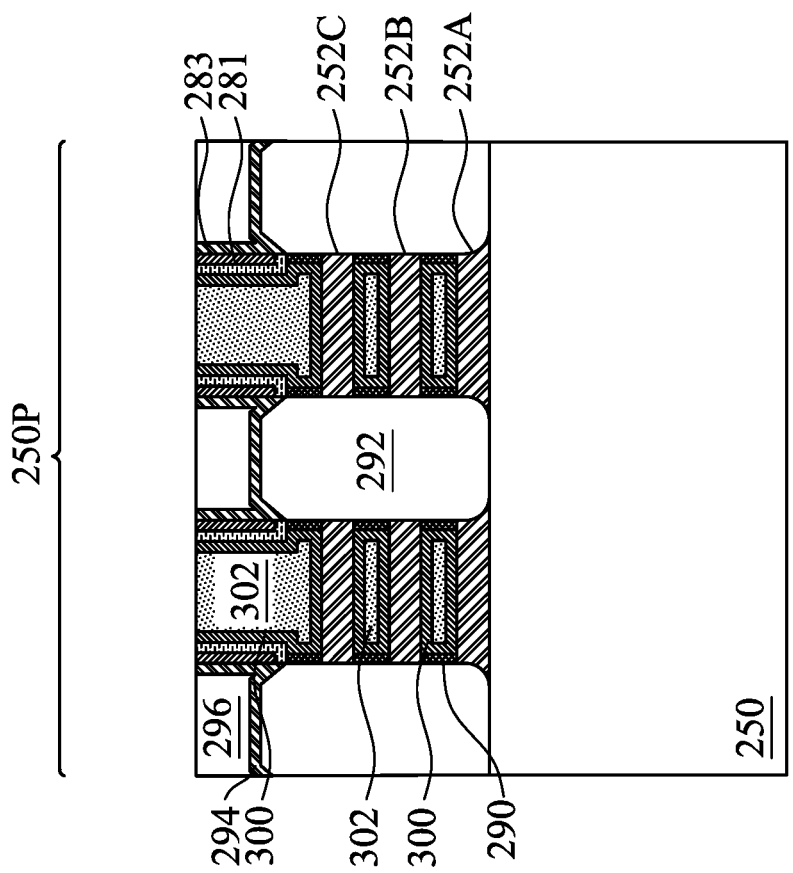
Figure 33C:
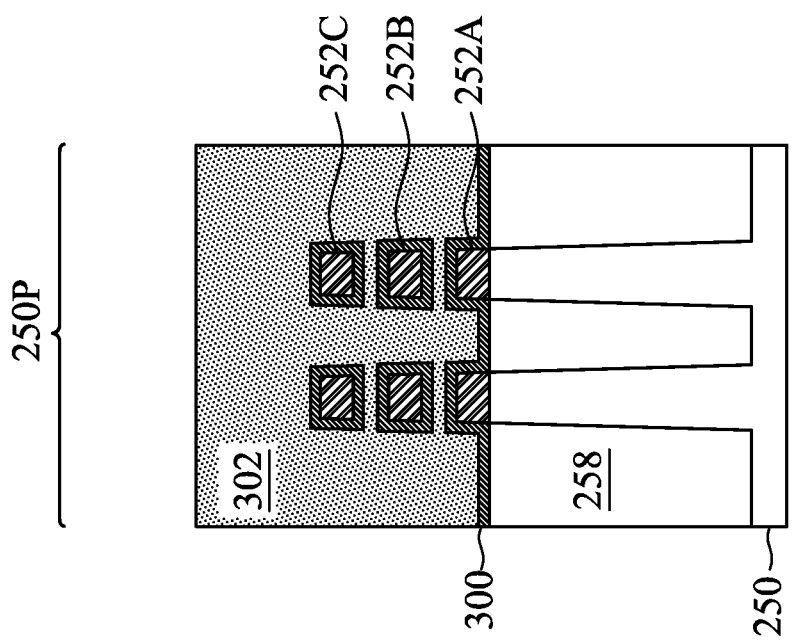
Figure 33F:
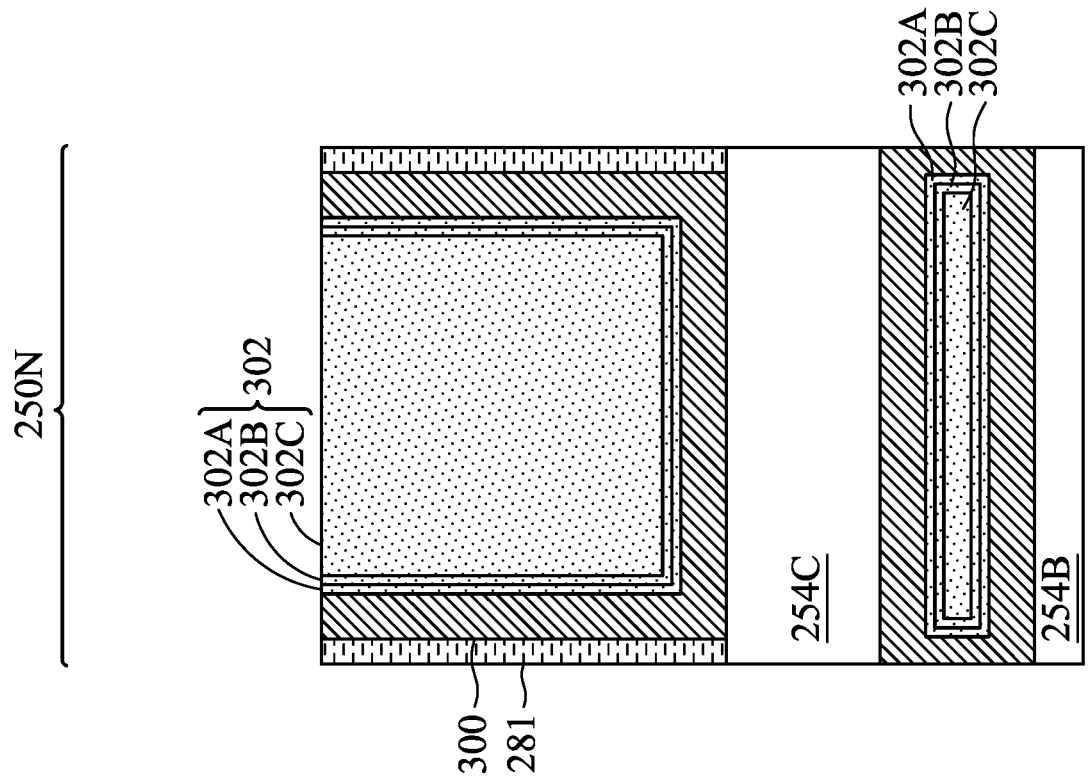
Figure 33E:
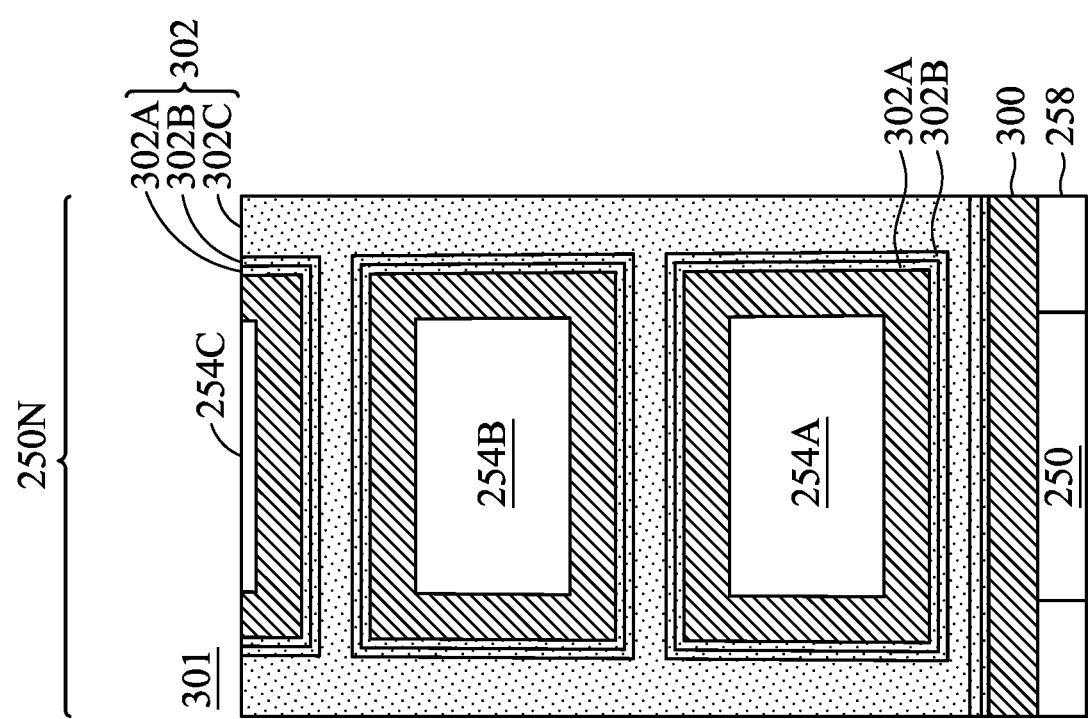

In FIGS. 33A through 33D, gate dielectric layers 300 and gate electrodes 302 are formed for replacement gates. FIG. 33E illustrates a detailed view of region 301 of FIG. 33A and FIG. 33F illustrates a detailed view of region 303 of FIG. 33B. In the region 250N illustrated in FIGS. 33A and 33B, the gate dielectric layers 300 are deposited conformally in the second recesses 298, such as on top surfaces of the STI regions 258, on top surfaces of the substrate 250, and on top surfaces, sidewalls, and bottom surfaces of the second semiconductor layers 254A-254C. In the region 250P, illustrated in FIGS. 33C and 33D, the gate dielectric layers 300 are deposited conformally in the second recesses 298, such as on top surfaces of the STI regions 258 and on top surfaces, sidewalls, and bottom surfaces of the first semiconductor layers 252A-252C.

In accordance with some embodiments, the gate dielectric layers 300 comprise silicon oxide, silicon nitride, or multi-layers thereof. In some embodiments, the gate dielectric layers 300 include a high-k dielectric material, and in these embodiments, the gate dielectric layers 300 may have a k value greater than about 7.0, and may include a metal oxide or a silicate of hafnium, aluminum, zirconium, lanthanum, manganese, barium, titanium, lead, and combinations thereof. The formation methods of the gate dielectric layers 300 may include molecular-beam deposition (MBD), ALD, PECVD, or the like. In embodiments where portions of the dummy dielectric layers 260 remain in the second recesses 298, the gate dielectric layers 300 include a material of the dummy dielectric layers 260 (e.g., $SiO_2$).

The gate electrodes 302 are deposited over the gate dielectric layers 300, respectively, and fill the remaining portions of the second recesses 298. The gate electrodes 302 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 302 is illustrated in FIGS. 33A through 33D, the gate electrode 302 may comprise any number of liner layers 302A, any number of work function tuning layers 302B, and a fill material 302C as illustrated by FIGS. 33E and 33F. After the filling of the second recesses 298, a planarization process, such as a CMP, may be performed to remove the excess portions of the gate dielectric layers 300 and the material of the gate electrodes 302, which excess portions are over the top surface of the first ILD 296. The remaining portions of material of the gate electrodes 302 and the gate dielectric layers 300 thus form replacement gates of the resulting NSFETs. The gate electrodes 302 and the gate dielectric layers 300 may be collectively referred to as "gate stacks." The gate and the gate stacks may extend along sidewalls of the channel regions 268 of the nanostructures 255.

The formation of the gate dielectric layers 300 in the region 250N and the region 250P may occur simultaneously such that the gate dielectric layers 300 in each region are formed from the same materials, and the formation of the gate electrodes 302 may occur simultaneously such that the gate electrodes 302 in each region are formed from the same materials. In some embodiments, the gate dielectric layers 300 in each region may be formed by distinct processes, such that the gate dielectric layers 300 may be different materials, and/or the gate electrodes 302 in each region may be formed by distinct processes, such that the gate electrodes 302 may be different materials. Various masking steps may be used to mask and expose appropriate regions when using distinct processes.

Figure 34B:
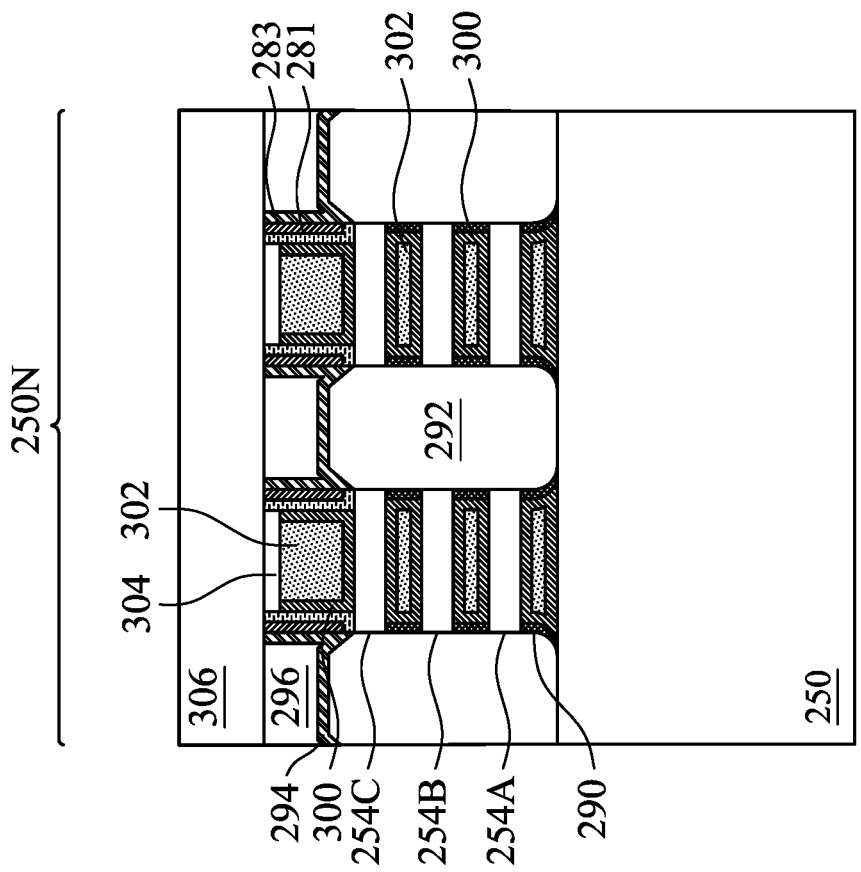
Figure 34A:
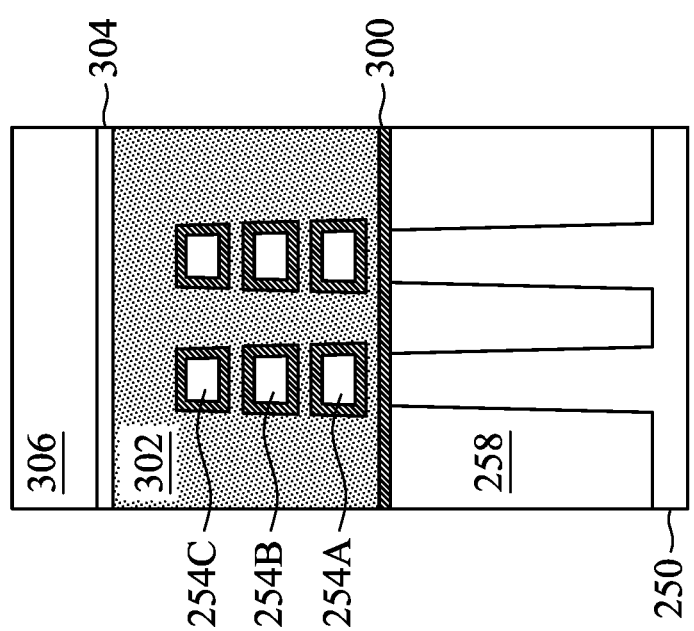

In FIGS. 34A and 34B, a second ILD 306 is deposited over the first ILD 296. In some embodiments, the second ILD 306 is a flowable film formed by FCVD. In some embodiments, the second ILD 306 is formed of a dielectric material such as PSG, BSG, BPSG, USG, or the like, and may be deposited by any suitable method, such as CVD, PECVD, or the like. In some embodiments, before the formation of the second ILD 306, the gate stack (including the gate dielectric layers 300 and the corresponding overlying gate electrodes 302) is recessed, so that a recess is formed directly over the gate stack and between opposing portions of first spacers 281. A gate mask 304 comprising one or more layers of dielectric material, such as silicon nitride, silicon oxynitride, or the like, is filled in the recess, followed by a planarization process to remove excess portions of the dielectric material extending over the first ILD 296. Subsequently formed gate contacts (such as the gate contacts 312, discussed below with respect to FIGS. 35A and 35B) penetrate through the gate mask 304 to contact the top surface of the recessed gate electrodes 302.

Figure 35B:
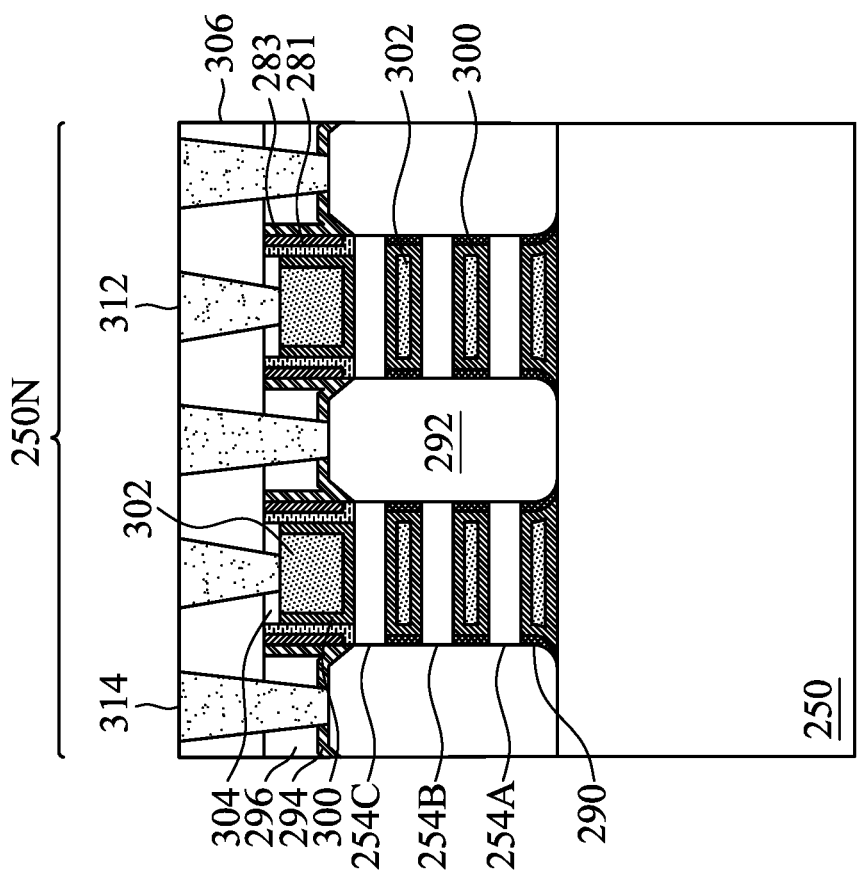
Figure 35A:
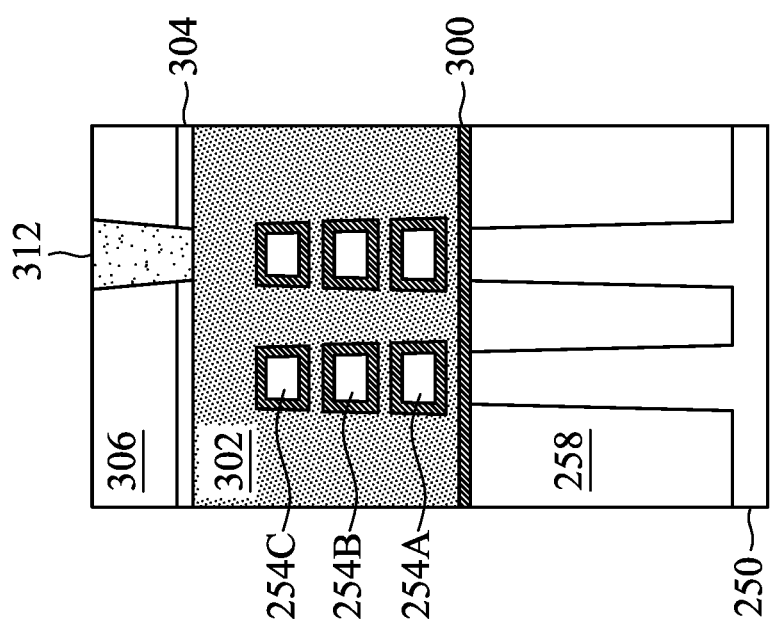
Figures 35C, 35D:
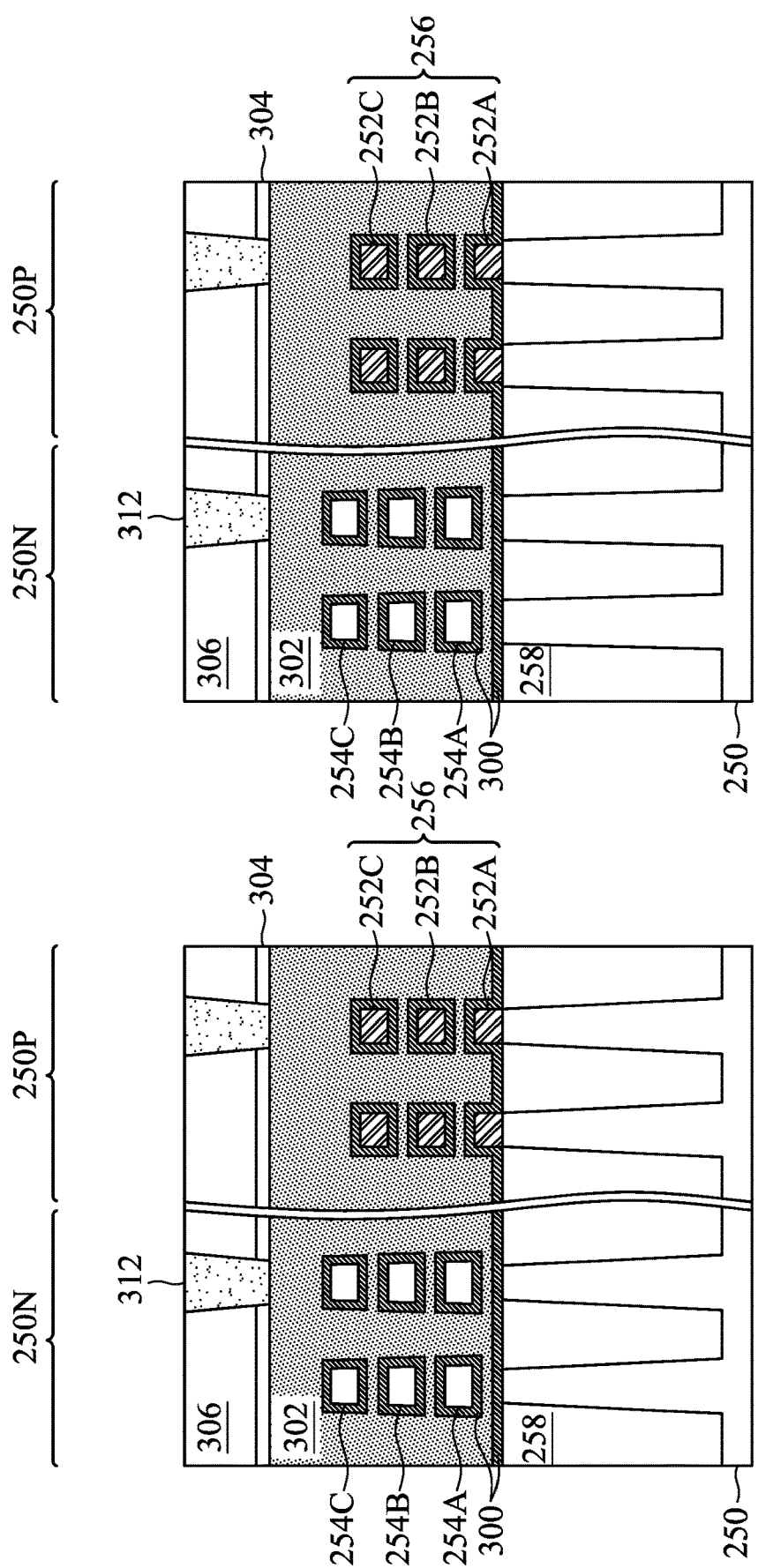

In FIGS. 35A and 35B, gate contacts 312 and source/drain contacts 314 are formed through the second ILD 306 and the first ILD 296. Openings for the source/drain contacts 314 are formed through the first ILD 296 and the second ILD 306 and openings for the gate contacts 312 are formed through the second ILD 306 and the gate mask 304. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 306. The remaining liner and conductive material form the source/drain contacts 314 and the gate contacts 312 in the openings. An anneal process may be performed to form a silicide at the interface between the epitaxial source/drain regions 292 and the source/drain contacts 314. The source/drain contacts 314 are physically and electrically coupled to the epitaxial source/drain regions 292, and the gate contacts 312 are physically and electrically coupled to the gate electrodes 302. The source/drain contacts 314 and the gate contacts 312 may be formed in different processes, or may be formed in the same process. Although shown as being formed in the same cross-sections, it should be appreciated that each of the source/drain contacts 314 and the gate contacts 312 may be formed in different cross-sections, which may avoid shorting of the contacts.

FIGS. 35C and 35D illustrate the structures of FIGS. 35A and 35B in embodiments in which the nanostructures 255 are thinned at various stages. FIG. 35C illustrates the embodiment of FIG. 19B, wherein the nanostructures 255 are thinned before forming the STI regions 258. Portions of the nanostructures 255 in the region 250N formed above top surfaces of the STI regions 258 (e.g., portions of the nanostructures 255 formed of the second semiconductor layers 254A-254C) and portions of the nanostructures 255 formed below the top surfaces of the STI regions 258 (e.g., portions of the nanostructures 255 formed in the substrate 250) may have sidewalls which are angled at the same angles with respect to a major surface of the substrate 250. Portions of the nanostructures 255 in the region 250P formed above and below top surfaces of the STI regions 258 may have sidewalls which are angled at different angles with respect to a major surface of the substrate 250. For example, as illustrated in FIG. 35C, sidewalls of the portion of the nanostructures 255 in the region 250P above the top surfaces of the STI regions 258 and formed of the first semiconductor layers 252A-252C may be more vertical than sidewalls of the portion of the nanostructures 255 in the region 250P below the top surfaces of the STI regions 258 and formed in the substrate 250.

FIG. 35D illustrates the embodiment of FIGS. 20B or 31D and 31E, wherein the nanostructures 255 are thinned after forming the STI regions 258 or after removing the dummy gate stacks. Portions of the nanostructures 255 in the region 250N formed above and below top surfaces of the STI regions 258 may have sidewalls which are angled at different angles with respect to a major surface of the substrate 250. For example, sidewalls of the portions of the nanostructures 255 in the region 250N formed below the top surfaces of the STI regions 258 and formed in the substrate 250 may be more vertical than sidewalls of the portions of the nanostructures 255 in the region 250N formed above the top surfaces of the STI regions 258 and formed in the second semiconductor layers 254A-254C.

Portions of the nanostructures 255 in the region 250P formed above and below the top surfaces of the STI regions 258 may have sidewalls which are angled at different angles with respect to a major surface of the substrate 250, and which have a step difference in widths. For example, as illustrated in FIG. 35D, sidewalls of the portions of the nanostructures 255 in the region 250P formed above the top surfaces of the STI regions 258 (e.g., portions of the nanostructures 255 formed in the first semiconductor layers 252A-252C) may be more vertical than sidewalls of the portions of the nanostructures 255 in the region 250P formed below the top surfaces of the STI regions 258 (e.g., portions of the nanostructures 255 formed in the substrate 250). Moreover, there may be a step difference between widths of the portions of the nanostructures 255 formed below the top surfaces of the STI regions 258 and the portions of the nanostructures 255 formed above the top surfaces of the STI regions 258, with the portions of the nanostructures 255 formed below the top surfaces of the STI regions 258 having widths greater than widths of the portions of the nanostructures 255 formed above the top surfaces of the STI regions 258.

As discussed above, forming the first semiconductor layers 252A-252C having a gradient germanium concentration and thinning the first semiconductor layers 252A-252C using an etching process which has a higher etching rate with increasing germanium concentration results in the first semiconductor layers 252A-252C having more rectangular profiles and improves control of the process used to etch the nanostructures 255 in the region 250N and the region 250P. The first semiconductor layers 252A-252C are then used as channel regions in the region 250P. Including channel regions formed from the first semiconductor layers 252A-252C in NSFETs results in better gate control, reduced nanostructure-width variation, and decreased DIBL.

In accordance with an embodiment, a method includes forming a semiconductor fin over a semiconductor substrate, the semiconductor fin including germanium, a germanium concentration of a first portion of the semiconductor fin being greater than a germanium concentration of a second portion of the semiconductor fin, a first distance between the first portion and a major surface of the semiconductor substrate being less than a second distance between the second portion and the major surface of the semiconductor substrate; and trimming the semiconductor fin, the first portion of the semiconductor fin being trimmed at a greater rate than the second portion of the semiconductor fin. In an embodiment, a first angle between a sidewall of the semiconductor fin and the major surface of the semiconductor substrate before trimming the semiconductor fin is different from a second angle between the sidewall of the semiconductor fin and the major surface of the semiconductor substrate after trimming the semiconductor fin. In an embodiment, a ratio of a trimming rate of the first portion of the semiconductor fin to a trimming rate of the second portion of the semiconductor fin is from 1 to 3. In an embodiment, trimming the semiconductor fin includes exposing the semiconductor fin to an oxidant. In an embodiment, trimming the semiconductor fin includes exposing the semiconductor fin to an oxidant, then exposing the semiconductor fin to an alkaline or an acid in a cyclical process. In an embodiment, the method further includes forming a shallow trench isolation region surrounding at least a portion of the semiconductor fin, the semiconductor fin being trimmed after forming the shallow trench isolation region. In an embodiment, the method further includes forming a shallow trench isolation region surrounding at least a portion of the semiconductor fin, the semiconductor fin being trimmed before forming the shallow trench isolation region. In an embodiment, the method further includes forming a dummy gate over the semiconductor fin; and removing the dummy gate to expose the semiconductor fin, the semiconductor fin being trimmed after removing the dummy gate.

In accordance with another embodiment, a semiconductor device includes a semiconductor substrate; a first semiconductor fin over the semiconductor substrate, the first semiconductor fin including silicon germanium, a germanium concentration of the first semiconductor fin decreasing with increasing distance from the semiconductor substrate; a second semiconductor fin over the semiconductor substrate, the second semiconductor fin including silicon, wherein a first angle between a sidewall of the first semiconductor fin and a major surface of the semiconductor substrate is closer to perpendicular than a second angle between a sidewall of the second semiconductor fin and the major surface of the semiconductor substrate; a gate stack over the first semiconductor fin; and a source/drain region at least partially in the first semiconductor fin adjacent the gate stack. In an embodiment, the first angle is from 85° to 95°. In an embodiment, the second angle is from 70° to 85° or from 95° to 120°. In an embodiment, a ratio of an atomic percentage of germanium in a first portion of the first semiconductor fin to an atomic percentage of germanium in a second portion of the first semiconductor fin is from 1:2 to 1:8. In an embodiment, the first portion has a first width, the second portion has a second width, and the second width is greater than the first width by less than 1 nm. In an embodiment, the semiconductor device further includes a shallow trench isolation region surrounding a portion of the first semiconductor fin, a ratio of a topmost width of a portion of the first semiconductor fin extending above the shallow trench isolation region to a bottommost width of the portion of the first semiconductor fin extending above the shallow trench isolation region being from 0.8 to 1.2. In an embodiment, the semiconductor device further includes a shallow trench isolation region surrounding a portion of the first semiconductor fin, the first semiconductor fin having a step change in width at a top surface of the shallow trench isolation region. In an embodiment, the first semiconductor fin includes first straight sidewalls above the top surface of the shallow trench isolation region and second straight sidewalls below the top surface of the shallow trench isolation region, a third angle between the first straight sidewalls and the major surface of the semiconductor substrate being closer to perpendicular than a fourth angle between the second straight sidewalls and the major surface of the semiconductor substrate.

In accordance with yet another embodiment, a semiconductor device includes a first channel region over a semiconductor substrate, the first channel region including silicon germanium, the first channel region having a first width; a second channel region over the first channel region, the second channel region including silicon germanium, the second channel region having a lower germanium concentration than the first channel region, the second channel region having a second width; a third channel region over the semiconductor substrate, the third channel region including silicon, the third channel region having a third width; a fourth channel region over the third channel region, the fourth channel region including silicon, the fourth channel region having a fourth width, a difference between the first width and the second width being less than a difference between the third width and the fourth width; and a gate stack surrounding the first channel region and the second channel region. In an embodiment, the first channel region has a gradient germanium concentration which decreases with increasing distance from the semiconductor substrate, and the second channel region has a gradient germanium concentration which decreases with increasing distance from the semiconductor substrate. In an embodiment, a ratio of the second width to the first width is from 0.9 to 1.1. In an embodiment, a ratio of the fourth width to the third width is from 0.64 to 1.0.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate;
   a first semiconductor fin over the semiconductor substrate, the first semiconductor fin comprising a silicon germanium portion and a silicon portion, a germanium concentration of the silicon germanium portion of the first semiconductor fin decreasing with increasing distance from the semiconductor substrate;
   a second semiconductor fin over the semiconductor substrate, the second semiconductor fin comprising silicon, wherein a first angle between a sidewall of the first semiconductor fin and a major surface of the semiconductor substrate is closer to perpendicular than a second angle between a sidewall of the second semiconductor fin and the major surface of the semiconductor substrate;
   a gate stack over the first semiconductor fin, wherein the gate stack is in contact with a first horizontal surface of the silicon germanium portion of the first semiconductor fin and a second horizontal surface of the silicon portion of the first semiconductor fin; and
   a source/drain region at least partially in the first semiconductor fin adjacent the gate stack.

2. The semiconductor device of claim 1, wherein the first angle is from 85° to 95°.

3. The semiconductor device of claim 2, wherein the second angle is from 70° to 85° or from 95° to 120°.

4. The semiconductor device of claim 1, wherein a ratio of an atomic percentage of germanium in a first portion of the first semiconductor fin to an atomic percentage of germanium in a second portion of the first semiconductor fin is from 1:2 to 1:8.

5. The semiconductor device of claim 4, wherein the first portion has a first width, wherein the second portion has a second width, and wherein the second width is greater than the first width by less than 1 nm.

6. The semiconductor device of claim 1, further comprising a shallow trench isolation region surrounding a portion of the first semiconductor fin, wherein a ratio of a topmost width of a portion of the first semiconductor fin extending above the shallow trench isolation region to a bottommost width of the portion of the first semiconductor fin extending above the shallow trench isolation region is from 0.8 to 1.2.

7. The semiconductor device of claim 1, further comprising a shallow trench isolation region surrounding a portion of the first semiconductor fin, wherein the first semiconductor fin has a step change in width at a top surface of the shallow trench isolation region.

8. The semiconductor device of claim 7, wherein the first semiconductor fin comprises first straight sidewalls above the top surface of the shallow trench isolation region and second straight sidewalls below the top surface of the shallow trench isolation region, wherein a third angle between the first straight sidewalls and the major surface of the semiconductor substrate is closer to perpendicular than a fourth angle between the second straight sidewalls and the major surface of the semiconductor substrate.

9. A semiconductor device comprising:
   a first channel region over a semiconductor substrate, the first channel region comprising silicon germanium, the first channel region having a first width;
   a second channel region over the first channel region, the second channel region comprising silicon germanium, the second channel region having a lower germanium concentration than the first channel region, the second channel region having a second width;
   a third channel region over the semiconductor substrate, the third channel region comprising silicon, the third channel region having a third width;
   a fourth channel region over the third channel region, the fourth channel region comprising silicon, the fourth channel region having a fourth width, wherein a difference between the first width and the second width is less than a difference between the third width and the fourth width;
   a gate stack surrounding the first channel region and the second channel region;
   a fin-shaped region between the first channel region and the semiconductor substrate, the fin-shaped region comprising silicon; and
   a shallow trench isolation region surrounding the fin-shaped region, wherein the first channel region comprises first straight sidewalls above a top surface of the shallow trench isolation region, wherein the fin-shaped region comprises second straight sidewalls below the top surface of the shallow trench isolation region, wherein a first angle between the first straight sidewalls and a major surface of the semiconductor substrate is closer to perpendicular than a second angle between the second straight sidewalls and the major surface of the semiconductor substrate.

10. The semiconductor device of claim 9, wherein the first channel region has a gradient germanium concentration which decreases with increasing distance from the semiconductor substrate, and wherein the second channel region has a gradient germanium concentration which decreases with increasing distance from the semiconductor substrate.

11. The semiconductor device of claim 9, wherein a ratio of the second width to the first width is from 0.9 to 1.1.

12. The semiconductor device of claim 11, wherein a ratio of the fourth width to the third width is from 0.64 to 1.0.

13. A semiconductor device comprising:
   a semiconductor substrate;
   a first channel region over the semiconductor substrate, the first channel region having a first germanium concentration, the first channel region being separated from a major surface of the semiconductor substrate by a first distance, the first channel region having a first width;
   a second channel region over the first channel region, the second channel region having a second germanium concentration less than the first germanium concentration, the second channel region being separated from the major surface of the semiconductor substrate by a second distance greater than the first distance, the second channel region having a second width less than the first width; and
   a fin-shaped region extending from the semiconductor substrate to the first channel region, wherein the fin-shaped region comprises silicon, wherein the first channel region and the second channel region comprise a first straight continuous sidewall, wherein the fin-shaped region comprises a second straight continuous sidewall, wherein a first angle between the first straight continuous sidewall and a major surface of the semiconductor substrate is further from perpendicular than a second angle between the second straight continuous sidewall and the major surface of the semiconductor substrate.

14. The semiconductor device of claim 13, wherein the fin-shaped region has a third germanium concentration less than the first germanium concentration.

15. The semiconductor device of claim 14, wherein the fin-shaped region has a third width greater than the first width.

16. The semiconductor device of claim 13, further comprising a third channel region over the semiconductor substrate, wherein the third channel region is separated from the major surface of the semiconductor substrate by a third distance, wherein a top surface of the first channel region is separated from the major surface of the semiconductor substrate by a fourth distance equal to the third distance.

17. The semiconductor device of claim 16, wherein the third channel region comprises silicon, wherein the third channel region has a third width greater than the first width.

18. The semiconductor device of claim 17, wherein the first channel region and the second channel region are disposed in a p-type region, and wherein the third channel region is disposed in an n-type region.

19. The semiconductor device of claim 13, wherein the first channel region and the second channel region are trapezoidal-shaped in a cross-sectional view.

20. The semiconductor device of claim 13, wherein the first channel region and the second channel region have gradient germanium concentrations which decrease with increasing distance from the semiconductor substrate.

* * * * *